(12) United States Patent
Shibazaki

(10) Patent No.: US 8,908,145 B2
(45) Date of Patent: Dec. 9, 2014

(54) PATTERN FORMING APPARATUS AND PATTERN FORMING METHOD, MOVABLE BODY DRIVE SYSTEM AND MOVABLE BODY DRIVE METHOD, EXPOSURE APPARATUS AND EXPOSURE METHOD, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1061 days.

(21) Appl. No.: 11/708,611

(22) Filed: Feb. 21, 2007

(65) Prior Publication Data

US 2007/0263191 A1 Nov. 15, 2007

Related U.S. Application Data

(60) Provisional application No. 60/780,046, filed on Mar. 8, 2006.

(30) Foreign Application Priority Data

Feb. 21, 2006 (JP) .................................. 2006-044589

(51) Int. Cl.
*G03B 27/42* (2006.01)
*G03F 7/20* (2006.01)
*G03F 9/00* (2006.01)

(52) U.S. Cl.
CPC ............ *G03F 7/7085* (2013.01); *G03F 9/7084* (2013.01); *G03F 9/7026* (2013.01); *G03F 7/70675* (2013.01); *G03F 7/70775* (2013.01); *G03F 7/70641* (2013.01); *G03F 7/70733* (2013.01)
USPC .......................................................... 355/53

(58) Field of Classification Search
CPC ............ G03F 7/70516; G03F 7/70725; G03F 7/70716; G03F 9/7088; G03F 7/7085
USPC ......................................................... 355/30, 53
See application file for complete search history.

(56) References Cited

U.S. PATENT DOCUMENTS 4,346,164 A 8/1982 Tabarelli et al.
4,465,368 A 8/1984 Matsuura et al.
(Continued)

FOREIGN PATENT DOCUMENTS

CN 1728002 A 2/2006
DE 221 563 A1 4/1985
(Continued)

OTHER PUBLICATIONS

Written Opinion of the International Searching Authority for Application No. PCT/JP2007/050821; mailed Apr. 17, 2007 (with translation).

(Continued)

*Primary Examiner* — Mesfin T Asfaw
(74) *Attorney, Agent, or Firm* — Oliff PLC

(57) ABSTRACT

A partial section of an aerial image measuring unit is arranged at a wafer stage and part of the remaining section is arranged at a measurement stage, and the aerial image measuring unit measures an aerial image of a mark formed by a projection optical system. Therefore, for example, when the aerial image measuring unit measures a best focus position of the projection optical system, the measurement can be performed using the position of the wafer stage, at which a partial section of the aerial image measuring unit is arranged, in a direction parallel to an optical axis of the projection optical system as a datum for the best focus position. Accordingly, when exposing an object with illumination light, the position of the wafer stage in the direction parallel to the optical axis is adjusted with high accuracy based on the measurement result of the best focus position.

42 Claims, 37 Drawing Sheets

(56) References Cited

U.S. PATENT DOCUMENTS

| | | | |
|---|---|---|---|
| 4,480,910 A | 11/1984 | Takanashi et al. |
| 4,780,617 A | 10/1988 | Umatate et al. |
| 5,021,649 A | 6/1991 | Nishimura et al. |
| 5,166,754 A | 11/1992 | Suzuki et al. |
| 5,247,165 A | 9/1993 | Hiruta et al. |
| 5,448,332 A | 9/1995 | Sakakibara et al. |
| 5,610,683 A | 3/1997 | Takahashi |
| 5,610,715 A | 3/1997 | Yoshii et al. |
| 5,693,439 A | 12/1997 | Tanaka et al. |
| 5,715,039 A | 2/1998 | Fukuda et al. |
| 5,825,043 A | 10/1998 | Suwa |
| 5,969,441 A | 10/1999 | Loopstra et al. |
| 6,208,407 B1 | 3/2001 | Loopstra |
| 6,433,872 B1 | 8/2002 | Nishi et al. |
| 6,590,634 B1 | 7/2003 | Nishi et al. |
| 6,608,681 B2 | 8/2003 | Tanaka et al. |
| 6,611,316 B2 | 8/2003 | Sewell |
| 6,778,257 B2 | 8/2004 | Bleeker et al. |
| 6,819,425 B2 | 11/2004 | Kwan |
| 6,819,433 B2 | 11/2004 | Takai et al. |
| 6,952,253 B2 | 10/2005 | Lof et al. |
| 7,023,610 B2 | 4/2006 | Ohtsuki et al. |
| 7,025,498 B2 | 4/2006 | Del Puerto |
| 7,102,729 B2 | 9/2006 | Renkens et al. |
| 7,116,401 B2 | 10/2006 | Nijmeijer et al. |
| 7,161,659 B2 | 1/2007 | Van Den Brink et al. |
| 7,253,875 B1 | 8/2007 | Luttikhuis et al. |
| 7,256,871 B2 | 8/2007 | Loopstra et al. |
| 7,289,212 B2 | 10/2007 | Kwan |
| 7,292,312 B2 | 11/2007 | Loopstra et al. |
| 7,333,174 B2 | 2/2008 | Koenen et al. |
| 7,348,574 B2 | 3/2008 | Pril et al. |
| 7,349,069 B2 | 3/2008 | Beems et al. |
| 7,362,446 B2 | 4/2008 | Van Der Pasch et al. |
| 7,405,811 B2 | 7/2008 | Beems et al. |
| 7,408,655 B2 | 8/2008 | Loopstra et al. |
| 7,483,120 B2 | 1/2009 | Luttikhuis et al. |
| 7,528,965 B2 | 5/2009 | Loopstra et al. |
| 7,602,489 B2 | 10/2009 | Van Der Pasch et al. |
| 7,619,207 B2 | 11/2009 | Loopstra et al. |
| 7,636,165 B2 | 12/2009 | Klaver et al. |
| 7,710,540 B2 | 5/2010 | Loopstra et al. |
| 7,859,686 B2 | 12/2010 | Loopstra et al. |
| 7,880,901 B2 | 2/2011 | Loopstra et al. |
| 2002/0021450 A1 | 2/2002 | Aoki |
| 2002/0041377 A1 | 4/2002 | Hagiwara et al. |
| 2002/0061469 A1 | 5/2002 | Tanaka |
| 2002/0109850 A1 | 8/2002 | Takai et al. |
| 2002/0176082 A1 | 11/2002 | Sakakibara et al. |
| 2003/0025890 A1 | 2/2003 | Nishinaga |
| 2003/0133125 A1 | 7/2003 | Hattori |
| 2003/0211410 A1 | 11/2003 | Irie |
| 2004/0042648 A1 | 3/2004 | Yoshidda et al. |
| 2004/0165159 A1 | 8/2004 | Lof et al. |
| 2004/0212801 A1 | 10/2004 | Wu et al. |
| 2004/0233407 A1* | 11/2004 | Nishi et al. ............ 355/53 |
| 2004/0263846 A1 | 12/2004 | Kwan |
| 2005/0128461 A1 | 6/2005 | Beems et al. |
| 2005/0190375 A1 | 9/2005 | Akimoto |
| 2005/0219489 A1* | 10/2005 | Nei et al. ............ 355/53 |
| 2005/0248856 A1 | 11/2005 | Omura et al. |
| 2005/0255624 A1* | 11/2005 | Miyajima ............ 438/48 |
| 2005/0271421 A1 | 12/2005 | Uemura et al. |
| 2005/0280791 A1 | 12/2005 | Nagasaka et al. |
| 2006/0017902 A1 | 1/2006 | Rhyzhikov et al. |
| 2006/0023178 A1 | 2/2006 | Loopstra et al. |
| 2006/0023194 A1 | 2/2006 | Loopstra et al. |
| 2006/0092419 A1 | 5/2006 | Gui |
| 2006/0139595 A1 | 6/2006 | Koenen et al. |
| 2006/0139660 A1 | 6/2006 | Kwan |
| 2006/0170892 A1 | 8/2006 | Koenen et al. |
| 2006/0227309 A1 | 10/2006 | Loopstra et al. |
| 2006/0231206 A1 | 10/2006 | Nagasaka et al. |
| 2006/0238731 A1 | 10/2006 | Beems et al. |
| 2006/0238733 A1 | 10/2006 | Beems et al. |
| 2007/0035267 A1 | 2/2007 | Gao et al. |
| 2007/0052976 A1 | 3/2007 | Pril et al. |
| 2007/0076218 A1 | 4/2007 | Van Empel et al. |
| 2007/0127006 A1 | 6/2007 | Shibazaki |
| 2007/0188732 A1 | 8/2007 | Shibazaki et al. |
| 2007/0247640 A1 | 10/2007 | Magome et al. |
| 2007/0288121 A1 | 12/2007 | Shibazaki |
| 2008/0043212 A1 | 2/2008 | Shibazaki |
| 2008/0074681 A1 | 3/2008 | Loopstra et al. |
| 2008/0088843 A1 | 4/2008 | Shibazaki |
| 2008/0240501 A1 | 10/2008 | Van Der Wijst et al. |
| 2010/0157275 A1 | 6/2010 | Shibazaki |
| 2010/0157276 A1 | 6/2010 | Shibazaki |

FOREIGN PATENT DOCUMENTS

| | | |
|---|---|---|
| DE | 224 448 A1 | 7/1985 |
| EP | 0 482 553 A2 | 4/1992 |
| EP | 1 079 223 A1 | 2/2001 |
| EP | 1 182 509 A2 | 2/2002 |
| EP | 1 420 298 A2 | 5/2004 |
| EP | 1 420 300 A2 | 5/2004 |
| EP | 1 630 585 A1 | 3/2006 |
| EP | 1 713 113 A1 | 10/2006 |
| EP | 1 762 897 A1 | 3/2007 |
| JP | A 57-117238 | 7/1982 |
| JP | A 58-202448 | 11/1983 |
| JP | A 59-19912 | 2/1984 |
| JP | A-59-47731 | 3/1984 |
| JP | A 61-44429 | 3/1986 |
| JP | A 62-65326 | 3/1987 |
| JP | A-62-122215 | 6/1987 |
| JP | A 63-157419 | 6/1988 |
| JP | A-63-292005 | 11/1988 |
| JP | A-03-167419 | 7/1991 |
| JP | A-04-179115 | 6/1992 |
| JP | A-4-265805 | 9/1992 |
| JP | A 4-305915 | 10/1992 |
| JP | A 4-305917 | 10/1992 |
| JP | A 5-62877 | 3/1993 |
| JP | A-05-129184 | 5/1993 |
| JP | A 6-124873 | 5/1994 |
| JP | A-07-190741 | 7/1995 |
| JP | A 7-220990 | 8/1995 |
| JP | A-07-0270122 | 10/1995 |
| JP | A 7-270122 | 10/1995 |
| JP | A-08-316125 | 11/1996 |
| JP | A 8-316125 | 11/1996 |
| JP | A-09-092593 | 4/1997 |
| JP | A 10-63011 | 3/1998 |
| JP | A 10-163099 | 6/1998 |
| JP | A 10-214783 | 8/1998 |
| JP | A 10-223528 | 8/1998 |
| JP | A 10-303114 | 11/1998 |
| JP | A 10-340846 | 12/1998 |
| JP | A 11-16816 | 1/1999 |
| JP | A-11-135400 | 5/1999 |
| JP | A 11-176727 | 7/1999 |
| JP | A 6-283403 | 10/1999 |
| JP | A 2000-58436 | 2/2000 |
| JP | A 2000-505958 | 5/2000 |
| JP | A 2000-323404 | 11/2000 |
| JP | A 2001-513267 | 8/2001 |
| JP | A 2001-313250 | 11/2001 |
| JP | A-2002-14005 | 1/2002 |
| JP | A 2002-14005 | 1/2002 |
| JP | B2 3303386 | 5/2002 |
| JP | A-2002-319541 | 10/2002 |
| JP | A-2003-203842 | 7/2003 |
| JP | A-2003-249443 | 9/2003 |
| JP | A 2003-347184 | 12/2003 |
| JP | A 2004-101362 | 4/2004 |
| JP | A 2004-519850 | 7/2004 |
| JP | A 2004-289126 | 10/2004 |
| JP | A-2004-327972 | 11/2004 |
| JP | A 2005-114406 | 4/2005 |
| JP | A-2005-244088 | 9/2005 |
| JP | A-2005-316461 | 11/2005 |
| JP | A-2006-005197 | 1/2006 |

(56) References Cited

FOREIGN PATENT DOCUMENTS

| | | |
|---|---|---|
| JP | A-2007-93546 | 4/2007 |
| WO | WO 99/46835 | 9/1999 |
| WO | WO 99/49504 A1 | 9/1999 |
| WO | WO 99/60361 A1 | 11/1999 |
| WO | WO 01/35168 A1 | 5/2001 |
| WO | WO 03/065428 A1 | 8/2003 |
| WO | WO 2004/019128 A2 | 3/2004 |
| WO | WO 2004/053955 A1 | 6/2004 |
| WO | WO 2004/055803 A1 | 7/2004 |
| WO | WO 2004/057590 A1 | 7/2004 |
| WO | WO 2004/086468 A1 | 10/2004 |
| WO | WO 2004/107011 A1 | 12/2004 |
| WO | WO 2005/029559 A1 | 3/2005 |
| WO | WO 2005/059617 A2 | 6/2005 |
| WO | WO 2005/059618 A2 | 6/2005 |
| WO | WO 2005/074014 A1 | 8/2005 |
| WO | WO 2005/096354 A1 | 10/2005 |
| WO | WO 2006/013856 A1 | 2/2006 |
| WO | WO 2006/038952 A2 | 4/2006 |

OTHER PUBLICATIONS

Office Action issued in Chinese Application No. 2007800051463; mailed Jan. 15, 2010 (with translation).
International Search Report and Written Opinion of International Application No. PCT/JP2007/053229; mailed May 22, 2007 (with translation).
International Search Report and Written Opinion of International Application No. PCT/JP2007/053842; mailed May 22, 2007 (with translation).
Office Action issued in U.S. Appl. No. 11/708,601; mailed Jul. 22, 2010.
Written Opinion of International Application No. PCT/JP2007/053230; mailed Jun. 19, 2007 (with translation).
Dec. 5, 2012 Search Report issued in European Patent Application No. 12183861.9.
Dec. 30, 2010 Office Action issued in Chinese Patent Application No. 200780005146.3 (with translation).
Aug. 28, 2009 Office Action issued in Chinese Patent Application No. 200780005155.2 (with translation).
Jan. 8, 2010 Office Action issued in Chinese Patent Application No. 207800050776 (with translation).
Jul. 29, 2010 Office Action issued in Chinese Patent Application No. 200780005155.2 (with translation).
Jun. 8, 2012 Decision of Refusal issued in Japanese Patent Application No. 2008-501745 (with English-language translation).
Aug. 12, 2013 Office Action issued in U.S. Appl. No. 13/137,443.
Oct. 2, 2013 Office Action issued in Japanese Patent Application No. 2012-007335 (with translation).
May 12, 2012 Search Report issued in European Patent Application No. 12183861.9.
May 12, 2011 Quayle Action issued in U.S. Appl. No. 11/708,533.
Jul. 24, 2013 Office Action issued in European Patent Application No. 12183861.9.
Aug. 22, 2013 Office Action issued in U.S. Appl. No. 13/137,870.
Aug. 26, 2011 Office Action issued in Chinese Patent Application No. 200780005077.6 (with translation).
Korean Office Action issued in Application No. 2008-7020658 dated Oct. 29, 2012 (w/ English Translation).
Oct. 11, 2011 Extended European Search Report issued in European Patent Application No. 07714730.4.
Nov. 3, 2011 Extended European Search Report issued in European Patent Application No. 07714729.6.
Oct. 26, 2011 Extended European Search Report issued in European Patent Application No. 07737560.8.
Nov. 29, 2011 Office Action issued in Japanese Patent Application No. 2008-501744 (with translation).
Nov. 29, 2011 Office Action issued in Japanese Patent Application No. 2008-501789 (with translation).
Hocken, R.J. et al., "Optical Metrology of Surfaces," CIRP Annals, vol. 54, No. 2, Jan. 2005, pp. 169-183.
Dec. 27, 2011 Office Action issued in Japanese Patent Application No. 2008-501745 (with translation).
Dec. 1, 2011 Office Action issued in Chinese Patent Application No. 201010506055.1 (with translation).
Jun. 20, 2014 Office Action issued in European Patent Application No. 07714729.6.

\* cited by examiner

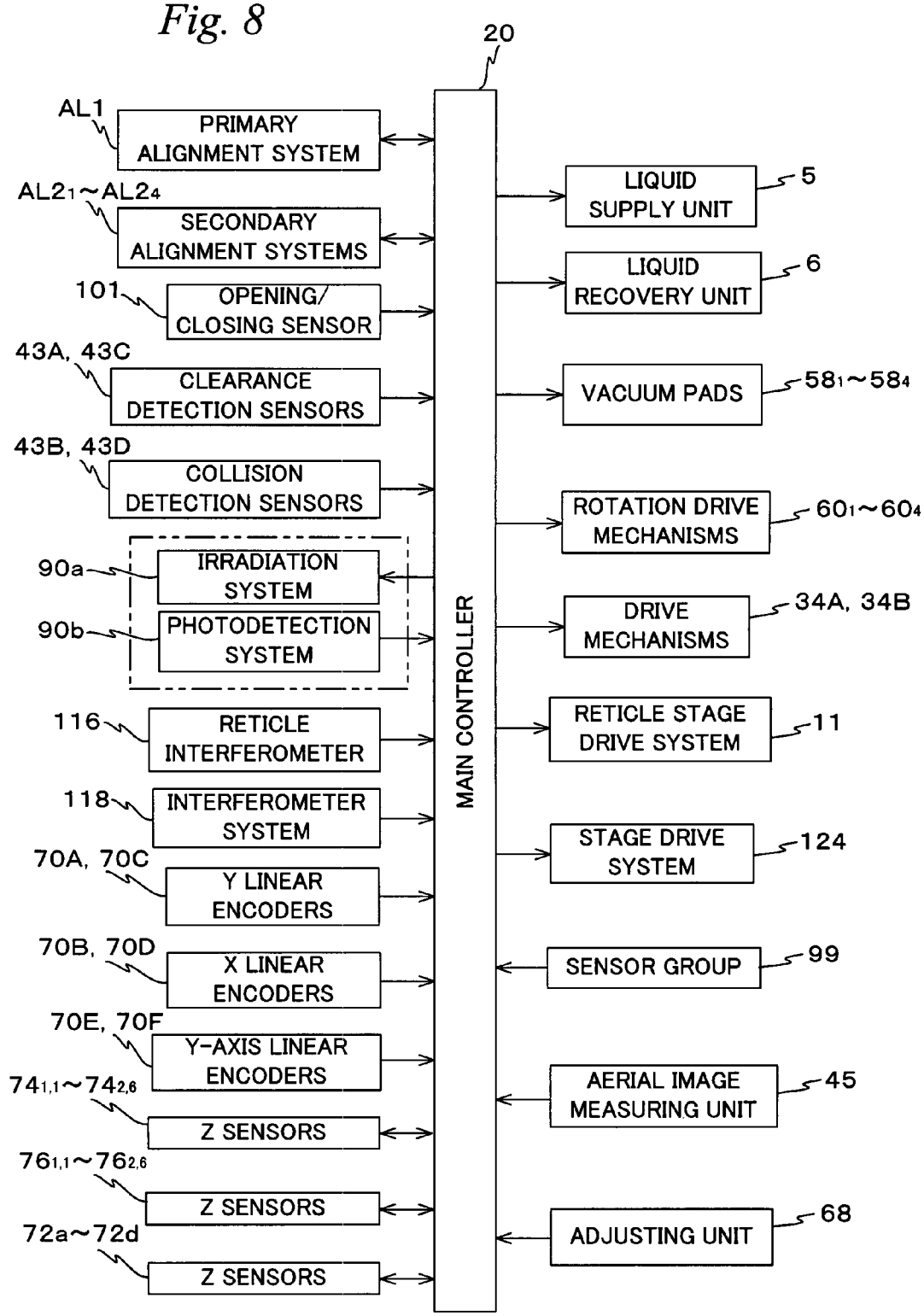

PATTERN FORMING APPARATUS AND PATTERN FORMING METHOD, MOVABLE BODY DRIVE SYSTEM AND MOVABLE BODY DRIVE METHOD, EXPOSURE APPARATUS AND EXPOSURE METHOD, AND DEVICE MANUFACTURING METHOD

CROSS-REFERENCE TO RELATED APPLICATIONS

This non-provisional application claims the benefit of Provisional Application No. 60/780,046 filed Mar. 8, 2006, the disclosure of which is hereby incorporated herein by reference in its entirety.

BACKGROUND OF THE INVENTION

1. Field of the Invention

The present invention relates to pattern forming apparatuses and pattern forming methods, movable body drive systems and movable body drive methods, exposure apparatuses and exposure methods, and device manufacturing methods, and more particularly to a pattern forming apparatus and a pattern forming method that are suitable for being used in a lithography process when manufacturing electron devices such as semiconductor devices and liquid crystal display devices, a movable body drive system, a movable body drive method, an exposure apparatus and an exposure method that can suitably be used when manufacturing the electron devices, and a device manufacturing method in which the exposure apparatus, the exposure method or the pattern forming method is used.

2. Description of the Background Art

Conventionally, in a lithography process for manufacturing electron devices (microdevices) such as semiconductor devices (integrated circuits or the like) or liquid crystal display devices, exposure apparatuses such as a reduction projection exposure apparatus by a step-and-repeat method (a so-called stepper) and a projection exposure apparatus by a step-and-scan method (a so-called scanning stepper (which is also called a scanner)) are mainly used.

In these types of exposure apparatuses, the wavelength of used exposure light is getting shorter year by year due to finer integration circuit, and also the numerical aperture of a projection optical system is gradually getting larger (larger NA), to improve the resolution. However, there has been a possibility that the focus margin at the time of exposure operation becomes insufficient because a depth of focus becomes too narrow due to the shorter wavelength of exposure light and the larger NA of the projection optical system. Therefore, as a method of substantially shortening an exposure light wavelength and also increasing (widening) a depth of focus compared in the air, an exposure apparatus making use of a liquid immersion method has been gathering attention recently (e.g. refer to the pamphlet of International Publication No. 2004/053955).

Further, as the requirement for overlay accuracy becomes stricter to cope with finer integrated circuits, improvement in position controllability (including position setting performance) of a stage (wafer stage) on which an object to be exposed, for example, a wafer or a glass plate (hereinafter, generally referred to as a 'wafer') is mounted has been also required. Therefore, in the recent exposure apparatuses, the wafer stage has been downsized so as to be a slightly lager than the wafer, and another stage (which is also called a measurement stage), which mounts various types of measuring instruments that were mounted on the wafer stage before, such as a sensor that receives illumination light via the projection optical system (such as an illuminance monitor or an irregular illuminance sensor that receives illumination light on an image plane of the projection optical system, and an aerial image measuring instrument that measures light intensity of an aerial image (projected image) of a pattern that is projected by the projection optical system, which is disclosed in, for example, Kokai (Japanese Unexamined Patent Application Publication) No. 2002-014005) and the like), has been arranged separately from the wafer stage (e.g. refer to the pamphlet of International Publication No. 2005/074014). In an exposure apparatus that is equipped with the measurement stage, various types of measurement can be performed using the measurement stage, for example, in parallel with wafer replacement on the wafer stage, and as a consequence, the throughput can also be improved. Further, in this exposure apparatus, for example, a best focus position of the projection optical system is measured using the aerial image measuring instrument, and based on the measurement result, focus leveling control of the wafer stage (wafer) on exposure is performed.

In this case, however, a stage used for measuring the best focus position and a stage used for the focus leveling control of the wafer on exposure are different, and therefore focus leveling control error could occur on exposure, and thus, exposure defect could occur due to defocus.

Further, position measurement of the wafer stage is generally performed using a laser interferometer with a high resolution. However, position control of the stage with higher precision has been required due to finer patterns to cope with semiconductor devices with higher integration, and therefore, short-term fluctuation of measurement values of the laser interferometer which is caused by temperature fluctuations of the atmosphere on the beam path is becoming unignorable now.

SUMMARY OF THE INVENTION

The present invention has been made in consideration of the situation described above, and according to a first aspect of the present invention, there is provided a first pattern forming apparatus that forms a pattern on an object with an energy beam via an optical system, the apparatus comprising: a first movable body that moves within a predetermined plane that includes a first axis and a second axis intersecting the first axis, holding the object; a second movable body that moves independently from the first movable body within the plane; and an aerial image measuring unit a partial section of which is arranged at the first movable body and part of the remaining section of which is arranged at the second movable body, and which measures an aerial image of a mark formed via the optical system.

With this apparatus, since a partial section of the aerial image measuring unit is arranged at the first movable body that holds the object on which a pattern is formed, measurement of an aerial image by the aerial image measuring unit while moving the movable body, and therefore, measurement of optical properties of the optical system (such as the best focus position) based on the measurement result of the aerial image can be performed. Accordingly, when forming a pattern on the object with an energy beam via the optical system, the position of the first movable body in the optical axis direction of the optical system is adjusted with high accuracy based on the measurement result of the optical properties. Further, since only a partial section of the aerial image measuring unit is arranged at the first movable body, the size of the first movable body is not increased, which makes it possible to favorably secure the position controllability.

According to a second aspect of the present invention, there is provided a second pattern forming apparatus that forms a pattern on an object, the apparatus comprising: a first movable body that moves within a predetermined plane that includes a first axis and a second axis intersecting the first axis, holding the object; a second movable body that moves independently from the first movable body within the plane; a first measuring system that measures position information of the second movable body; and a second measuring system that measures position information of the first movable body and whose measurement value has short-term stability superior to that of the first measuring system.

With this apparatus, position information of the second movable body is measured by the first measuring system, and position information of the first movable body that moves within a predetermined plane holding an object is measured by the second measuring system whose measurement value has short-term stability superior to the first measuring system. Accordingly, position control of the first movable body that holds the object on which a pattern is formed can stably be performed.

According to a third aspect of the present invention, there is provided a third pattern forming apparatus that forms a pattern on an object by irradiating an energy beam, the apparatus comprising: a first movable body which moves within a predetermined plane that includes a first axis and a second axis intersecting the first axis, holding the object, and on which a first grating that has a grating whose periodic direction is a direction parallel to the first axis and a second grating that has a grating whose periodic direction is a direction parallel to the second axis are arranged; a second movable body that moves independently from the first movable body within the plane; a first measuring system that includes an interferometer that measures position information of the second movable body within the plane; and a second measuring system that includes an encoder system that has a plurality of heads to which the first and second gratings are severally placed facing, and measures position information of the first movable body within the plane.

With this apparatus, position information of the second movable body within a predetermined plane is measured by the first measuring system that includes the interferometer, and position information of the first movable body within the predetermined plane is measured by the second measuring system that includes the encoder system that has a plurality of heads, to which the first and second gratings that are arranged on the first movable body and each have a grating whose periodic direction is a direction parallel to the first axis or second axis respectively are severally placed facing. Accordingly, position control of the first movable body that holds the object on which a pattern is formed by irradiating an energy beam can stably be performed.

According to a fourth aspect of the present invention, there is provided a fourth pattern forming apparatus that forms a pattern on an object, the apparatus comprising: a movable body on which the object is mounted, and which moves within a predetermined plane that includes a first axis and a second axis intersecting the first axis, holding the object; a first grating that has a grating whose periodic direction is a direction parallel to the first axis, and is placed on the movable body; a second grating that has a grating whose periodic direction is a direction parallel to the second axis, and is placed on the movable body; a first axis encoder that has a plurality of first heads whose positions are different in a direction parallel to the second axis, and measures position information of the movable body in a direction parallel to the first axis by the first head that faces the first grating; and a second axis encoder that has a plurality of second heads whose positions are different in a direction parallel to the first axis, and measures position information of the movable body in a direction parallel to the second axis by the second head that faces the second grating, wherein the plurality of first heads are placed at a distance that is shorter than a width of the first grating in a direction parallel to the second axis, and the plurality of second heads are placed at a distance that is shorter than a width of the second grating in a direction parallel to the first axis.

With this apparatus, when the movable body is moved, while sequentially switching the plurality of first heads of the first axis encoder, the position of the movable body in a direction parallel to the first axis can be measured based on the measurement value of the first head that faces the first grating, and in parallel with this operation, while sequentially switching the plurality of second heads of the second axis encoder, the position of the movable body in a direction parallel to the second axis can be measured based on the measurement value of the second head that faces the second grating.

According to a fifth aspect of the present invention, there is provided a first exposure apparatus that exposes an object with an energy beam via an optical system, the apparatus comprising: first and second movable bodies that are independently movable within a predetermined plane; and a detecting unit that has first and second members respectively arranged at the first and second movable bodies, and detects the energy beam via the first and second members.

With this apparatus, since the first and second members are arranged at the first and second movable bodies respectively, detection of the energy beam can be performed by the detecting unit while moving the first movable body. Further, since only the first member that is part of the detecting unit is arranged at the first movable body, the first movable body does not increase in size, and therefore the position controllability can be favorably secured.

According to a sixth aspect of the present invention, there is provided a second exposure apparatus that exposes an object with an energy beam, the apparatus comprising: a first movable body that is movable within a predetermined plane, holding the object; a second movable body that is movable independently from the first movable body within the plane; and a measuring system that includes a first measuring unit that measures position information of the first movable body and a second measuring unit that measures position information of the second movable body, a measurement value of the first measuring unit having short-term stability superior to that of the second measuring unit.

With this apparatus, position information of the first movable body that moves within a predetermined plane holding the object is measured by the first measuring unit whose measurement value has short-term stability superior to that of the second measuring unit. Accordingly, position control of the first movable body that holds the object on which a pattern is formed can be stably performed.

According to a seventh aspect of the present invention, there is provided a third exposure apparatus that exposes an object with an energy beam, the apparatus comprising: a first movable body which is movable in first and second directions within a predetermined plane, holding the object, and on which a first grating section that has a grating periodically arrayed in the first direction and a second grating section that has a grating periodically arrayed in the second direction are arranged; a second movable body that is movable independently from the first movable body within the plane; and a measuring system that has a first measuring unit that includes an encoder system that measures position information of the first movable body by a plurality of heads different two of which face the first and second grating sections, and a second measuring unit that includes an interferometer that measures position information of the second movable body.

With this apparatus, position information of the second movable body is measured by the second measuring unit that includes the interferometer, and position information of the first movable body that moves within a predetermined plane holding the object is measured by the first measuring unit that includes the encoder system whose measurement value has short-term stability superior to that of the interferometer. Accordingly, position control of the first movable body that holds the object on which a pattern is formed can be stably performed.

According to an eighth aspect of the present invention, there is provided a device manufacturing method, comprising: exposing an object using any one of the first to third exposure apparatuses of the present invention; and developing the exposed object.

According to a ninth aspect of the present invention, there is provided a first pattern forming method of forming a pattern on an object, the method comprising: a first process of mounting the object on a first movable body that moves within a predetermined plane that includes a first axis and a second axis intersecting the first axis; a second process of measuring position information of a second movable body that moves independently from the first movable body within the plane, using a first measuring system; and a third process of measuring position information of the first movable body using a second measuring system whose measurement value has short-term stability superior to that of the first measuring system.

With this method, position information of the second movable body is measured using the first measuring system, and position information of the first movable body that moves within a predetermined plane holding the object is measured using the second measuring system whose measurement value has short-term stability superior to that of the first measuring system. Accordingly, position control of the first movable body that holds the object on which a pattern is formed can be stably performed.

According to a tenth aspect of the present invention, there is provided a second pattern forming method of forming a pattern on an object by irradiating an energy beam, the method comprising: a process of mounting the object on a first movable body that moves within a predetermined plane that includes a first axis and a second axis intersecting the first axis; a first measurement process of measuring position information within the plane of a second movable body that moves independently from the first movable body within the plane, using a first measuring system that includes an interferometer; and a second measurement process of measuring position information of the first movable body within the plane using a second measuring system that includes an encoder system that has a plurality of heads, to which first and second gratings that are placed on the first movable body and have gratings whose periodic directions are directions parallel to the first and second axes respectively are severally placed facing, and measures position information of the first movable body within the plane.

With this method, position information of the second movable body within a predetermined plane is measured using the first measuring system that includes the interferometer, and position information of the first movable body within the predetermined plane is measured using the second measuring system that includes the encoder system that has a plurality of heads, to which first and second gratings that are placed on the first movable body and have gratings whose periodic directions are directions parallel to the first and second axes respectively are severally placed facing, and measures position information of the first movable body within the plane. Accordingly, position control of the first movable body that holds the object on which a pattern is formed by irradiating an energy beam can be stably performed.

According to an eleventh aspect of the present invention, there is provided a movable body drive system that drives a movable body that moves within a predetermined plane that includes a first axis and a second axis orthogonal to each other, the system comprising: a first interferometer that measures position information of the movable body in a direction parallel to the first axis by irradiating a measurement beam to a reflection surface arranged on the movable body; a second interferometer that measures position information of the movable body in a direction parallel to the second axis by irradiating a measurement beam to a reflection surface arranged on the movable body; a first grating that has a grating whose periodic direction is a direction parallel to the first axis, and is placed on the movable body; a first head unit that has a plurality of heads whose positions are different in a direction parallel to the second axis and constitutes a first encoder that measures position information of the movable body in a direction parallel to the first axis by the head that faces the first grating; a second grating that has a grating whose periodic direction is a direction parallel to the second axis, and is placed on the movable body; a second head unit that has a plurality of heads whose positions are different in a direction parallel to the first axis and constitutes a second encoder that measures position information of the movable body in a direction parallel to the second axis by the head that faces the second grating; an arithmetic processing unit that, while moving the movable body in a direction parallel to the first axis based on measurement values of the first and second interferometers, or measurement values of the second interferometer and the first head unit, obtains correction information on grating warp of the second grating by performing a predetermined statistical computation using measurement values obtained from the plurality of heads of the second head unit that are sequentially placed facing the second grating according to the movement and a measurement value of at least one of the first interferometer and the first head unit that corresponds to each of the measurement values; and a controller that performs drive of the movable body in a direction parallel to the second axis, while correcting the measurement values obtained from the second head unit based on the measurement value of at least one of the first interferometer and the first head unit and the correction information on grating warp of the second grating.

With this system, the arithmetic processing unit obtains correction information used to correct warp of each grating constituting the second grating, and the controller performs the drive of the movable body in a direction parallel to the second axis while correcting the measurement values obtained from the second head unit based on a measurement value of one of the first interferometer and the first head unit, and the correction information on grating warp of the second grating. Accordingly, the drive of the movable body in a direction parallel to the second axis can accurately be performed using the encoder that is composed of the second grating and the second head unit, without being affected by the warp of each grating constituting the second grating. Further, by performing the operations similar to those described above also with respect to a direction parallel to the first axis, the drive of the movable body in a direction parallel to the first axis can also be performed with good accuracy.

According to a twelfth aspect of the present invention, there is provided a movable body drive method of moving a movable body that moves within a predetermined plane that includes a first axis and a second axis orthogonal to each other, the method comprising: a first movement process of moving the movable body in a direction parallel to the first axis, based on a measurement value of a first interferometer that measures position information of the movable body in a direction parallel to the first axis by irradiating a measurement beam to a reflection surface arranged on the movable body, and based on a measurement value of a second interferometer that measures position information of the movable body in a direction parallel to the second axis by irradiating a measurement beam to a reflection surface arranged on the movable body; a first decision process of deciding correction information on grating warp of a first grating that has a grating whose periodic direction is a direction parallel to the second axis and is placed on the movable body, by performing a predetermined statistical computation using measurement values obtained from a plurality of heads that are sequentially placed facing the first grating according to movement of the movable body in the first movement process, and a measurement value of the first interferometer that corresponds to each of the measurement values, the plurality of heads being among a plurality of heads whose positions are different in a direction parallel to the first axis and which are included in a first head unit that constitutes an encoder that measures position information of the movable body in a direction parallel to the second axis by irradiating a detection light to the first grating; and a drive process of performing drive of the movable body in a direction parallel to the second axis, while correcting the measurement values obtained from the first head unit based on a measurement value of the first interferometer and the correction information on grating warp of the first grating.

With this method, by the processing in the first movement process and the first decision process, correction information used to correct grating warp of the first grating is obtained, and by the processing in the drive process, the drive of the movable body in a direction parallel to the second axis is performed, while correcting the measurement values obtained from the first head unit based on a measurement value of the first interferometer and the correction information on grating warp of the first grating. Accordingly, the drive of the movable body in a direction parallel to the second axis can be performed with good accuracy using the first grating and the first head unit (the encoder), without being affected by grating warp of the first grating. Further, by performing the operations similar to those described above also with respect to a direction parallel to the first axis, the drive of the movable body in a direction parallel to the first axis can also be performed.

According to a thirteenth aspect of the present invention, there is provided a third pattern forming method, comprising: a process of mounting an object on a movable body that can move within a moving plane; and a process of driving the movable body using the movable body drive method of the present invention for formation of a pattern to the object.

With this method, a pattern can be formed on the object with good accuracy.

Further, in a lithography process, a pattern can be formed on an object with good accuracy by forming the pattern on the object using any one of the first to third pattern forming methods of the present invention, and a microdevice with higher integration can be manufactured with good yield by performing processing (such as development, and etching) to the object on which the pattern has been formed.

Accordingly, it can also be said from a fourteenth aspect that the present invention is a device manufacturing method in which any one of the first to third pattern forming methods of the present invention is used.

According to a fifteenth aspect of the present invention, there is provided a first exposure method of exposing an object with an energy beam via an optical system, the method comprising: detecting the energy beam via first and second members by using a detecting unit that has the first and second members respectively arranged at first and second movable bodies that are independently movable within a predetermined plane.

With this method, since the first and second members are arranged at the first and second movable bodies respectively, detection of the energy beam can be performed by the detecting unit while moving the first movable body. Further, since only the first member that is part of the detecting unit is arranged at the first movable body, the first movable body does not increase in size, and therefore, the position controllability can favorably be secured.

According to a sixteenth aspect of the present invention, there is provided a second exposure method of exposing an object with an energy beam, the method comprising: a process of measuring position information of a first movable body that is movable within a predetermined plane holding the object and of a second movable body that is movable independently from the first movable body within the plane, using first and second measuring units, wherein a measurement value of the first measuring unit has short-term stability superior to that of the second measuring unit.

With this method, position information of the first movable body that moves within a predetermined plane holding the object can be measured by the first measuring unit whose measurement value has short-term stability superior to that of the second measuring unit. Accordingly, position control of the first movable body that holds the object on which a pattern is formed can be stably performed.

According to a seventeenth aspect of the present invention, there is provided a third exposure method of exposing an object with an energy beam, the method comprising: a process of measuring position information of a first movable body, which is movable in first and second directions within a predetermined plane holding the object and on which a first grating section that has a grating periodically arrayed in the first direction and a second grating section that has a grating periodically arrayed in the second direction are arranged, by a plurality of heads of an encoder system comprised in a first measuring unit, different two heads of which faces the first and second grating sections; and a process of measuring position information of a second movable body that is movable independently from the first movable body within the plane by an interferometer comprised in a second measuring unit.

With this method, position information of the second movable body is measured by the second measuring unit that includes the interferometer, and position information of the first movable body that moves within a predetermined plane holding the object is measured by the first measuring unit that includes the encoder system whose measurement value has short term stability superior to that of the interferometer. Accordingly, position control of the first movable body that holds the object on which a pattern is formed can be stably performed.

According to an eighteenth aspect of the present invention, there is provided a device manufacturing method, comprising: exposing an object using any one of the first to third exposure methods of the present invention; and developing the exposed object.

BRIEF DESCRIPTION OF THE DRAWINGS

In the accompanying drawings;

FIG. 8 is a block diagram showing the main configuration of a control system of the exposure apparatus related to an embodiment;

DESCRIPTION OF THE EMBODIMENTS

An embodiment of the present invention will be described below, with reference to FIGS. 1 to 36.

Figure 1:
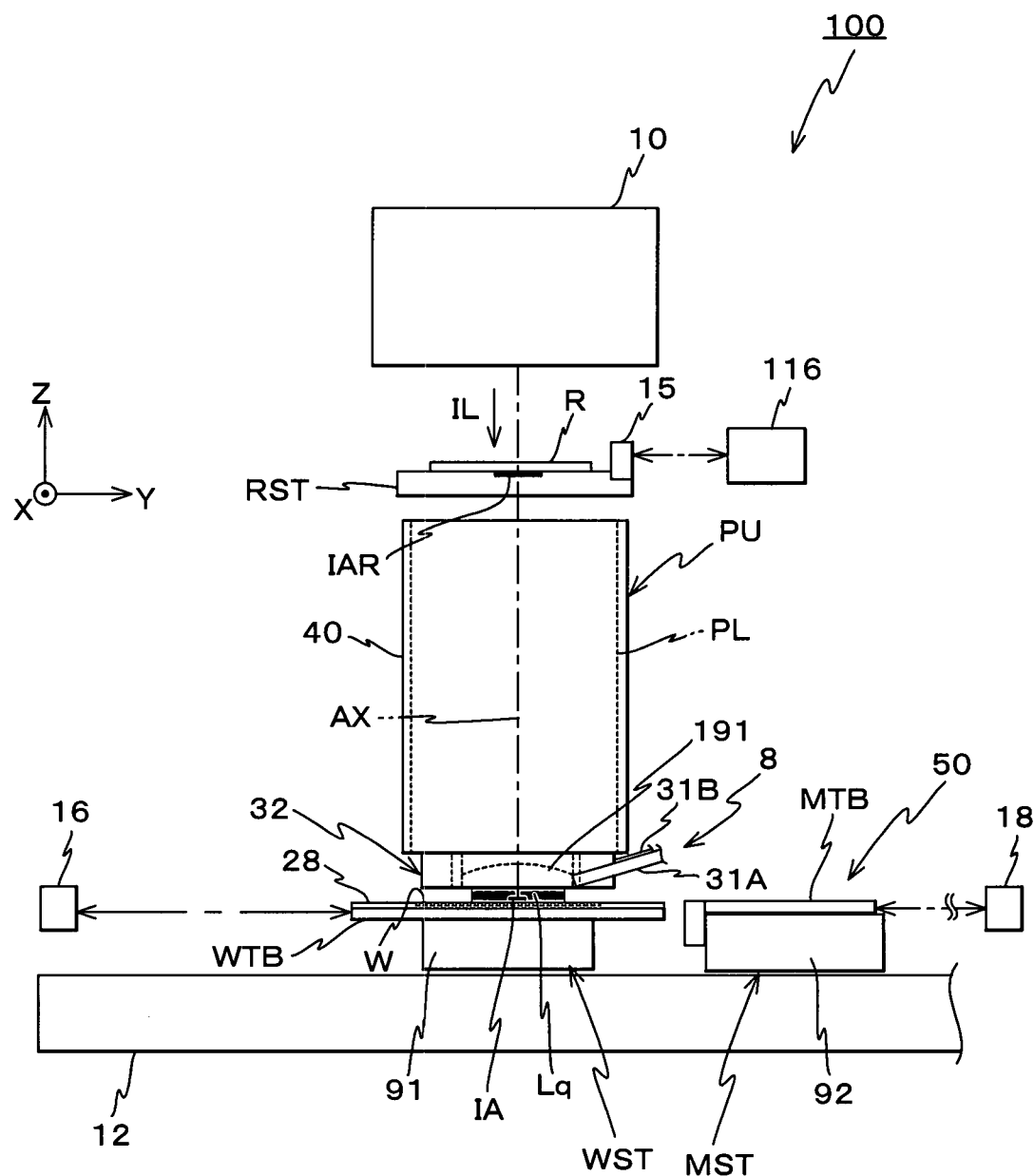
FIG. 1 is a view schematically showing the configuration of an exposure apparatus related to an embodiment.

FIG. 1 schematically shows the configuration of an exposure apparatus 100 related to an embodiment. Exposure apparatus 100 is a scanning exposure apparatus by a step-and-scan method, that is, a so-called scanner. As will be described later, in the embodiment, a projection optical system PL is arranged, and the following description will be made assuming that a direction parallel to an optical axis AX of projection optical system PL is a Z-axis direction, a direction in which a reticle and a wafer are relatively scanned within a plane orthogonal to the Z-axis direction is a Y-axis direction and a direction that is orthogonal to a Z-axis and a Y-axis is an X-axis direction, and rotation (tilt) directions around the X-axis, the Y-axis and the Z-axis are θx, θy and θz directions respectively.

Exposure apparatus 100 is equipped with an illumination system 10, a reticle stage RST that holds a reticle R that is illuminated by an illumination light for exposure (hereinafter, referred to as "illumination light" or "exposure light") IL from illumination system 10, a projection unit PU that includes projection optical system PL that projects illumination light IL emitted from reticle R on a wafer W, a stage unit 50 that has a wafer stage WST and a measurement stage MST, their control system, and the like. On wafer stage WST, wafer W is mounted.

Illumination system 10 includes a light source and an illumination optical system that has an illuminance uniformity optical system containing an optical integrator and the like, and a reticle blind and the like (none of which is shown), as is disclosed in, for example, Kokai (Japanese Unexamined Patent Application Publication) No. 2001-313250 (the corresponding U.S. Patent Application Publication No. 2003/0025890) and the like. In illumination system 10, a slit-shaped illumination area IAR on reticle R that is defined by the reticle blind (masking system) is illuminated by illumination light (exposure light) IL with substantially uniform illuminance. In this case, as illumination light IL, an ArF excimer laser light (wavelength: 193 nm) is used as an example. Further, as the optical integrator, for example, a fly-eye lens, a rod integrator (internal reflection type integrator), a diffraction optical element or the like can be used.

On reticle stage RST, reticle R having a pattern surface (the lower surface in FIG. 1) on which a circuit pattern and the like are formed is fixed by, for example, vacuum suction. Reticle stage RST is finely drivable within an XY plane and also drivable at designated scanning velocity in a scanning direction (which is the Y-axis direction being a horizontal direction of the page surface of FIG. 1), by a reticle stage drive system 11 (not shown FIG. 1, refer to FIG. 8) including, for example, a linear motor or the like.

Position information of reticle stage RST within the moving plane (including rotation information in the θz direction) is constantly detected at a resolution of, for example, around 0.5 to 1 nm with a reticle laser interferometer (hereinafter, referred to as a "reticle interferometer") 116 via a movable mirror 15 (in actual, a Y movable mirror (or a retroreflector) having a reflection surface orthogonal to the Y-axis direction and an X movable mirror having a reflection surface orthogonal to the X-axis direction are arranged). The measurement values of reticle interferometer 116 are sent to a main controller 20 (not shown in FIG. 1, refer to FIG. 8). Main controller 20 controls the position (and the velocity) of reticle stage RST by computing the position of reticle stage RST in the X-axis direction, the Y-axis direction and the θz direction based on the measurement values of reticle interferometer 116, and controlling reticle stage drive system 11 based on the computation results. Incidentally, instead of movable mirror 15, the end surface of reticle stage RST may be polished in order to form a reflection surface (corresponding to the reflection surface of movable mirror 15). Further, reticle interferometer 116 may be capable of measuring also position information of reticle stage RST in at least one of the Z-axis, θx and θy directions.

Projection unit PU is placed below reticle stage RST in FIG. 1. Projection unit PU includes a barrel 40 and projection optical system PL having a plurality of optical elements that are held in a predetermined positional relation within barrel 40. As projection optical system PL, for example, a dioptric system that is composed of a plurality of lenses (lens elements) that are arrayed along an optical axis AX direction parallel to the Z-axis direction is used. Projection optical system PL is, for example, both-side telecentric and has a predetermined projection magnification (such as one-quarter, one-fifth or one-eighth times). Therefore, when illumination area IAR is illuminated by illumination light IL from illumination system 10, illumination light IL having passed through reticle R whose pattern surface is placed substantially coincidentally with a first surface (object surface) of projection optical system PL forms a reduced image of a circuit pattern (a reduced image of part of a circuit pattern) of reticle R within illumination area IAR on an area (hereinafter, also referred to as an "exposure area") IA that is conjugate with illumination area IAR on wafer W, which is placed on a second surface (image plane) side of projection optical system PL and whose surface is coated with resist (photosensitive agent), via projection optical system PL (projection unit PU). Although not shown in the drawing, projection unit PU is mounted on a barrel platform that is supported by three support columns via a vibration isolation mechanism. As is disclosed in, for example, the pamphlet of International Publication No. 2006/038952, however, projection unit PU may also be supported in a suspended state with respect to a main frame member (not shown) that is placed above projection unit PU, or a base member on which reticle stage RST is placed.

Note that in exposure apparatus 100 of the embodiment, since exposure applying the liquid immersion method is performed, the aperture on a reticle side becomes larger when the numerical aperture NA of projection optical system PL substantially increases. Therefore, in a dioptric system made up of only lenses, it becomes difficult to satisfy the Petzval condition, which tends to lead to an increase in size of the projection optical system. In order to avoid such an increase in size of the projection optical system, a catadioptric system including mirrors and lenses may also be used. Further, on wafer W, not only photosensitive layers but also, for example, a protective film (topcoat film) or the like that protects the wafer or the photosensitive layers may be formed.

Figure 3:
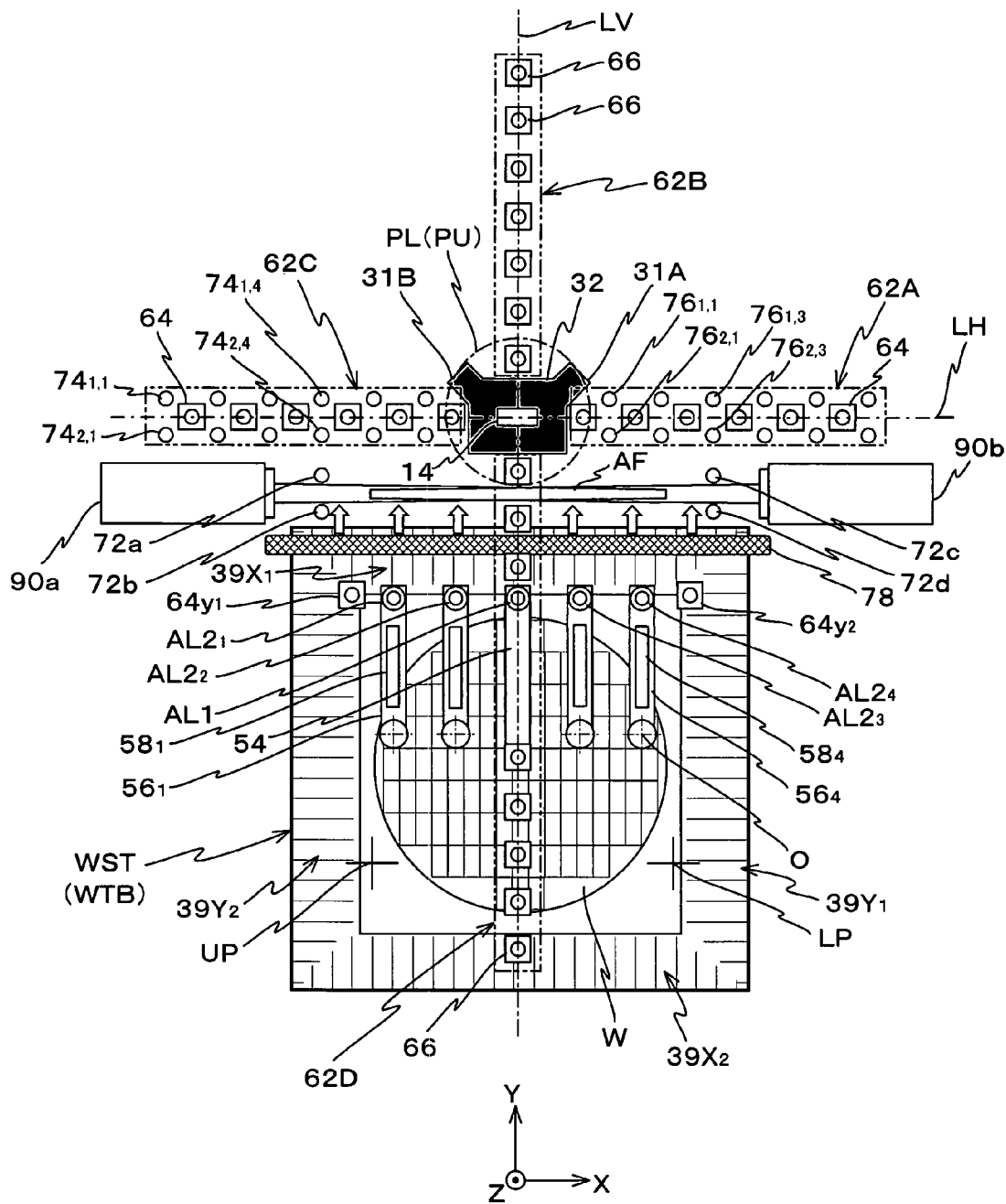
FIG. 3 is a planar view showing the placement of various measuring apparatuses (such as encoders, alignment systems, a multipoint AF system, and Z sensors) that are equipped in the exposure apparatus in FIG. 1.

Further, in exposure apparatus 100 of the embodiment, in order to perform exposure applying the liquid immersion method, a nozzle unit 32 that constitutes part of a local liquid immersion unit 8 is arranged so as to enclose the periphery of the lower end portion of barrel 40 that holds an optical element that is closest to an image plane side (wafer W side) that constitutes projection optical system PL, which is a lens (hereinafter, also referred to a "tip lens") 191 in this case. In the embodiment, as is shown in FIG. 1, the lower end surface of nozzle unit 32 is set to be substantially flush with the lower end surface of tip lens 191. Further, nozzle unit 32 is equipped with a supply opening and a recovery opening of liquid Lq, a lower surface to which wafer W is placed facing and at which the recovery opening is arranged, and a supply flow channel and a recovery flow channel that are connected to a liquid supply pipe 31A and a liquid recovery pipe 31B respectively. As is shown in FIG. 3, liquid supply pipe 31A and liquid recovery pipe 31B are inclined at an angle of 45 degrees with respect to the X-axis direction and the Y-axis direction in a planer view (when viewed from above) and are symmetrically placed with respect to a straight line LV in the Y-axis direction that passes through optical axis AX of projection optical system PL.

One end of a supply pipe (not shown) is connected to liquid supply pipe 31A while the other end of the supply pipe is connected to a liquid supply unit 5 (not shown in FIG. 1, refer to FIG. 8), and one end of a recovery pipe (not shown) is connected to liquid recovery pipe 31B while the other end of the recovery pipe is connected to a liquid recovery unit 6 (not shown in FIG. 1, refer to FIG. 8).

Liquid supply unit 5 includes a liquid tank, a compression pump, a temperature controller, a valve for controlling supply/stop of the liquid to liquid supply pipe 31A, and the like. As the valve, for example, a flow rate control valve is preferably used so that not only the supply/stop of the liquid but also the adjustment of flow rate can be performed. The temperature controller adjusts the temperature of the liquid within the liquid tank to nearly the same temperature, for example, as the temperature within the chamber (not shown) where the exposure apparatus is housed. Incidentally, the tank for supplying the liquid, the compression pump, the temperature controller, the valve, and the like do not all have to be equipped in exposure apparatus 100, and at least part of them can also be substituted by the equipment or the like available in the plant where exposure apparatus 100 is installed.

Liquid recovery unit 6 includes a liquid tank, a suction pump, a valve for controlling recovery/stop of the liquid via liquid recovery pipe 31B, and the like. As the valve, a flow rate control valve is preferably used similar to the valve of liquid supply unit 5. Incidentally, the tank for recovering the liquid, the suction pump, the valve, and the like do not all have to be equipped in exposure apparatus 100, and at least part of them can also be substituted by the equipment available in the plant where exposure apparatus 100 is installed.

In the embodiment, as the liquid described above, pure water (hereinafter, it will simply be referred to as "water" besides the case when specifying is necessary) that transmits the ArF excimer laser light (light with a wavelength of 193 nm) is to be used. Pure water can be obtained in large quantities at a semiconductor manufacturing plant or the like without difficulty, and it also has an advantage of having no adverse effect on the photoresist on the wafer, to the optical lenses or the like.

Refractive index n of the water with respect to the ArF excimer laser light is around 1.44. In the water the wavelength of illumination light IL is 193 nm×1/n, shorted to around 134 nm.

Liquid supply unit 5 and liquid recovery unit 6 each have a controller, and the respective controllers are controlled by main controller 20 (refer to FIG. 8). According to instructions from main controller 20, the controller of liquid supply unit 5 opens the valve connected to liquid supply pipe 31A to a predetermined degree to supply water to the space between tip lens 191 and wafer W via liquid supply pipe 31A, the supply flow channel and the supply opening. Further, when the water is supplied, according to instructions from main controller 20, the controller of liquid recovery unit 6 opens the valve connected to liquid recovery pipe 31B to a predetermined degree to recover the water from the space between tip lens 191 and wafer W into liquid recovery unit 6 (the liquid tank) via the recovery opening, the recovery flow channel and liquid recovery pipe 31B. During the supply and recovery operations, main controller 20 gives commands to the controllers of liquid supply unit 5 and liquid recovery unit 6 so that the quantity of water supplied to the space between tip lens 191 and wafer W constantly equals the quantity of water recovered from the space. Accordingly, a constant quantity of liquid (water) Lq (refer to FIG. 1) is held in the space between tip lens 191 and wafer W. In this case, liquid (water) Lq held in the space between tip lens 191 and wafer W is constantly replaced.

As is obvious from the above description, in the embodiment, local liquid immersion unit 8 is configured including nozzle unit 32, liquid supply unit 5, liquid recovery unit 6, liquid supply pipe 31A and liquid recovery pipe 31B, and the like. Incidentally, part of local liquid immersion unit 8, for example, at least nozzle unit 32 may also be supported in a suspended state by a main frame (including the barrel platform) that: holds projection unit PU, or may also be arranged at another frame member that is separate from the main frame. Or, in the case projection unit PU is supported in a suspended state as is described earlier, nozzle unit 32 may also be supported in a suspended state integrally with projection unit PU, but in the embodiment, nozzle unit 32 is arranged on a measurement frame that is supported in a suspended state independently from projection unit PU. In this case, projection unit PU does not have to be supported in a suspended state.

Incidentally, also in the case measurement stage MST is located below projection unit PU, the space between a measurement table (to be described later) and tip lens 191 can be filled with water in the similar manner to the manner described above.

Incidentally, in the above description, one liquid supply pipe (nozzle) and one liquid recovery pipe (nozzle) are to be arranged as an example. However, the present invention is not limited to this, and a configuration having multiple nozzles as disclosed in, for example, the pamphlet of International Publication No. 99/49504, may also be employed, in the case such arrangement is possible taking into consideration a relation with adjacent members. The point is that any configuration may be employed as far as the liquid can be supplied in the space between an optical member in the lowest end (tip lens) 191 constituting projection optical system PL and wafer W. For example, the liquid immersion mechanism disclosed in the pamphlet of International Publication No. 2004/053955, or the liquid immersion mechanism disclosed in the EP Patent Application Publication No. 1 420 298 can also be applied to the exposure apparatus of the embodiment.

Referring back to FIG. 1, stage unit 50 is equipped with wafer stage WST and measurement stage MST that are placed above a base board 12, an interferometer system 118 (refer to FIG. 8) including Y-axis interferometers 16 and 18 that measure position information of stages WST and MST, an encoder system (to be described later) that is used for measuring position information of wafer stage WST on exposure or the like, a stage drive system 124 (refer to FIG. 8) that drives stages WST and MST, and the like.

On the bottom surface of each of wafer stage WST and measurement stage MST, a noncontact bearing (not shown), for example, a vacuum preload type hydrostatic air bearing (hereinafter, referred to as an "air pad") is arranged at a plurality of points, and wafer stage WST and measurement stage MST are supported in a noncontact manner via a clearance of around several μm above base board 12, by static pressure of pressurized air that is blown out from the air pad toward the upper surface of base board 12. Further, stages WST and MST are independently drivable in two-dimensional directions, which are the Y-axis direction (a horizontal direction of the page surface of FIG. 1) and the X-axis direction (an orthogonal direction to the page surface of FIG. 1), by stage drive system 124.

Figure 2:
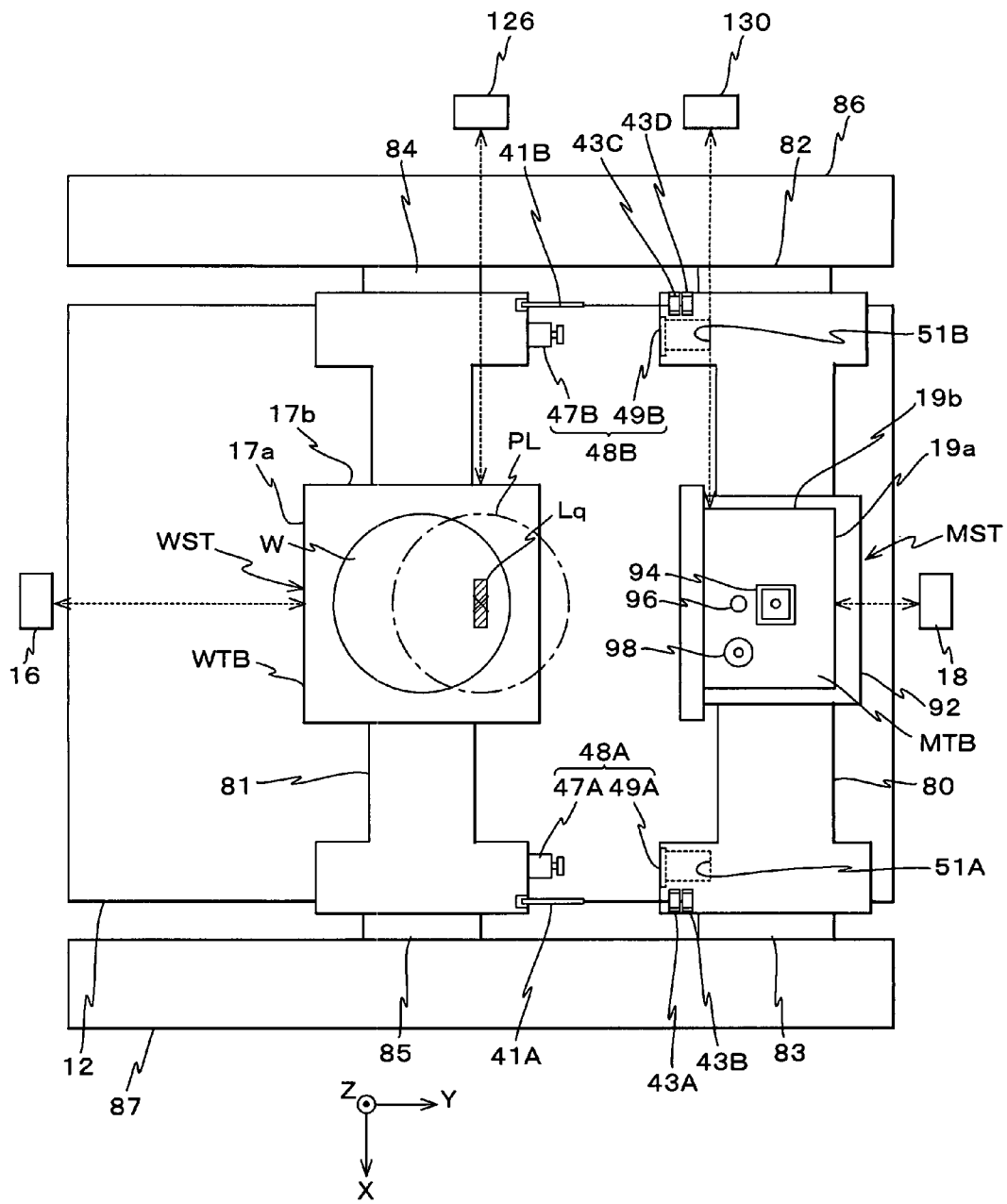
FIG. 2 is a planar view showing a stage unit in FIG. 1.

To be more specific, as is shown in the planar view in FIG. 2, on a floor surface, a pair of Y-axis stators 86 and 87 extending in the Y-axis direction are respectively placed on one side and the other side in the X-axis direction having base board 12 in between. Y-axis stators 86 and 87 are each composed of, for example, a magnetic pole unit that incorporates a permanent magnet group that is made up of plural pairs of a north pole magnet and a south pole magnet that are placed at a predetermined distance and alternately along the Y-axis direction. At Y-axis stators 86 and 87, two Y-axis movers 82 and 84, and two Y-axis movers 83 and 85 are respectively arranged in a noncontact engaged state. In other words, four Y-axis movers 82, 84, 83 and 85 in total are in a sate of being inserted in the inner space of Y-axis stator 86 or 87 whose XZ sectional surface has a U-like shape, and are severally supported in a noncontact manner via a clearance of, for example, around several μm via the air pad (not shown) with respect to corresponding Y-axis stator 86 or 87. Each of Y-axis movers 82, 84, 83 and 85 is composed of, for example, an armature unit that incorporates armature coils placed at a predetermined distance along the Y-axis direction. That is, in the embodiment, Y-axis movers 82 and 84 made up of the armature units and Y-axis stator 86 made up of the magnetic pole unit constitute moving coil type Y-axis linear motors respectively. Similarly, Y-axis movers 83 and 85 and Y-axis stator 87 constitute moving coil type Y-axis linear motors respectively. In the following description, each of the four Y-axis linear motors described above is referred to as a Y-axis linear motor 82, a Y-axis linear motor 84, a Y-axis linear motor 83 and a Y-axis linear motor 85 as needed, using the same reference codes as their movers 82, 84, 83 and 85.

Movers 82 and 83 of two Y-axis linear motors 82 and 83 out of the four Y-axis linear motors are respectively fixed to one end and the other end in a longitudinal direction of an X-axis stator 80 that extends in the X-axis direction. Further, movers 84 and 85 of the remaining two Y-axis linear motors 84 and 85 are fixed to one end and the other end of an X-axis stator 81 that extends in the X-axis direction. Accordingly, X-axis stators 80 and 81 are driven along the Y-axis by a pair of Y-axis linear motors 82 and 83 and a pair of Y-axis linear motors 84 and 85 respectively.

Each of X-axis stators 80 and 81 is composed of, for example, an armature unit that incorporates armature coils placed at a predetermined distance along the X-axis direction.

One X-axis stator, X-axis stator 81 is arranged in a state of being inserted in an opening (not shown) formed at a stage main section 91 (not shown in FIG. 2, refer to FIG. 1) that constitutes part of wafer stage WST. Inside the opening of stage main section 91, for example, a magnetic pole unit, which has a permanent magnet group that is made up of plural pairs of a north pole magnet and a south pole magnet placed at a predetermined distance and alternately along the X-axis direction, is arranged. This magnetic pole unit and X-axis stator 81 constitute a moving magnet type X-axis linear motor that drives stage main section 91 in the X-axis direction. Similarly, the other X-axis stator, X-axis stator 80 is arranged in a state of being inserted in an opening formed at a stage main section 92 that constitutes part of measurement stage MST. Inside the opening of stage main section 92, a magnetic pole unit, which is similar to the magnetic pole unit on the wafer stage WST side (stage main section 91 side), is arranged. This magnetic pole unit and X-axis stator 80 constitute a moving magnet type X-axis linear motor that drives measurement stage MST in the X-axis direction.

In the embodiment, each of the linear motors described above that constitute stage drive system 124 is controlled by main controller 20 shown in FIG. 8. Incidentally, each linear motor is not limited to either one of the moving magnet type or the moving coil type, and the types can appropriately be selected as needed.

Incidentally, by making thrust forces severally generated by a pair of Y-axis linear motors 84 and 85 be slightly different, yawing (rotation in the θz direction) of wafer stage WST can be controlled. Further, by making thrust forces severally generated by a pair of Y-axis linear motors 82 and 83 be slightly different, yawing of measurement stage MST can be controlled.

Wafer stage WST includes stage main section 91 described above and a wafer table WTB that is mounted on stage main section 91 via a Z-leveling mechanism (not shown) (such as a voice coil motor) and is finely driven relative to stage main section 91 in the Z-axis direction, the θx direction and the θy direction. Incidentally, in FIG. 8, stage drive system 124 is shown including each of the linear motors and the Z-leveling mechanism described above.

On wafer table WTB, a wafer holder (not shown) that holds wafer W by vacuum suction or the like is arranged. The wafer holder may also be formed integrally with wafer table WTB, but in the embodiment, the wafer holder and wafer table WTB are separately configured, and the wafer holder is fixed inside a recessed portion of wafer table WTB, for example, by vacuum suction or the like. Further, on the upper surface of wafer table WTB, a plate (liquid repellent plate) 28 is arranged, which has the surface (liquid repellent surface) substantially flush with the surface of a wafer mounted on the wafer holder to which liquid repellent processing with respect to liquid Lq is performed, has a rectangular outer shape (contour), and has a circular opening that is formed in the center portion and is slightly larger than the wafer holder (a mounting area of the wafer). Plate 28 is made of materials with a low coefficient of thermal expansion, such as glasses or ceramics (such as Zerodur (the brand name) of Schott AG, $Al_2O_3$, or TiC), and on the surface of plate 28, a liquid repellent film is formed by, for example, fluorine resin materials, fluorine series resin materials such as polytetrafluoroethylene (Teflon®), acrylic resin materials, or silicon series resin materials. Further, as is shown in a planer view of wafer table WTB (wafer stage WST) in FIG. 4A, plate 28 has a first liquid repellent area 28a whose outer shape (contour) is rectangular enclosing a circular opening, and a second liquid repellent area 28b that has a rectangular frame (annular) shape placed around first liquid repellent area 28a. On first liquid repellent area 28a, for example, at the time of an exposure operation, at least part of a liquid immersion area 14 that is protruded from the surface of the wafer is formed, and on second liquid repellent area 28b, scales for an encoder system (to be described later) are formed. Incidentally, at least part of the surface of plate 28 does not have to be flush with the surface of the wafer, that is, may have a different height from that of the surface of the wafer. Further, plate 28 may be a single plate, but in the embodiment, plate 28 is configured by combining a plurality of plates, for example, first and second liquid repellent plates that correspond to first liquid repellent area 28a and second liquid repellent area 28b respectively. In the embodiment, pure water is used as liquid Lq as is described above, and therefore, hereinafter first liquid repellent area 28a and second liquid repellent area 28b are also referred to as first water repellent plate 28a and second water repellent plate 28b.

In this case, exposure light IL is irradiated to first water repellent plate 28a on the inner side, while exposure light IL is hardly irradiated to second water repellent plate 28b on the outer side. Taking this fact into consideration, in the embodiment, a first water repellent area to which water repellent coat having sufficient resistance to exposure light IL (light in a vacuum ultraviolet region, in this case) is applied is formed on the surface of first water repellent plate 28a, and a second water repellent area to which water repellent coat having resistance to exposure light IL inferior to the first water repellent area is applied is formed on the surface of second water repellent plate 28b. In general, since it is difficult to apply water repellent coat having sufficient resistance to exposure light IL (light in a vacuum ultraviolet region, in this case) to a glass plate, it is effective to separate the water repellent plate into two sections in this manner, i.e. first water repellent plate 28a and second water repellent plate 28b around it. Incidentally, the present invention is not limited to this, and two types of water repellent coat that have different resistance to exposure light IL may also be applied on the upper surface of the same plate in order to form the first water repellent area and the second water repellent area. Further, the same kind of water repellent coat may be applied to the first and second water repellent areas. For example, only one water repellent area may also be formed on the same plate.

Figure 4A:
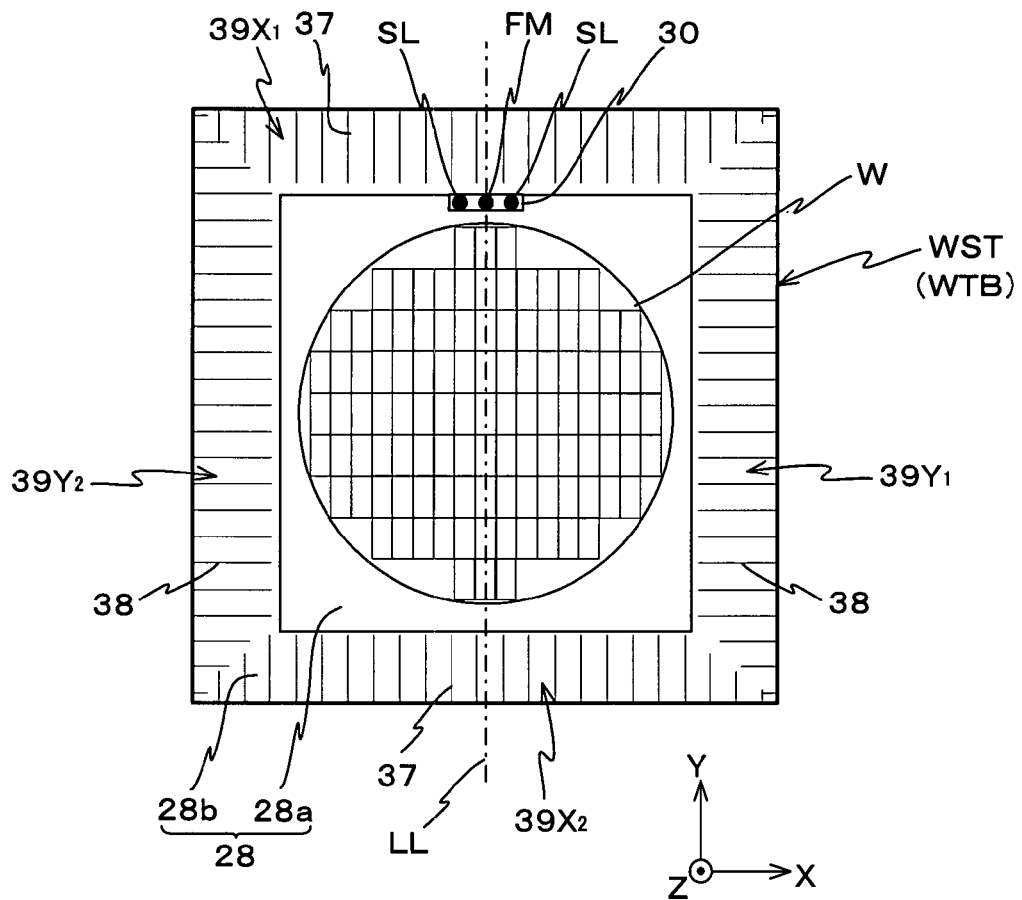
FIG. 4A is a planar view showing a wafer stage.

Further, as is obvious from FIG. 4A, at the end portion on the +Y side of first water repellent plate 28a, a rectangular cutout is formed in the center portion in the X-axis direction, and a measurement plate 30 is embedded inside the rectangular space (inside the cutout) that is enclosed by the cutout and second water repellent plate 28b. A fiducial mark FM is formed in the center in the longitudinal direction of measurement plate 30 (on a centerline LL of wafer table WTB), and a pair of aerial image measurement slit patterns (slit-shaped measurement patterns) SL are formed in the symmetrical placement with respect to the center of the fiducial mark on one side and the other side in the X-axis direction of the fiducial mark. As each of aerial image measurement slit patterns SL, an L-shaped slit pattern having sides along the Y-axis direction and X-axis direction, or two linear slit patterns extending in the X-axis and Y-axis directions respectively can be used, as an example.

Figure 4B:
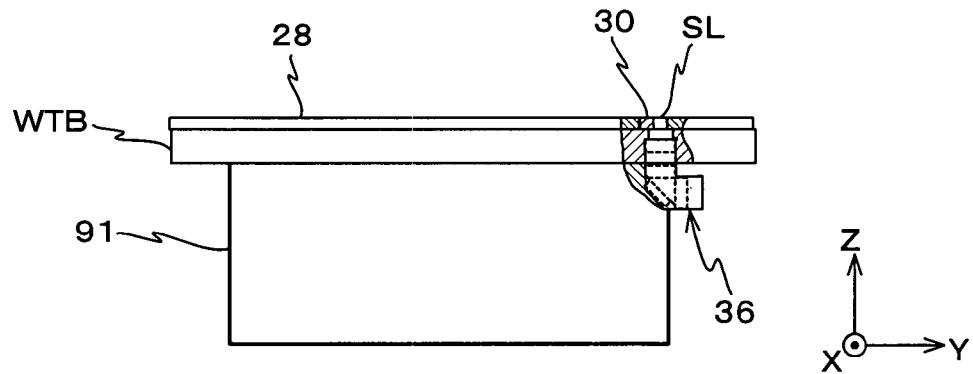
FIG. 4B is a schematic side view showing a partial cross section of wafer stage WST.

Further, as is shown in FIG. 4B, inside wafer stage WST below each of aerial image measurement slit patterns SL, an L-shaped housing 36 in which an optical system containing an objective lens, a mirror, a relay lens and the like is housed is attached in a partially embedded state penetrating through part of the inside of wafer table WTB and stage main section 91. Housing 36 is arranged in pairs corresponding to the pair of aerial image measurement slit patterns SL, although omitted in the drawing.

The optical system inside housing 36 guides illumination light IL that has been transmitted through aerial image measurement slit pattern SL along an L-shaped route and emits the light toward a −Y direction. Incidentally, in the following description, the optical system inside housing 36 is described as a light-transmitting system 36 by using the same reference code as housing 36 for the sake of convenience.

Moreover, on the upper surface of second water repellent plate 28b, multiple grating lines are directly formed in a predetermine pitch along each of four sides. More specifically, in areas on one side and the other side in the X-axis direction of second water repellent plate 28b (both sides in the horizontal direction in FIG. 4A), Y scales $39Y_1$ and $39Y_2$ are formed respectively, and Y scales $39Y_1$ and $39Y_2$ are each composed of a reflective grating (e.g. diffraction grating) having a periodic direction in the Y-axis direction in which grating lines 38 having the longitudinal direction in the X-axis direction are formed in a predetermined pitch along a direction parallel to the Y-axis (Y-axis direction).

Similarly, in areas on one side and the other side in the Y-axis direction of second water repellent plate 28b (both sides in the vertical direction in FIG. 4A), X scales $39X_1$ and $39X_2$ are formed respectively, and X scales $39X_1$ and $39X_2$ are each composed of a reflective grating (e.g. diffraction grating) having a periodic direction in the X-axis direction in which grating lines 37 having the longitudinal direction in the Y-axis direction are formed in a predetermined pitch along a direction parallel to the X-axis (X-axis direction). As each of the scales, the scale made up of a reflective diffraction grating RG (FIG. 10A) that is created by, for example, hologram or the like on the surface of second water repellent plate 28b is used. In this case, each scale has gratings made up of narrow slits, grooves or the like that are marked at a predetermined distance (pitch) as graduations. The type of diffraction grating used for each scale is not limited, and not only the diffraction grating made up of grooves or the like that are mechanically formed, but also, for example, the diffraction grating that is created by exposing interference fringe on a photosensitive resin may be used. However, each scale is created by marking the graduations of the diffraction grating, for example, in a pitch between 138 nm to 4 μm, for example, a pitch of 1 μm on a thin plate shaped glass. These scales are covered with the liquid repellent film (water repellent film) described above. Incidentally, the pitch of the grating is shown much wider in FIG. 4A than the actual pitch, for the sake of convenience. The same is true also in other drawings.

In this manner, in the embodiment, since second water repellent plate 28b itself constitutes the scales, a glass plate with low-thermal expansion is to be used as second water repellent plate 28b. However, the present invention is not limited to this, and a scale member made up of a glass plate or the like with low-thermal expansion on which a grating is formed may also be fixed on the upper surface of wafer table WTB, for example, by a plate spring (or vacuum suction) or the like so as to prevent local shrinkage/expansion. In this case, a water repellent plate to which the same water repellent coat is applied on the entire surface may be used instead of plate 28. Or, wafer table WTB may also be formed by materials with a low coefficient of thermal expansion, and in such a case, a pair of Y scales and a pair of X scales may be directly formed on the upper surface of wafer table WTB.

Mirror finish is severally applied to the −Y end surface and the −X end surface of wafer table WTB, and a reflection surface 17a and a reflection surface 17b shown in FIG. 2 are formed. By severally projecting an interferometer beam (measurement beam) to reflection surface 17a and reflection surface 17b and receiving a reflected light of each beam, Y-axis interferometer 16 and an X-axis interferometer 126 (X-axis interferometer 126 is not shown in FIG. 1, refer to FIG. 2) of interferometer system 118 (refer to FIG. 8) measure a displacement of each reflection surface from a datum position (generally, a fixed mirror is placed on the side surface of projection unit PU, and the surface is used as a datum surface), that is, position information of wafer stage WST within the XY plane, and the measurement values are supplied to main controller 20. In the embodiment, as both of Y-axis interferometer 16 and X-axis interferometer 126, a multiaxial interferometer having a plurality of optical axes is used, and based on the measurement values of Y-axis interferometer 16 and X-axis interferometer 126, main controller 20 can measure rotation information in the θx direction (i.e. pitching), rotation information in the θy direction (i.e. rolling), and rotation information in the θz direction (i.e. yawing) of wafer table WTB in addition to the X-position and Y-position of wafer table WTB. In the embodiment, however, position information within the XY plane (including the rotation information in the θz direction) of wafer stage WST (wafer table WTB) is mainly measured by an encoder system (to be described later) that includes the Y scales and the X scales described above and the like, and the measurement values of interferometers 16 and 126 are secondarily used in the cases such as when long-term fluctuation of the measurement values of the encoder system (e.g. due to deformation over time of the scales, or the like) is corrected (calibrated). Further, Y-axis interferometer 16 is used for measuring the Y-position of wafer table WTB or the like near the unloading position or the loading position (to be described later), for wafer replacement. Further, also in movement of wafer stage WST, for example, between a loading operation and an alignment operation, and/or between an exposure operation and an unloading operation, measurement information of interferometer system 118, that is, at least one of position information in directions of five degrees of freedom (the X-axis, Y-axis, θx, θy and θz directions) is used. Incidentally, at least part of interferometer system 118 (such as an optical system) may be arranged at the main frame that holds projection unit PU, or may also be arranged integrally with projection unit PU that is supported in a suspended state as is described above, but, in the embodiment, interferometer system 118 is to be arranged at the measurement frame described above.

Incidentally, in the embodiment, wafer stage WST is to include stage main section 91 that is freely movable within the XY plane and wafer table WTB that is mounted on stage main section 91 and is finely drivable relative to stage main section 91 in the Z-axis direction, the θx direction and the θy direction. However, the present invention is not limited to this, and a single stage that is movable in directions of six degrees of freedom may also be employed as wafer stage WST as a matter of course. Further, instead of reflection surface 17a and reflection surface 17b, a movable mirror made up of a planar mirror may also be arranged at wafer table WTB. Moreover, position information of wafer stage WST is to be measured using the reflection surface of the fixed mirror arranged at projection unit PU as a datum surface, but the position where the datum surface is placed is not limited to projection unit PU, and position information of wafer stage WST does not always have to be measured using the fixed mirror.

Further, in the embodiment, position information of wafer stage WST measured by interferometer system 118 is not to be used in an exposure operation or an alignment operation (to be described later) but is to be mainly used in a calibration operation of the encoder system (i.e. calibration of measurement values) or the like. However, measurement information of interferometer system 118 (i.e. at least one of position information in directions of five degrees of freedom) may also be used in operations such as the exposure operation and/or the alignment operation. In the embodiment, the encoder system measures position information of wafer stage WST in directions of three degrees of freedom, that is, position information in the X-axis, Y-axis and θz directions. Then, in the exposure operation or the like, out of measurement information of interferometer system 118, only position information related to different directions from measurement directions (the X-axis, Y-axis and θz directions) of position information of wafer stage WST by the encoder system, for example, related to the θx direction and/or the θy direction may also be used. Or, in addition to the position information related to different directions, position information related to the same directions as the measurement directions of the encoder system (i.e. at least one of the X-axis, Y-axis and θz directions) may also be used. Further, interferometer system 118 may also be capable of measuring position information of wafer stage WST in the Z-axis direction. In this case, position information in the Z-axis direction may be used in the exposure operation or the like.

Measurement stage MST includes stage main section 92 described above and a measurement table MTB mounted on stage main section 92. Measurement table MTB is mounted on stage main section 92 also via a Z-leveling mechanism (not shown). However, the present invention is not limited to this, and, for example, measurement stage MST having a so-called coarse/fine motion structure in which measurement table MTB is configured finely movable with respect to stage main section 92 in the X-axis direction, the Y-axis direction and the θz direction may also be employed, or the configuration may also be employed in which measurement table MTB is fixed on stage main section 92 and stage main section 92 including measurement table MTB is drivable in directions of six degrees of freedom.

Figure 5A:
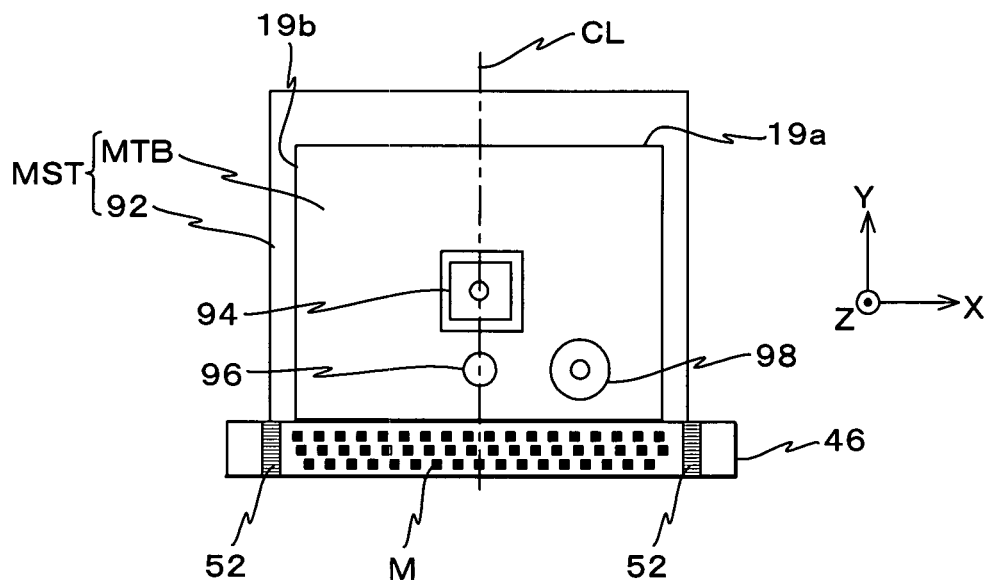
FIG. 5A is a planar view showing a measurement stage.

Various types of measurement members are arranged at measurement table MTB (and stage main section 92). For example, as is shown in FIGS. 2 and 5A, measurement members such as an irregular illuminance sensor 94 that has a pinhole-shaped light-receiving section that receives illumination light IL on an image plane of projection optical system PL, an aerial image measuring instrument 96 that measures an aerial image (projected image) of a pattern that is projected by projection optical system PL, and a wavefront aberration measuring instrument 98 by the Shack-Hartman method that is disclosed in, for example, the pamphlet of International Publication No. 03/065428 and the like are employed. As wavefront aberration measuring instrument 98, the one disclosed in, for example, the pamphlet of International Publication No. 99/60361 (the corresponding EP Patent Application Publication No. 1 079 223) can also be used.

As irregular illuminance sensor 94, the configuration similar to the one that is disclosed in, for example, Kokai (Japanese Unexamined Patent Application Publication) No. 57-117238 (the corresponding U.S. Pat. No. 4,465,368) and the like can be used. Further, as aerial image measuring instrument 96, the configuration similar to the one that is disclosed in, for example, Kokai (Japanese Unexamined Patent Application Publication) No. 2002-014005 (the corresponding U.S. Patent Application Publication No. 2002/0041377) and the like can be used. Incidentally, three measurement members (94, 96 and 98) are to be arranged at measurement stage MST in the embodiment, however, the types and/or the number of measurement members are/is not limited to them. As the measurement members, for example, measurement members such as a transmittance measuring instrument that measures a transmittance of projection optical system PL, and/or a measuring instrument that observes local liquid immersion unit 8, for example, nozzle unit 32 (or tip lens 191) or the like may also be used. Furthermore, members different from the measurement members such as a cleaning member that cleans nozzle unit 32, tip lens 191 or the like may also be mounted on measurement stage MST.

In the embodiment, as can be seen from FIG. 5A, the sensors that are frequently used such as irregular illuminance sensor 94 and aerial image measuring instrument 96 are placed on a centerline CL (Y-axis passing through the center) of measurement stage MST. Therefore, in the embodiment, measurement using theses sensors can be performed by moving measurement stage MST only in the Y-axis direction without moving the measurement stage in the X-axis direction.

In addition to each of the sensors described above, an illuminance monitor that has a light-receiving section having a predetermined area size that receives illumination light IL on the image plane of projection optical system PL may also be employed, which is disclosed in, for example, Kokai (Japanese Unexamined Patent Application Publication) No. 11-016816 (the corresponding U.S. Patent Application Publication No. 2002/0061469) and the like. The illuminance monitor is also preferably placed on the centerline.

Incidentally, in the embodiment, liquid immersion exposure is performed in which wafer W is exposed with exposure light (illumination light) IL via projection optical system PL and liquid (water) Lq, and accordingly irregular illuminance sensor 94 (and the illuminance monitor), aerial image measuring instrument 96 and wavefront aberration measuring instrument 98 that are used in measurement using illumination light IL receive illumination light IL via projection optical system PL and water. Further, only part of each sensor such as the optical system may be mounted on measurement table MTB (and stage main section 92), or the entire sensor may be placed on measurement table MTB (and stage main section 92).

Figure 5B:
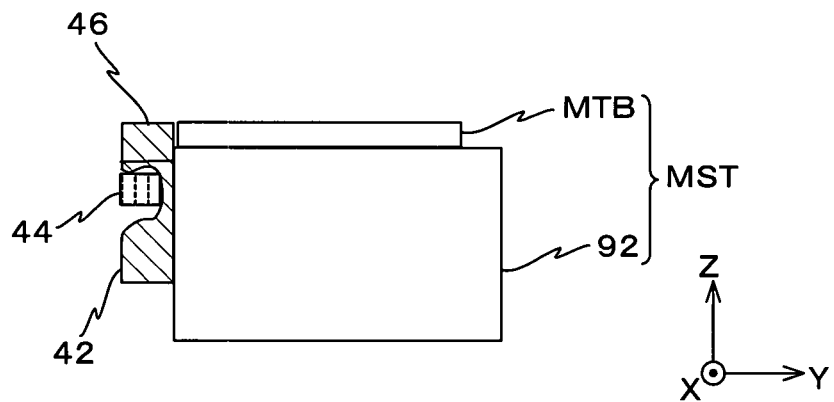
FIG. 5B is a schematic side view showing a partial cross section of the measurement stage.

As is shown in FIG. 5B, a frame-shaped attachment member 42 is fixed to the end surface on the −Y side of stage main section 92 of measurement stage MST. Further, to the end surface on the −Y side of stage main section 92, a pair of photodetection systems 44 are fixed in the vicinity of the center position in the X-axis direction inside an opening of attachment member 42, in the placement capable of facing a pair of light-transmitting systems 36 described previously. Each of photodetection systems 44 is composed of an optical system such as a relay lens, a light-receiving element such as a photomultiplier tube, and a housing that houses them. As is obvious from FIGS. 4B and 5B and the description so far, in the embodiment, in a state where wafer stage WST and measurement stage MST are closer together within a predetermined distance in the Y-axis direction (including a contact state), illumination light IL that has been transmitted through each aerial image measurement slit pattern SL of measurement plate 30 is guided by each light-transmitting system 36 and received by the light-receiving element of each photodetection system 44. That is, measurement plate 30, light-transmitting systems 36 and photodetection systems 44 constitute an aerial image measuring unit 45 (refer to FIG. 8), which is similar to the one disclosed in Kokai (Japanese Unexamined Patent Application Publication) No. 2002-014005 (the corresponding U.S. Patent Application Publication No. 2002/0041377) referred to previously, and the like.

On attachment member 42, a confidential bar (hereinafter, shortly referred to as a "CD bar") 46 that is made up of a bar-shaped member having a rectangular sectional shape and serves as a reference member is arranged extending in the X-axis direction. CD bar 46 is kinematically supported on measurement stage MST by full-kinematic mount structure.

Since CD bar 46 serves as a prototype standard (measurement standard), optical glass ceramics with a low coefficient of thermal expansion, such as Zerodur (the brand name) of Schott AG are employed as the materials. The flatness degree of the upper surface (the surface) of CD bar 46 is set high to be around the same level as a so-called datum plane plate. Further, as is shown in FIG. 5A, a reference grating (e.g. diffraction grating) 52 whose periodic direction is the Y-axis direction is respectively formed in the vicinity of the end portions on one side and the other side in the longitudinal direction of CD bar 46. The pair of reference gratings 52 are formed apart at a predetermined distance (which is to be "L") in the symmetrical placement with respect to the center in the X-axis direction of CD bar 46, that is, centerline CL described above.

Further, on the upper surface of CD bar 46, a plurality of reference marks M are formed in the placement as shown in FIG. 5A. The plurality of reference marks M are formed in three-row arrays in the Y-axis direction in the same pitch, and the array of each row is formed being shifted from each other by a predetermined distance in the X-axis direction. As each of reference marks M, a two-dimensional mark having a size that can be detected by a primary alignment system and secondary alignment systems (to be described later) is used. Reference mark M may also be different in shape (constitution) from fiducial mark FM, but in the embodiment, reference mark M and fiducial mark FM have the same constitution and also they have the same constitution with that of an alignment mark of wafer W. Incidentally, in the embodiment, the surface of CD bar 46 and the surface of measurement table MTB (which may include the measurement members described above) are also covered with a liquid repellent film (water repellent film) severally.

Also on the +Y end surface and the −X end surface of measurement table MTB, reflection surfaces 19a and 19b are formed similar to wafer table WTB as described above (refer to FIGS. 2 and 5A). By projecting an interferometer beam (measurement beam), as is shown in FIG. 2, to reflection surfaces 19a and 19b and receiving a reflected light of each interferometer beam, Y-axis interferometer 18 and an X-axis interferometer 130 (X-axis interferometer 130 is not shown in FIG. 1, refer to FIG. 2) of interferometer system 118 (refer to FIG. 8) measure a displacement of each reflection surface from a datum position, that is, position information of measurement stage MST (e.g. including at least position information in the X-axis and Y-axis directions and rotation information in the θz direction), and the measurement values are supplied to main controller 20.

Figure 6:
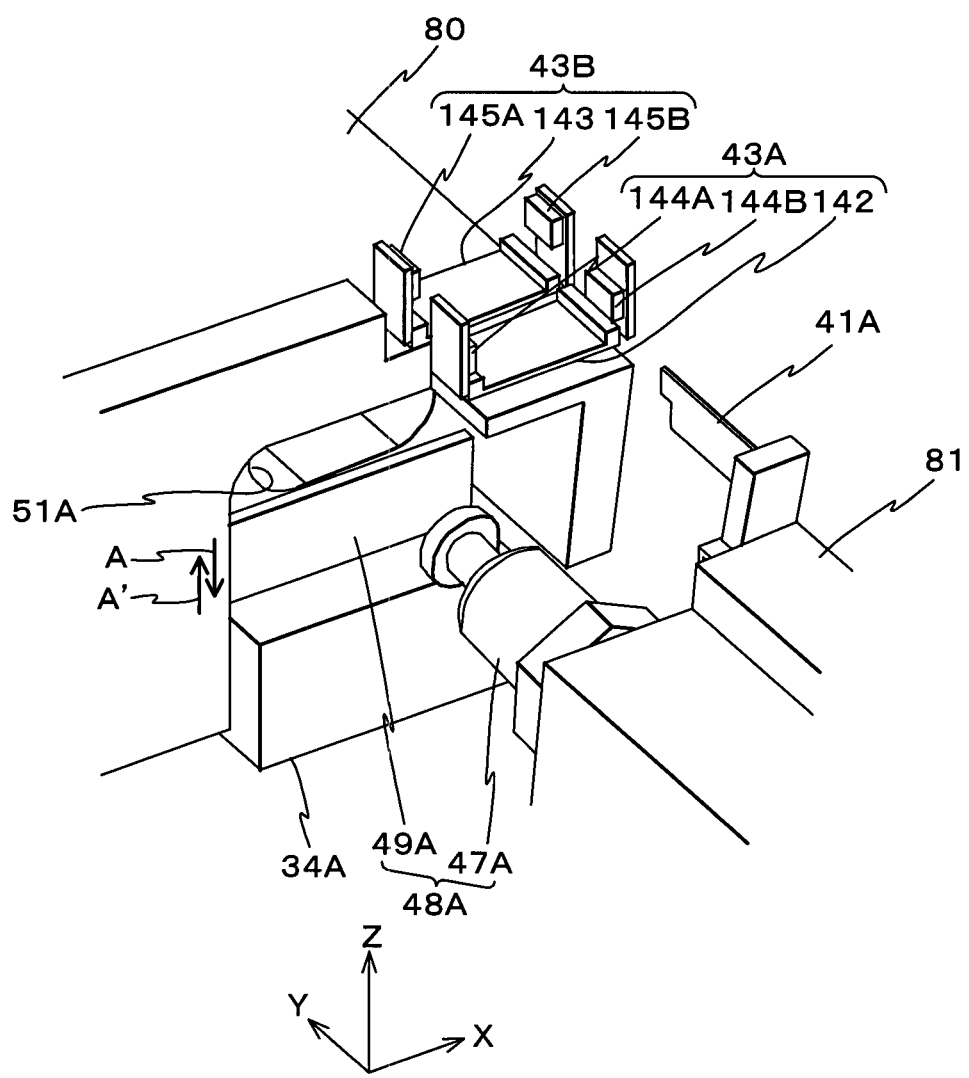
FIG. 6 is a perspective view showing the vicinity of the +X side end portion of X-axis stators 80 and 81 in FIG. 2.

Meanwhile, as is shown in FIG. 2, stopper mechanisms 48A and 48B are arranged at X-axis stator 81 and X-axis stator 80. As is shown in FIG. 6 that shows the vicinity of the +X side end portion of X-axis stators 80 and 81 in a perspective view, stopper mechanism 48A includes a shock absorber 47A serving as a buffer unit that is arranged at X-axis stator 81 and made up of, for example, an oil damper, and a shutter 49A arranged at a position (the end surface on the −Y side of the +X end portion) on X-axis stator 80 that faces shock absorber 47A. At the position on X-axis stator 80 that faces shock absorber 47A, an opening 51A is formed.

As is shown in FIG. 6, shutter 49A is drivable in directions of arrows A and A' (Z-axis direction) by a drive mechanism 34A that is arranged on the −Y side of opening 51A formed in X-axis stator 80 and includes, for example, an air cylinder and the like. Accordingly, shutter 49A can make opening 51A be in an opened state or a closed state. The opened/closed state of opening 51A by shutter 49A is detected by an opening/closing sensor 101 (not shown in FIG. 6, refer to FIG. 8) that is arranged in the vicinity of shutter 49A, and the detection results are sent to main controller 20.

Stopper mechanism 48B has the configuration similar to stopper mechanism 48A. In other words, as is shown in FIG. 2, stopper mechanism 48B includes a shock absorber 47B that is arranged in the vicinity of the −X end portion of X-axis stator 81, and a shutter 49B arranged at a position on X-axis stator 80 that faces shock absorber 47B. Further, at the +Y side portion of shutter 49B of X-axis stator 80, an opening 51B is formed.

Herein, the operations of stopper mechanisms 48A and 48B will be explained based on FIGS. 7A to 7D, focusing on stopper mechanism 48A as a representative.

Figure 7A:
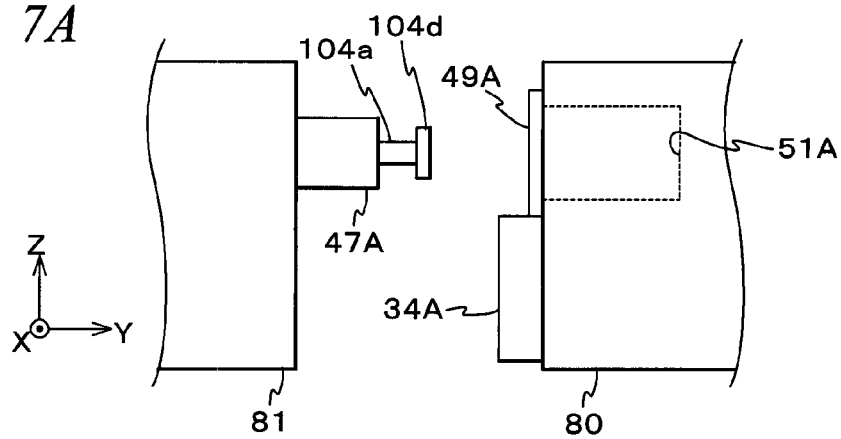
FIGS. 7A to 7D are views used to explain the operations of a stopper mechanism.
Figure 7B:
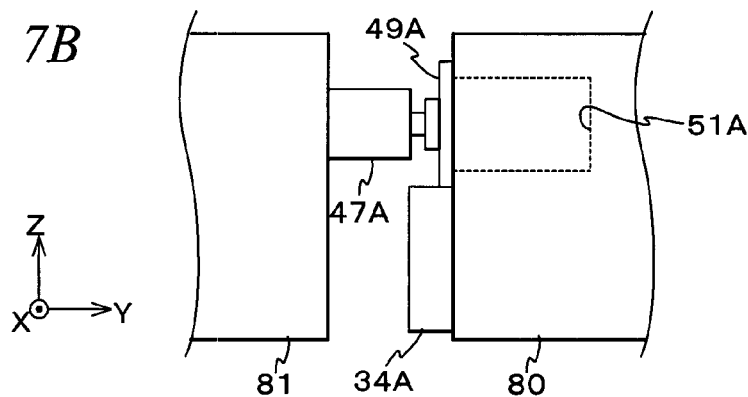

In the case shutter 49A is in a state of closing opening 51A as is shown in FIG. 7A, even when X-axis stator 81 and X-axis stator 80 come close together as is shown in FIG. 7B, X-axis stators 81 and 80 cannot come any closer by shock absorber 47A and shutter 49A coming into contact with (contacting) each other. In this case, the configuration is employed in which wafer table WTB and measurement table MTB do not come into contact with each other even in the case where a head section 104d fixed to a tip of a piston rod 104a of shock absorber 47A moves to the most −Y side (i.e. in the case where a spring (not shown) of shock absorber 47A contracts most, and the overall length becomes shortest) as is shown in FIG. 7B.

Figure 7C:
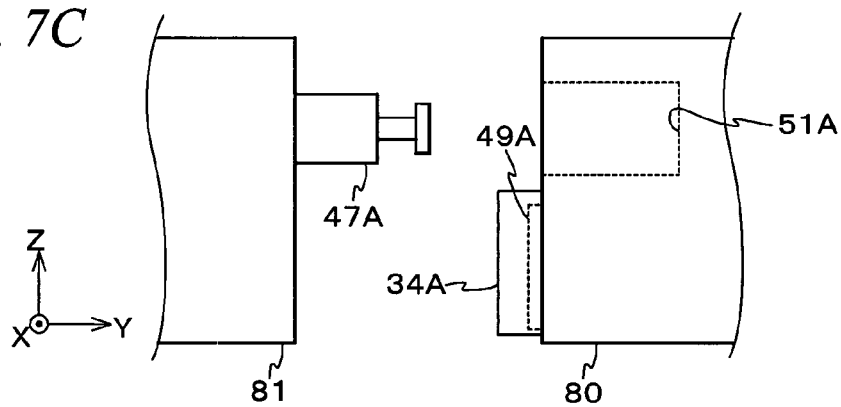
Figure 7D:
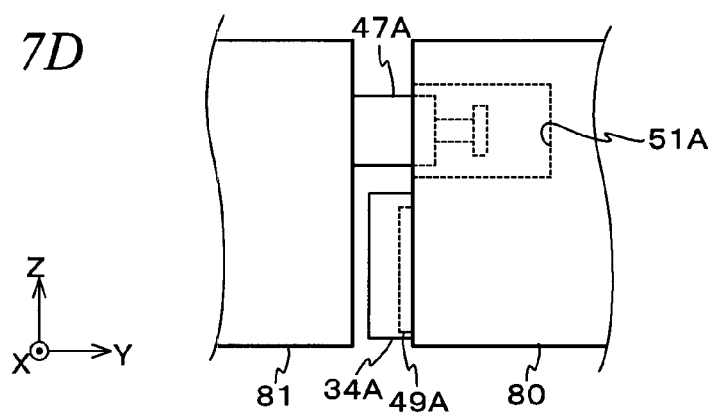

On the other hand, when shutter 49A is driven downward via drive mechanism 34A as is shown in FIG. 7C, opening 51A is in an opened state. In this case, when X-axis stators 81 and 80 come close to each other, at least part of a tip portion of piston rod 104a of shock absorber 47A can be inserted into opening 51A as is shown in FIG. 7D, which makes it possible to make X-axis stators 81 and 80 come closer to each other than the state shown in FIG. 7B. In such a state where X-axis stators 81 and 80 are closest to each other, wafer table WTB and measurement table MTB (CD bar 46) can be made to come into contact with each other (or, to come closer together at a distance of around 300 μm) (refer to FIG. 14B and the like).

As is shown in FIG. 7D, the depth of opening 51A may be set so that a gap is formed between shock absorber 47A and a termination portion (a portion corresponding to a bottom) of opening 51A even in a state where X-axis stators 81 and 80 are closest to each other, or may be set so that head section 104d of piston rod 104a of shock absorber 47A touches the termination portion. Further, in order to prevent shock absorber 47A and a wall portion of opening 51A from coming into contact with each other even in the case X-axis stators 81 and 80 relatively move in the X-axis direction, a width of the opening portion may also be set in advance in accordance with a quantity of the relative movement.

Incidentally, in the embodiment, a pair of stopper mechanism 48A and 48B are to be arranged at X-axis stator 81 and X-axis stator 80. However, only one of stopper mechanisms 48A and 48B may also be arranged, or a stopper mechanism similar to the one described above may also be arranged at wafer stage WST and measurement stage MST.

Referring back to FIG. 2, a clearance detection sensor 43A and a collision detection sensor 43B are arranged at the +X end portion of X-axis stator 80, and a plate-shaped member 41A that is elongate in the Y-axis direction is arranged protruding to the +Y side at the +X end portion of X-axis stator 81. Further, as is shown in FIG. 2, a clearance detection sensor 43C and a collision detection sensor 43D are arranged at the −X end portion of X-axis stator 80, and a plate-shaped member 41B that is elongate in the Y-axis direction is arranged protruding to the +Y side at the −X end portion of X-axis stator 81.

Clearance detection sensor 43A is composed of, for example, a transmissive photosensor (e.g. LED-PTr transmissive photosensor), and includes a fixed member 142 having a U-shape, and an light-emitting section 144A and a light-receiving section 144B that are respectively arranged on a pair of surfaces facing each other of fixed member 142, as is shown in FIG. 6. With clearance detection sensor 43A, in the case X-axis stator 80 and X-axis stator 81 come close further from the state of FIG. 6, plate-shaped member 41A comes between light-receiving section 144B and light-emitting section 144A and the light from light-emitting section 144A is intercepted by a lower half portion of plate-shaped member 41A, and a light quantity received by light-receiving section 144B gradually decreases and the output current gradually becomes smaller. Accordingly, main controller 20 can detect that the clearance between X-axis stators 80 and 81 becomes equal to or less than a predetermined distance by detecting the output current.

As is shown in FIG. 6, collision detection sensor 43B includes a fixed member 143 having a U-shape, and an light-emitting section 145A and a light-receiving section 145B that are respectively arranged on a pair of surfaces facing each other of fixed member 143. In this case, as is shown in FIG. 6, light-emitting section 145A is placed at a slightly higher position than light-emitting section 144A of clearance detection sensor 43A, and light-receiving section 145B is placed at a slightly higher position than light-receiving section 144B of clearance detection sensor 43A so as to correspond to light-emitting section 145A.

With collision detection sensor 43B, at the stage where X-axis stators 80 and 81 further come close to each other and wafer table WTB and CD bar 46 (measurement table MTB) come into contact with each other (or at the stage where wafer table WTB and CD bar 46 (measurement table MTB) come closer together at a distance of around 300 μm), the position of the upper half portion of plate-shaped member 41A is set between light-emitting section 145A and light-receiving section 145B, and therefore the light from light-emitting section 145A is not incident on light-receiving section 145B. Accordingly, main controller 20 can detect that both tables come into contact with each other (or come closer together at a distance of around 300 μm) by detecting the output current from light-receiving section 145B becoming zero.

Note that clearance detection sensor 43C and collision detection sensor 43D that are arranged in the vicinity of the −X end portion of X-axis stator 80 are also configured similar to clearance detection sensor 43A and collision detection sensor 43B described above, and plate-shaped member 41B is also configured similar to plate-shaped member 41A described above.

In exposure apparatus 100 of the embodiment, in actual, a primary alignment system AL1 is placed on straight line LV passing through the center of projection unit PU (optical axis AX of projection optical system PL, which also coincides with the center of exposure area IA in the embodiment) and being parallel to the Y-axis, and has a detection center at a position that is spaced apart from the optical axis at a predetermined distance on the −Y side as is shown in FIG. 3, although omitted in FIG. 1 from the viewpoint of avoiding intricacy of the drawing. Primary alignment system AL1 is fixed to the lower surface of a main frame (not shown) via a support member 54. On one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to straight line LV are severally arranged. That is, five alignment systems AL1 and $AL2_1$ to $AL2_4$ are placed so that their detection centers are placed at different positions in the X-axis direction, that is, placed along the X-axis direction.

As is representatively shown by secondary alignment system $AL2_4$, each secondary alignment system $AL2_n$ (n=1 to 4) is fixed to a tip (turning end) of an arm $56_n$ (n=1 to 4) that can turn around a rotation center O as the center in a predetermined angle range in clockwise and anticlockwise directions in FIG. 3. In the embodiment, a partial section of each secondary alignment system $AL2_n$ (e.g. including at least an optical system that irradiates an alignment light to a detection area and also leads the light that is generated from a subject mark within the detection area to a light-receiving element) is fixed to arm $56_n$ and the remaining section is arranged at the main frame that holds projection unit PU. The X-positions of secondary alignment systems $AL2_1$, $AL2_2$, $AL2_3$ and $AL2_4$ are severally adjusted by turning around rotation center O as the center. In other words, the detection areas (or the detection centers) of secondary alignment systems $AL2_1$, $AL2_2$, $AL2_3$ and $AL2_4$ are independently movable in the X-axis direction. Accordingly, the relative positions of the detection areas of primary alignment system AL1 and secondary alignment systems $AL2_1$, $AL2_2$, $AL2_3$ and $AL2_4$ are adjustable in the X-axis direction. Incidentally, in the embodiment, the X-positions of secondary alignment systems $AL2_1$, $AL2_2$, $AL2_3$ and $AL2_4$ are to be adjusted by the turning of the arms. However, the present invention is not limited to this, and a drive mechanism that drives secondary alignment systems $AL2_1$, $AL2_2$, $AL2_3$ and $AL2_4$ back and forth in the X-axis direction may also be arranged. Further, at least one of secondary alignment systems $AL2_1$, $AL2_2$, $AL2_3$ and $AL2_4$ may be movable not only in the X-axis direction but also in the Y-axis direction. Incidentally, since part of each secondary alignment system $AL2_n$ is moved by arm $56_n$, position information of the part that is fixed to arm $56_n$ is measurable by a sensor (not shown) such as an interferometer, or an encoder. The sensor may only measure position information in the X-axis direction of secondary alignment system $AL2_n$, or may be capable of measuring position information in another direction, for example, the Y-axis direction and/or the rotation direction (including at least one of the θx and θy directions).

On the upper surface of each arm $56_n$, a vacuum pad $58_n$ (n=1 to 4) that is composed of a differential evacuation type air bearing is arranged. Further, arm $56_n$ can be turned by a rotation drive mechanism $60_n$ (n=1 to 4, not shown in FIG. 3, refer to FIG. 8) that includes, for example, a motor or the like, in response to instructions of main controller 20. Main controller 20 activates each vacuum pad $58_n$ to fix each arm $56_n$ to a main frame (not shown) by suction after rotation adjustment of arm $56_n$. Thus, the state of each arm 56, after rotation angle adjustment, that is, a desired positional relation between primary alignment system AL1 and four secondary alignment systems $AL2_1$ to $AL2_4$ is maintained. Incidentally, specific rotation adjustment of each arm, that is, an adjusting method of relative positions of four secondary alignment systems $AL2_1$ to $AL2_4$ with respect to primary alignment system AL1 will be described later.

Incidentally, in the case a portion of the main frame facing arm $56_n$ is a magnetic body, an electromagnet may also be employed instead of vacuum pad 58.

In the embodiment, as each of primary alignment system AL1 and four secondary alignment systems $AL2_1$ to $AL2_4$, for example, an FIA (Field Image Alignment) system by an image processing method is used that irradiates a broadband detection beam that does not expose resist on a wafer to a subject mark, and picks up an image of the subject mark formed on a light-receiving plane by the reflected light from the subject mark and an image of an index (an index pattern on an index plate arranged within each alignment system) (not shown), using an imaging device (such as CCD), and then outputs their imaging signals. The imaging signal from each of primary alignment system AL1 and four secondary alignment systems $AL2_1$ to $AL2_4$ is supplied to main controller 20 in FIG. 8.

Incidentally, each of the alignment systems described above is not limited to the FIA system, and an alignment sensor, which irradiates a coherent detection light to a subject mark and detects a scattered light or a diffracted light generated from the subject mark or makes two diffracted lights (e.g. diffracted lights of the same order or diffracted lights being diffracted in the same direction) generated from the subject mark interfere and detects an interference light, can naturally be used alone or in combination as needed. Further, five alignment systems AL1 and $AL2_1$ to $AL2_4$ are to be arranged in the embodiment. However, the number of alignment systems is not limited to five, but may be the number equal to or more than two and equal to or less than four, or may be the number equal to or more than six, or may be the even number, not the odd number. Moreover, in the embodiment, five alignment systems AL1 and $AL2_1$ to $AL2_4$ are to be fixed to the lower surface of the main frame that holds projection unit PU, via support member 54. However, the present invention is not limited to this, and for example, the five alignment systems may also be arranged on the measurement frame described earlier.

In exposure apparatus 100 of the embodiment, as is shown in FIG. 3, four head units 62A to 62D of the encoder system are placed in a state of surrounding nozzle unit 32 on all four sides. In actual, head units 62A to 62D are fixed to the foregoing main frame that holds projection unit PU in a suspended state via a support member, although omitted in the drawings such as FIG. 3 from the viewpoint of avoiding intricacy of the drawings. Incidentally, for example, in the case projection unit PU is supported in a suspended state, head units 62A to 62D may be supported in a suspended state integrally with projection unit PU, or may be arranged at the measurement frame described above.

Head units 62A and 62C are respectively placed on the +X side and –X side of projection unit PU having the longitudinal direction in the X-axis direction, and are also placed apart at the substantially same distance from optical axis AX of projection optical system PL symmetrically with respect to optical axis AX of projection optical system PL. Further, head units 62B and 62D are respectively placed on the +Y side and –Y side of projection unit PU having the longitudinal direction in the Y-axis direction and are also placed apart at the substantially same distance from optical axis AX of projection optical system PL.

As is shown in FIG. 3, head units 62A and 62C are each equipped with a plurality of (six in this case) Y heads 64 that are placed at a predetermined distance on a straight line LH that passes through optical axis AX of projection optical system PL and is parallel to the X-axis, along the X-axis direction. Head unit 62A constitutes a multiple-lens (six-lens in this case) Y linear encoder (hereinafter, shortly referred to as a "Y encoder" or an "encoder" as needed) 70A (refer to FIG. 8) that measures the position in the Y-axis direction (the Y-position) of wafer stage WST (wafer table WTB) using Y scale $39Y_1$ described above. Similarly, head unit 62C constitutes a multiple-lens (six-lens, in this case) Y linear encoder 70C (refer to FIG. 8) that measures the Y-position of wafer stage WST (wafer table WTB) using Y scale $39Y_2$ described above. In this case, a distance between adjacent Y heads 64 (i.e. measurement beams) equipped in head units 62A and 62C is set shorter than a width in the X-axis direction of Y scales $39Y_1$ and $39Y_2$ (to be more accurate, a length of grating line 38). Further, out of a plurality of Y heads 64 that are equipped in each of head units 62A and 62C, Y head 64 located innermost is fixed to the lower end portion of barrel 40 of projection optical system PL (to be more accurate, to the side of nozzle unit 32 enclosing tip lens 191) so as to be placed as close as possible to the optical axis of projection optical system PL.

As is shown in FIG. 3, head unit 62B is equipped with a plurality of (seven in this case) X heads 66 that are placed on straight line LV at a predetermined distance along the Y-axis direction. Further, head unit 62D is equipped with a plurality of (eleven in this case, out of eleven X heads, however, three X heads that overlap primary alignment system AL1 are not shown in FIG. 3) X heads 66 that are placed on straight line LV at a predetermined distance. Head unit 62B constitutes a multiple-lens (seven-lens, in this case) X linear encoder (hereinafter, shortly referred to as an "X encoder" or an "encoder" as needed) 70B (refer to FIG. 8) that measures the position in the X-axis direction (the X-position) of wafer stage WST (wafer table WTB) using X scale $39X_1$ described above. Further, head unit 62D constitutes a multiple-lens (eleven-lens, in this case) X linear encoder 70D (refer to FIG. 8) that measures the X-position of wafer stage WST (wafer table WTB) using X scale $39X_2$ described above. Further, in the embodiment, for example, at the time of alignment (to be described later) or the like, two X heads 66 out of eleven X heads 66 that are equipped in head unit 62D simultaneously face X scale $39X_1$ and X scale $39X_2$ respectively in some cases. In these cases, X scale $39X_1$ and X head 66 facing X scale $39X_1$ constitute X linear encoder 70B, and X scale $39X_2$ and X head 66 facing X scale $39X_2$ constitute X linear encoder 70D.

Herein, some of eleven X heads 66, in this case, three X heads are attached below support member 54 of primary alignment system AL1. Further, a distance between adjacent X heads 66 (i.e. measurement beams) that are equipped in each of head units 62B and 62D is set shorter than a width in the Y-axis direction of X scales $39X_1$ and $39X_2$ (to be more accurate, a length of grating line 37). Further, X head 66 located innermost out of a plurality of X heads 66 that are quipped in each of head units 62B and 62D is fixed to the lower end portion of the barrel of projection optical system PL (to be more accurate, to the side of nozzle unit 32 enclosing tip lens 191) so as to be placed as close as possible to the optical axis of projection optical system PL.

Moreover, on the −X side of secondary alignment system $AL2_1$ and on the +X side of secondary alignment system $AL2_4$, Y heads $64y_1$ and $64y_2$ are respectively arranged, whose detection points are placed on a straight line parallel to the X-axis that passes through the detection center of primary alignment system AL1 and are substantially symmetrically placed with respect to the detection center. The distance between Y heads $64y_1$ and $64y_2$ is set substantially equal to distance L described previously. Y heads $64y_1$ and $64y_2$ face Y scales $39Y_2$ and $39Y_1$ respectively in a state where the center of wafer W on wafer stage WST is on straight line LV as shown in FIG. 3. On an alignment operation (to be described later) or the like, Y scales $39Y_2$ and $39Y_1$ are placed facing Y heads $64y_1$ and $64y_2$ respectively, and the Y-position (and the θz rotation) of wafer stage WST is measured by Y heads $64y_1$ and $64y_2$ (i.e. Y encoders 70C and 70A composed of Y heads $64y_1$ and $64y_2$).

Further, in the embodiment, at the time of baseline measurement of the secondary alignment systems (to be described later) or the like, a pair of reference gratings 52 of CD bar 46 face Y heads $64y_1$ and $64y_2$ respectively, and the Y-position of CD bar 46 is measured at the position of each of reference gratings 52 by Y heads $64y_1$ and $64y_2$ and facing reference gratings 52. In the following description, encoders that are composed of Y heads $64y_1$ and $64y_2$ facing reference gratings 52 respectively are referred to as Y-axis linear encoders 70E and 70F (refer to FIG. 8).

The measurement values of six linear encoders 70A to 70F are supplied to main controller 20, and main controller 20 controls the position within the XY plane of wafer table WTB based on the measurement values of linear encoders 70A to 70D, and also controls the rotation in the θz direction of CD bar 46 based on the measurement values of linear encoders 70E and 70F.

As is shown in FIG. 3, in exposure apparatus 100 of the embodiment, a multipoint focal position detecting system (hereinafter, shortly referred to as a "multipoint AF system") by an oblique incident method is arranged, which is composed of an irradiation system 90a and a photodetection system 90b, and has the configuration similar to the one disclosed in, for example, Kokai (Japanese Unexamined Patent Application Publication) No. 06-283403 (the corresponding U.S. Pat. No. 5,448,332) and the like. In the embodiment, as an example, irradiation system 90a is placed on the −Y side of the −X end portion of head unit 62C and photodetection system 90b is placed on the −Y side of the +X end portion of head unit 62A in a state of opposing irradiation system 90a.

A plurality of detection points of the multipoint AF system (90a, 90b) are placed at a predetermined distance along the X-axis direction on the surface to be detected. In the embodiment, the plurality of detection points are placed, for example, in the arrangement of a row matrix having one row and M columns (M is a total number of detection points) or having two rows and N columns (N is a half of a total number of detection points). In FIG. 3, the plurality of detection points to which a detection beam is severally irradiated are not individually shown, but are shown as an elongate detection area AF that extends in the X-axis direction between irradiation system 90a and photodetection system 90b. Since the length of detection area AF in the X-axis direction is set to around the same as the diameter of wafer W, position information (surface position information) in the Z-axis direction across the entire surface of wafer W can be measured by only scanning wafer W in the Y-axis direction once. Further, since detection area AF is placed between liquid immersion area 14 (exposure area IA) and the detection areas of the alignment systems ($AL1$, $AL2_1$, $AL2_2$, $AL2_3$ and $AL2_4$) in the Y-axis direction, the detection operations of the multipoint AF system and the alignment systems can be performed in parallel. The multipoint AF system may also be arranged on the main frame that holds projection unit PU or the like, but is to be arranged on the measurement frame described earlier in the embodiment.

Incidentally, the plurality of detection points are to be placed in one row and M columns, or two rows and N columns, but the number(s) of rows and/or columns is/are not limited to these numbers. However, in the case the number of rows is two or more, the positions in the X-axis direction of detection points are preferably made to be different even between the different rows. Moreover, the plurality of detection points are to be placed along the X-axis direction. However, the present invention is not limited to this, and all of or some of the plurality of detection points may also be placed at different positions in the Y-axis direction. For example, the plurality of detection points may also be placed along a direction that intersects both of the X-axis and the Y-axis. That is, the positions of the plurality of detection points only have to be different at least in the X-axis direction. Further, a detection beam is to be irradiated to the plurality of detection points in the embodiment, but a detection beam may also be irradiated to, for example, the entire area of detection area AF. Furthermore, the length of detection area AF in the X-axis direction does not have to be nearly the same as the diameter of wafer W.

In exposure apparatus 100 of the embodiment, in the vicinity of detection points located at both ends out of a plurality of detection points of the multipoint AF system, that is, in the vicinity of both end portions of detection area AF, one each pair of surface position sensors for Z position measurement (hereinafter, shortly referred to as "Z sensors"), that is, a pair of Z sensors 72a and 72b and a pair of Z sensors 72c and 72d are arranged in the symmetrical placement with respect to straight line LV. Z sensors 72a to 72d are fixed to the lower surface of a main frame (not shown). As Z sensors 72a to 72d, a sensor that irradiates a light to wafer table WTB from above, receives the reflected light and measures position information of the wafer table WTB surface in the Z-axis direction orthogonal to the XY plane, as an example, an optical displacement sensor (sensor by a CD pickup method), which has the configuration like an optical pickup used in a CD drive unit, is used. Incidentally, Z sensors 72a to 72d may also be arranged on the measurement frame described above or the like.

Moreover, head unit 62C is equipped with a plurality of (six each, twelve in total, in this case) Z sensors $74_{i,j}$ (i=1, 2, j=1, 2, . . . , 6) that are placed at a predetermined distance, along each of two straight lines that are located on one side and the other side having straight line LH in between in the X-axis direction that connects a plurality of Y heads 64 and are parallel to straight line LH. In this case, Z sensors $74_{1,j}$ and $74_{2,j}$ making a pair are placed symmetrically with respect to straight line LH. Furthermore, plural pairs (six pairs, in this case) of Z sensors $74_{1,j}$ and $74_{2,j}$ and a plurality of Y heads 64 are placed alternately in the X-axis direction. As each Z sensor $74_{1,j}$, for example, a sensor by a CD pickup method similar to Z sensors 72a to 72d is used.

Herein, a distance between each pair of Z sensors $74_{1,j}$ and $74_{2,j}$ that are located symmetrically with respect to straight line LH is set to be the same distance as a distance between Z sensors 74c and 74d. Further, a pair of Z sensors $74_{1,4}$ and $74_{2,4}$ are located on the same straight line parallel to the Y-axis direction as Z sensors 72a and 72b.

Further, head unit 62A is equipped with a plurality of (twelve in this case) Z sensors $76_{p,q}$ (p=1, 2 and q=1, 2, . . . , 6) that are placed symmetrically to a plurality of Z sensors $74_{i,j}$ with respect to straight line LV. As each Z sensor $76_{p,q}$, a sensor by a CD pickup method similar to Z sensors 72a to 72d is used, for example. Further, a pair of Z sensors $76_{1,3}$ and $76_{2,3}$ are located on the same straight line in the Y-axis direction as Z sensors 72c and 72d.

Incidentally, in FIG. 3, measurement stage MST is omitted and a liquid immersion area that is formed by water Lq held in the space between measurement stage MST and tip lens 191 is shown by a reference code 14. Further, in FIG. 3, a reference code 78 indicates a local air-conditioning system that blows dry air whose temperature is adjusted to a predetermined temperature to the vicinity of a beam path of the multipoint AF system (90a, 90b) by, for example, downflow as is indicated by outline arrows in FIG. 3. Further, a reference code UP indicates an unloading position where a wafer on wafer table WTB is unloaded, and a reference code LP indicates a loading position where a wafer is loaded on wafer table WTB. In the embodiment, unloading position UP and loading position LP are set symmetrically with respect to straight line LV. Incidentally, unloading position UP and loading position LP may be the same position.

FIG. 8 shows the main configuration of the control system of exposure apparatus 100. The control system is mainly configured of main controller 20 composed of a microcomputer (or workstation) that performs overall control of the entire apparatus. Incidentally, in FIG. 8, various sensors such as irregular illuminance sensor 94, aerial image measuring instrument 96 and wavefront aberration measuring instrument 98 that are arranged at measurement stage MST are collectively shown as a sensor group 99.

Figure 9A:
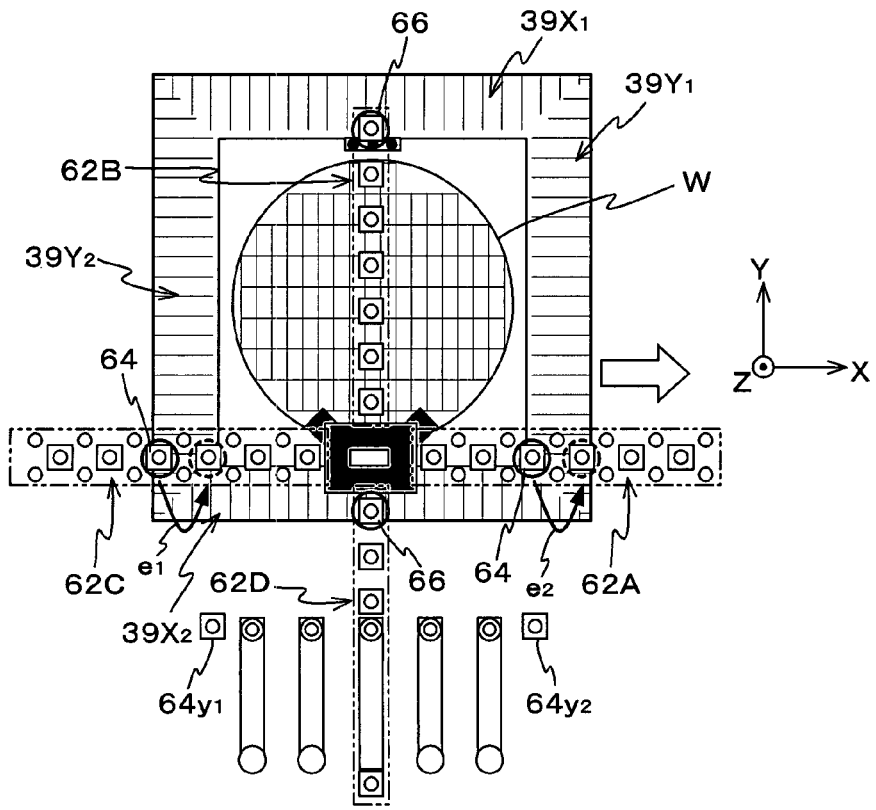
FIGS. 9A and 9B are views used to explain position measurement within an XY plane of a wafer table by a plurality of encoders each including a plurality of heads placed in the array arrangement, and the transfer of measurement values between the heads.
Figure 9B:
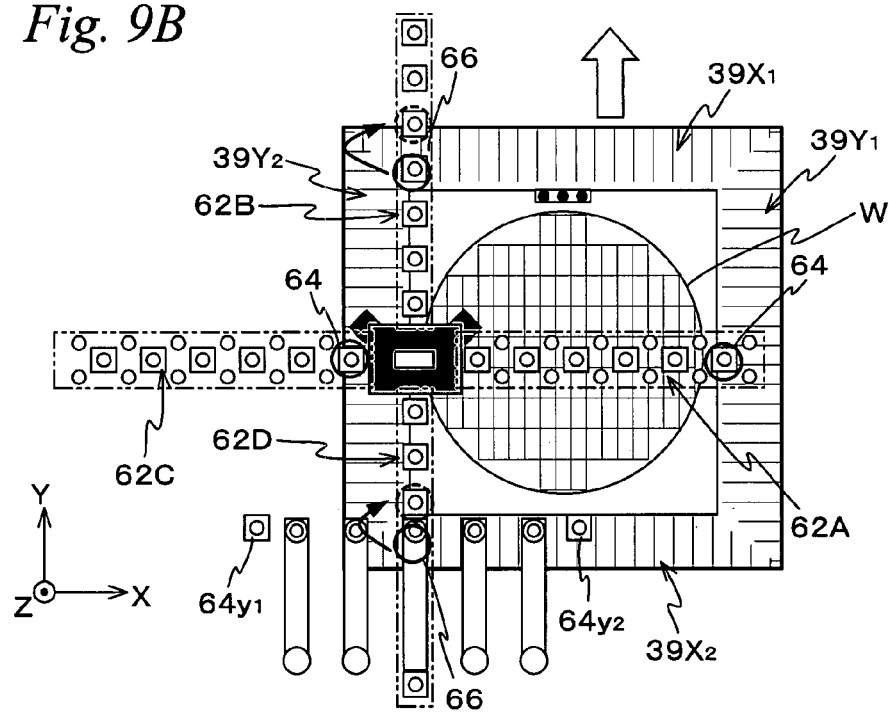

In exposure apparatus 100 of the embodiment having the configuration described above, since the placement of X scales and Y scales on wafer table WTB as described above and the placement of X heads and Y heads as described above are employed, X scales $39X_1$ and $39X_2$ and head units 62B and 62D (X heads 66) respectively face each other, and Y scales $39Y_1$ and $39Y_2$ and head units 62A and 62C (Y heads 64) or Y heads $64y_1$ and $64y_2$ respectively face each other without fail in an effective stroke range of wafer stage WST (i.e. a range in which wafer stage WST moves for the alignment and the exposure operation, in the embodiment), as is exemplified in the drawings such as FIGS. 9A and 9B. Incidentally, in FIGS. 9A and 9B, the heads that face the corresponding X scales or Y scales are indicated by being circled.

Therefore, in the effective stroke range of wafer stage WST described above, main controller 20 can control position information (including rotation information in the θz direction) within the XY plane of wafer stage WST with high precision by controlling each motor constituting stage drive system 124, based on at least three measurement values of encoders 70A to 70D. Since the influence of air fluctuations that the measurement values of encoders 70A to 70D receive is small enough to be ignored when comparing with the interferometer, the short-term stability of the measurement values that is affected by air fluctuations is remarkably better than that of the interferometer. Incidentally, in the embodiment, the sizes (e.g. the number of heads and/or the distance between the heads) of head units 62B, 62D, 62A and 62C are set in accordance with the effective stork range of wafer stage WST and the sizes (i.e. the formation range of diffraction gratings) of the scales. Accordingly, in the effective stroke range of wafer stage WST, all of four scales $39X_1$, $39X_2$, $39Y_1$ and $39Y_2$ face head units 62B, 62D, 62A and 62C respectively, but all the four scales do not have to face the corresponding head units. For example, one of X scales $39X_1$ and $39X_2$ and/or one of Y scales $39Y_1$ and $39Y_2$ does/do not have to face the head unit. In the case one of X scales $39X_1$ and $39X_2$ or one of Y scales $39Y_1$ and $39Y_2$ does not face the head unit, three scales face the head units in the effective stroke range of wafer stage WST, and therefore, position information of wafer stage WST in the X-axis, Y-axis and θz directions can constantly be measured. Further, in the case one of X scales $39X_1$ and $39X_2$ and one of Y scales $39Y_1$ and $39Y_2$ do not face the head units, two scales face the head units in the effective stroke range of wafer stage WST, and therefore, position information of wafer stage WST in the θz direction cannot constantly be measured, but position information in the X-axis and Y-axis directions can constantly be measured. In this case, position control of wafer stage WST may also be performed using position information in the θz direction of wafer stage WST measured by interferometer system 118 in combination.

Further, when wafer stage WST is driven in the X-axis direction as indicated by an outline arrow in FIG. 9A, Y head 64 that measures the position in the Y-axis direction of wafer stage WST is sequentially switched to adjacent Y head 64 as indicated by arrows $e_1$ and $e_2$ in the drawing. For example, Y head 64 circled by a solid line is switched to Y head 64 circled by a dotted line. Therefore, the measurement values are transferred before and after the switching. In other words, in the embodiment, in order to perform the switching of Y heads 64 and the transfer of the measurement values smoothly, a distance between adjacent Y heads 64 that are equipped in head units 62A and 62C is set narrower than a width of Y scales 39Y$_1$ and 39Y$_2$ in the X-axis direction, as is described previously.

Further, in the embodiment, since a distance between adjacent X heads 66 that are equipped in head units 62B and 62D is set narrower than a width of X scales 39X$_1$ and 39X$_2$ in the Y-axis direction as is described previously, when wafer stage WST is driven in the Y-axis direction as indicated by an outline arrow in FIG. 9B, X head 66 that measures the position in the X-axis direction of wafer stage WST is sequentially switched to adjacent X head 66 (e.g. X head 66 circled by a solid line is switched to X head 66 circled by a dotted line), and the measurement values are transferred before and after the switching.

Figure 10A:
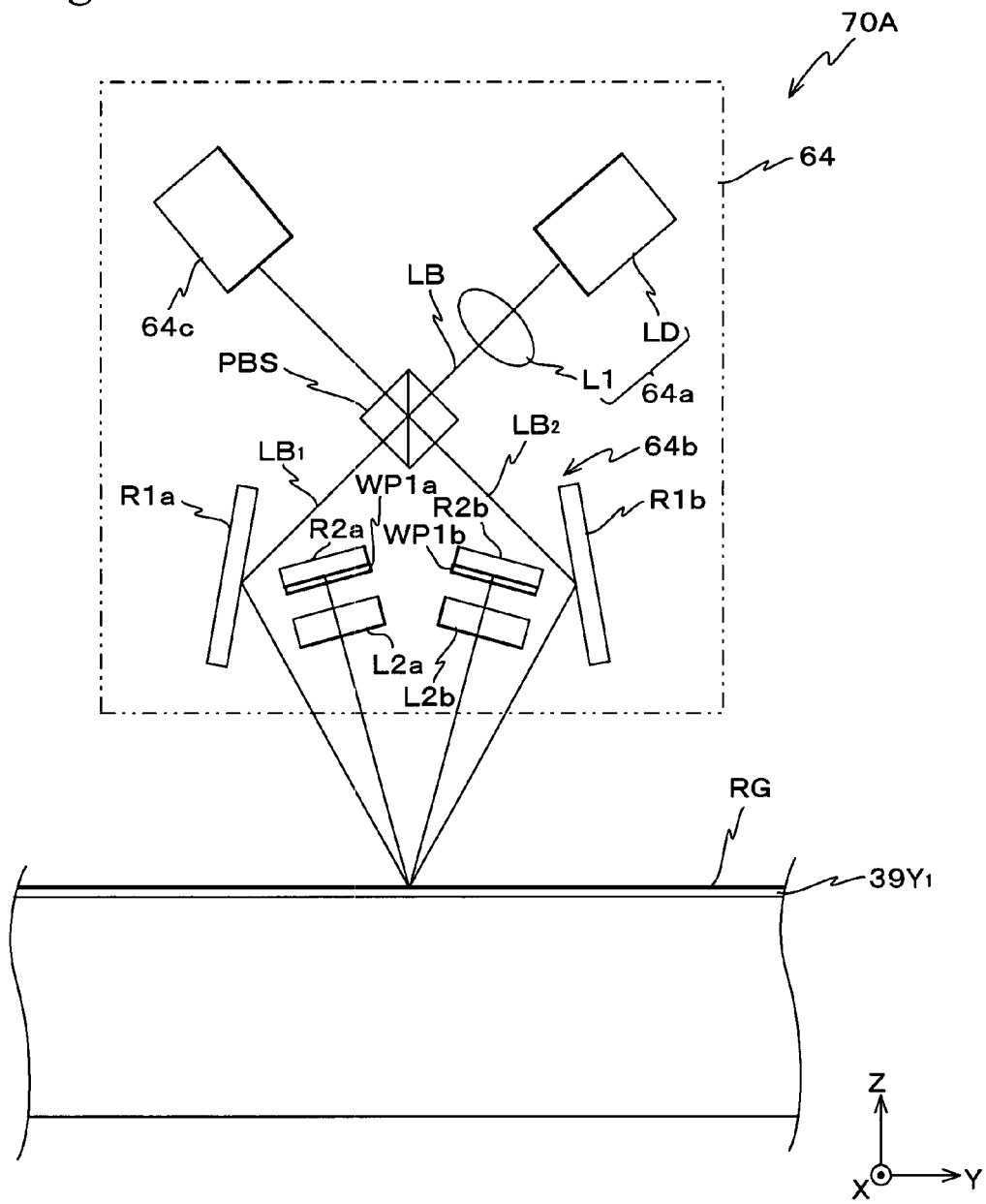
FIG. 10A is a view showing an example of a configuration of the encoder.

Next, the configuration of encoders 70A to 70F will be described, focusing on Y encoder 70A that is enlargedly shown in FIG. 10A, as a representative. FIG. 10A shows one Y head 64 of head unit 62A that irradiates a detection light (measurement beam) to Y scale 39Y$_1$.

Y head 64 is mainly composed of three sections, which are an irradiation system 64a, an optical system 64b and a photodetection system 64c.

Irradiation system 64a includes a light source that emits a laser beam LB in a direction inclined at an angel of 45 degrees with respect to the Y-axis and Z-axis, for example, a semiconductor laser LD, and a lens L1 that is placed on the optical path of laser beam LB emitted from semiconductor laser LD.

Optical system 64b is equipped with a polarization beam splitter PBS whose separation plane is parallel to an XZ plane, a pair of reflection mirrors R1a and R1b, lenses L2a and L2b, quarter wavelength plates (hereinafter, referred to as a λ/4 plate) WP1a and WP1b, refection mirrors R2a and R2b, and the like.

Photodetection system 64c includes a polarizer (analyzer), a photodetector, and the like.

In Y encoder 70A, laser beam LB emitted from semiconductor laser LD is incident on polarization beam splitter PBS via lens L1, and is split by polarization into two beams LB$_1$ and LB$_2$. Beam LB$_1$ having been transmitted through polarization beam splitter PBS reaches reflective diffraction grating RG that is formed on Y scale 39Y$_1$, via reflection mirror R1a, and beam LB$_2$ reflected off polarization beam splitter PBS reaches reflective diffraction grating RG via reflection mirror R1b. Incidentally, "split by polarization" in this case means the splitting of an incident beam into a P-polarization component and an S-polarization component.

Predetermined-order diffraction beams that are generated from diffraction grating RG due to irradiation of beams LB$_1$ and LB$_2$, for example, the first-order diffraction beams are severally converted into a circular polarized light by λ/4 plates WP1b and WP1a via lenses L2b and L2a, and reflected by reflection mirrors R2b and R2a and then the beams pass through λ/4 plates WP1b and WP1a again and reach polarization beam splitter PBS by tracing the same optical path in the reversed direction.

Each of the polarization directions of the two beams that have reached polarization beam splitter PBS is rotated at an angle of 90 degrees with respect to the original direction. Therefore, the first-order diffraction beam of beam LB$_1$ that was previously transmitted through polarization beam splitter PBS is reflected off polarization beam splitter PBS and is incident on photodetection system 64c, and also the first-order diffraction beam of beam LB$_2$ that was previously reflected off polarization beam splitter PBS is transmitted through polarization beam splitter PBS and is synthesized concentrically with the first-order diffraction beam of beam LB$_1$ and is incident on photodetection system 64c.

Then, the polarization directions of the two first-order diffraction beams described above are uniformly arranged by the analyzer inside photodetection system 64c and the beams interfere with each other to be an interference light, and the interference light is detected by the photodetector and is converted into an electric signal in accordance with the intensity of the interference light.

Figure 10B:
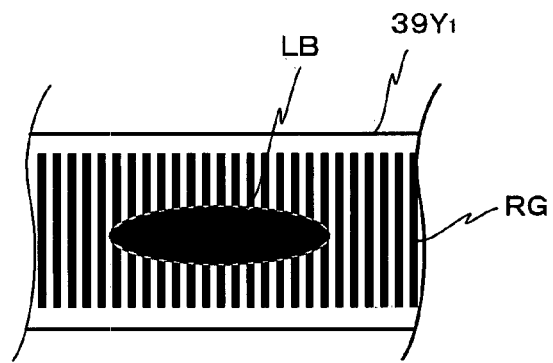
FIG. 10B is a view showing the case where a laser beam LB having a sectional shape that is elongated in a periodic direction of a grating RG is used as a detection light.

As is obvious from the above description, in Y encoder 70A, since the optical path lengths of two beams to be interfered are extremely short and also are almost equal to each other, the influence by air fluctuations can mostly be ignored. Then, when Y scale 39Y$_1$ (i.e. wafer stage WST) moves in the measurement direction (the Y-axis direction, in this case), the phase of each of the two beams changes and thus the intensity of the interference light changes. This change in the intensity of the interference light is detected by photodetection system 64c, and position information in accordance with the intensity change is output as the measurement value of Y encoder 70A. Other encoders 70B, 70C, 70D and the like are also configured similar to encoder 70A. As each encoder, an encoder having a resolution of, for example, around 0.1 nm is used. Incidentally, in the encoders of the embodiment, as is shown in FIG. 10B, laser beam LB having a sectional shape that is elongated in the periodic direction of grating RG may also be used, as a detection light. In FIG. 10B, beam LB is enlargedly shown exaggeratedly compared with grating RG.

In the meantime, the scales of the encoder lack the long-term mechanical stability, because the diffraction grating is deformed due to thermal expansion or other reasons, the pitch of the diffraction grating partially or entirely changes, or the like along with lapse of operating time. Therefore, since the errors included in the measurement values become larger along with lapse of operating time, the errors need to be corrected. In the following description, grating pitch correction and grating deformation correction of scales that are performed in exposure apparatus 100 of the embodiment will be described referring to FIG. 11.

Figure 11:
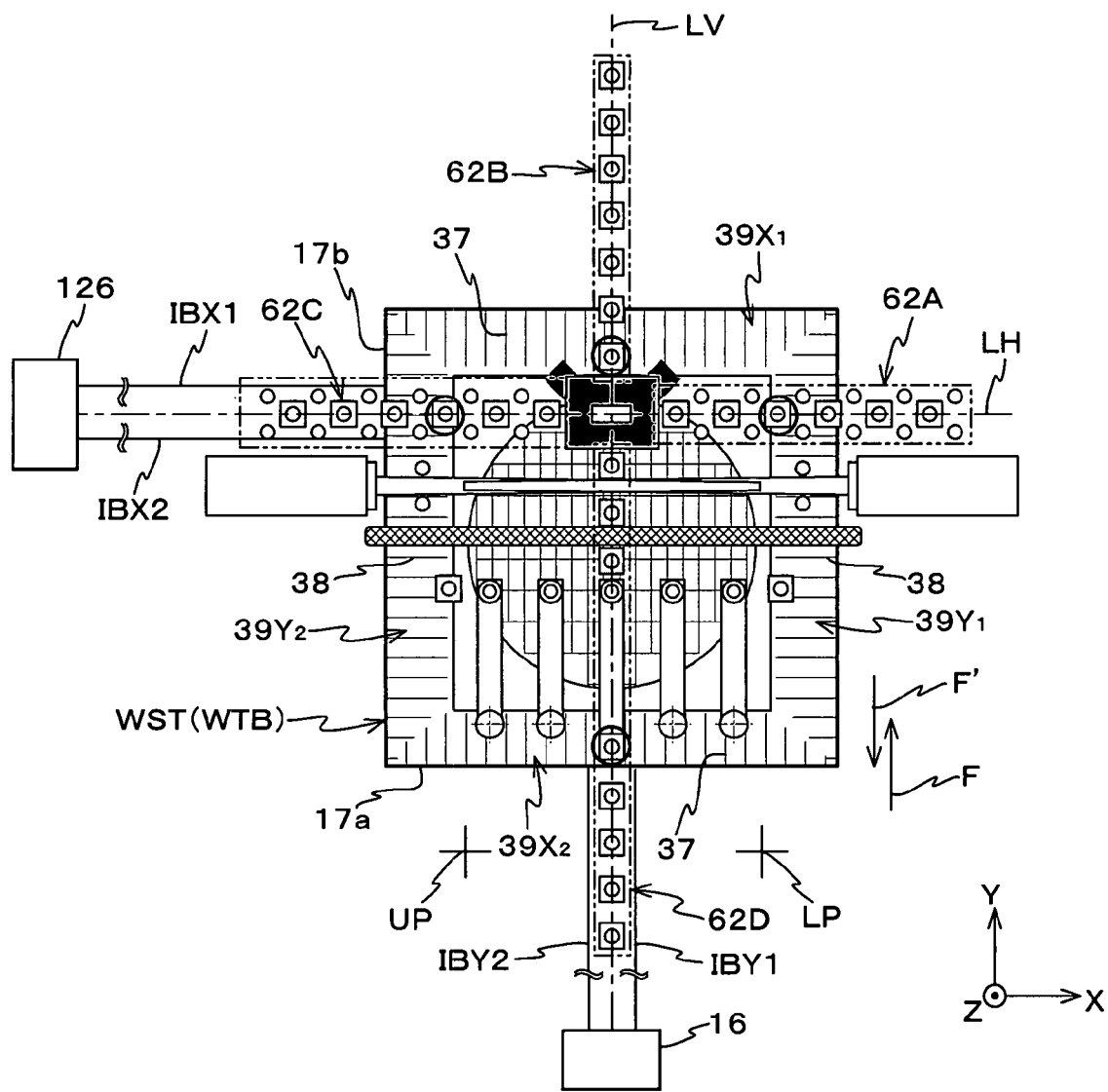
FIG. 11 is a view used to explain grating pitch correction and grating deformation correction of scales performed in the exposure apparatus related to an embodiment.

In FIG. 11, reference codes IBY1 and IBY2 indicate measurement beams of two optical axes out of multiple axes that are irradiated to refection surface 17a of wafer table WTB from Y-axis interferometer 16, and reference codes IBX1 and IBX2 indicate measurement beams of two optical axes out of multiple axes that are irradiated to refection surface 17b of wafer table WTB from X-axis interferometer 126. In this case, measurement beams IBY1 and IBY2 are placed symmetrically with respect to straight line LV (which coincides with a straight line connecting the centers of a plurality of X heads 66), and the substantial measurement axes of Y-axis interferometer 16 coincide with straight line LV. Therefore, Y-axis interferometer 16 can measure the Y-position of wafer table WTB without Abbe errors. Similarly, measurement beams IBX1 and IBX2 are placed symmetrically with respect to straight line LH (which coincides with a straight line connecting the centers of a plurality of Y heads 64) that passes through the optical axis of projection optical system PL and is parallel to the X-axis, and the substantial measurement axes of X-axis interferometer 126 coincide with straight line LH parallel to the X-axis that passes through the optical axis of projection optical system PL. Therefore, X-axis interferometer 126 can measure the X-position of wafer table WTB without Abbe errors.

First, deformation of grating lines (warp of grating lines) of the X scales and correction of pitch of grating lines of the Y scales will be described. Herein, reflection surface 17b is assumed to be an ideal plane, for the sake of simplification of the description.

First of all, main controller 20 drives wafer stage WST based on the measurement values of Y-axis interferometer 16 and X-axis interferometer 126, and as is shown in FIG. 11, the position of wafer stage WST is set at a position with which Y scales $39Y_1$ and $39Y_2$ are placed just below corresponding head units 62A and 62C (at least one head) respectively, and also one ends on the +Y side of Y scales $39Y_1$ and $39Y_2$ (diffraction gratings) coincide with corresponding head units 62A and 62C respectively.

Next, main controller 20 moves wafer stage WST in the +Y direction as is indicated by an arrow F in FIG. 11 at a low speed at a level in which short-term fluctuation of the measurement value of Y-axis interferometer 16 can be ignored and with the measurement value of X-axis interferometer 126 being fixed to a predetermined value, while maintaining all of the pitching amount, the rolling amount and the yawing amount to zero based on the measurement values of Y-axis interferometer 16 and Z sensors $74_{1,4}$, $74_{2,4}$, $76_{1,3}$ and $76_{2,3}$, until, for example, the other ends (the ends on the −Y side) of Y scales $39Y_1$ and $39Y_2$ coincide with corresponding head units 62A and 62C respectively (in the effective stroke range described above). During the movement, main controller 20 loads the measurement values of Y linear encoders 70A and 70C and the measurement values of Y-axis interferometer 16 (the measurement values by measurement beams IBY1 and IBY2) at predetermined sampling intervals, and obtains a relation between the measurement values of Y linear encoders 70A and 70C and the measurement values of Y-axis interferometer 16 based on the loaded measurement values. That is, main controller 20 obtains a grating pitch (a distance between adjacent grating lines) of Y scales $39Y_1$ and $39Y_2$ that are sequentially placed facing head units 62A and 62C according to the movement of wafer stage WST and correction information on the grating pitch. The correction information can be obtained, for example, as a correction map that shows a relation between both measurement values in a curved line in the case a horizontal axis indicates the measurement value of the interferometer and a vertical axis indicates the measurement values of the encoders, or the like. The measurement values of Y-axis interferometer 16 in this case are obtained when scanning wafer stage WST at the extremely low speed described above, and therefore, it can be thought that the measurement values are accurate values in which error can be ignored, because not only a long-term fluctuation error but also a short-term fluctuation error caused by air fluctuations or the like are hardly included in the measurement values. Incidentally, a grating pitch (a distance between adjacent grating lines) of Y scales $39Y_1$ and $39Y_2$ and correction information on the grating pitch may also be obtained in the procedures similar to the above, by moving wafer stage WST in the −Y direction within the range described above as is indicated by an arrow F' in FIG. 11. Herein, wafer stage WST is to be driven in the Y-axis direction across the range where both ends of Y scales $39Y_1$ and $39Y_2$ traverse corresponding head units 62A and 62C. However, the drive range is not limited to this, and wafer stage WST may also be driven, for example, in the range in the Y-axis direction in which wafer stage WST is moved at the time of exposure operation of a wafer.

Further, main controller 20 also obtains correction information on deformation (warp) of grating lines 37 that have sequentially faced a plurality of X heads 66 by performing a predetermined statistical computation, using the measurement values obtained from the plurality of X heads 66 of head units 62B and 62D that are sequentially placed facing X scales $39X_1$ and $39X_2$ according to the movement of wafer stage WST during the movement and the measurement value of interferometer 16 corresponding to each of the measurement values. On the computation, main controller 20 computes, for example, the measurement values (or arithmetic weighted mean) of the plurality of heads of head units 62B and 62D that are sequentially placed facing X scales $39X_1$ and $39X_2$ and the like, as the correction information on grating warp. This is because the same variation pattern should repeatedly appear in the process where wafer stage WST is moved in the +Y direction or the −Y direction in the case reflection surface 17b is an ideal plane, and therefore, correction information on deformation (warp) of grating lines 37 that have sequentially faced the plurality of X heads 66 can be accurately obtained by averaging the measurement data obtained by the plurality of X heads 66, or the like.

Incidentally, in the case reflection surface 17b is not an ideal plane, the unevenness (bending) of the reflection surface is measured and correction data of the bending is obtained in advance. Then, on the movement of wafer stage WST in the +Y direction or the −Y direction described above, wafer stage WST may accurately be moved in the Y-axis direction by controlling the X-position of wafer stage WST based on the correction data instead of fixing the measurement value of X-axis interferometer 126 to a predetermined value. Thus, correction information on grating pitch of the Y-scales and correction information on deformation (warp) of grating lines 37 can be obtained in the same manner as described above. Incidentally, measurement data obtained by a plurality of X heads 66 is data in plural on the basis of different areas on reflection surface 17b, and the heads each measure deformation (warp) of the same grating line, and therefore, there is an incidental effect that the residual error after warp correction of the reflection surface is averaged to be approximate to the true value by the averaging described above and the like (in other words, the influence of the warp residual error can be reduced by averaging the measurement data (warp information on grating lines) obtained by the plurality of heads).

Next, deformation of grating lines (warp of grating lines) of the Y scales and correction of pitch of grating lines of the X scales will be described. Herein, reflection surface 17a is assumed to be an ideal plane, for the sake of simplification of the description. In this case, the processing that needs to be performed is the correction described above with the X-axis direction and Y-axis direction interchanged.

That is, first of all, main controller 20 drives wafer stage WST, and sets the position of wafer stage WST at a position with which X scales $39X_1$ and $39X_2$ are placed just below corresponding head units 62B and 62D (at least one head) respectively, and also one ends on the +X side (or −X side) of X scales $39X_1$ and $39X_2$ (diffraction gratings) coincide with corresponding head unit 62B and 62D respectively. Next, main controller 20 moves wafer stage WST in the +X direction (or −X direction) at a low speed at a level in which short-term fluctuation of the measurement value of X-axis interferometer 126 can be ignored and with the measurement value of Y-axis interferometer 16 being fixed to a predetermined value, while maintaining all of the pitching amount, the rolling amount and the yawing amount to zero based on the measurement values of X-axis interferometer 126 and the like, until, for example, the other ends (the ends on the −X side (or +X side)) of X scales $39X_1$ and $39X_2$ coincide with corresponding head unit 62B and 62D respectively (in the effective stroke range described above). During the movement, main controller 20 loads the measurement values of X linear encoders 70B and 70D and the measurement values of X-axis interferometer 126 (the measurement values by measurement beams IBX1 and IBX2) at predetermined sampling intervals and may obtain a relation between the measurement values of X linear encoders 70B and 70D and the measurement values of X-axis interferometer 126 based on the loaded measurement values. That is, main controller 20 obtains a grating pitch of X scales $39X_1$ and $39X_2$ that are sequentially placed facing head units 62B and 62D according to the movement of wafer stage WST and correction information on the grating pitch. The correction information can be obtained, for example, as a map that shows a relation between both measurement values in a curved line in the case a horizontal axis indicates the measurement value of the interferometer and a vertical axis indicates the measurement values of the encoders, or the like. The measurement values of X-axis interferometer 126 in this case are obtained when scanning wafer stage WST at the extremely low speed described above, and therefore, it can be thought that the measurement values are accurate values in which error can be ignored, because not only a long-term fluctuation error but also a short-term fluctuation error caused by air fluctuations are hardly included in the measurement values.

Further, main controller 20 also obtains correction information on deformation (warp) of grating lines 38 that have sequentially faced a plurality of Y heads 64 by performing a predetermined statistical computation, using the measurement values obtained from the plurality of Y heads 64 of head units 62A and 62C that are sequentially placed facing Y scales $39Y_1$ and $39Y_2$ according to the movement of wafer stage WST during the movement and the measurement value of interferometer 126 corresponding to each of the measurement values. On the computation, main controller 20 computes, for example, the measurement values (or arithmetic weighted mean) of the plurality of heads of head units 62A and 62C that are sequentially placed facing Y scales $39Y_1$ and $39Y_2$ and the like, as the correction information on grating warp. This is because the same variation pattern should repeatedly appear in the process where wafer stage WST is moved in the +X direction or the −X direction in the case reflection surface 17a is an ideal plane, and therefore, correction information on deformation (warp) of grating lines 38 that have sequentially faced the plurality of Y heads 64 can be accurately obtained by averaging the measurement data obtained by the plurality of Y heads 64, or the like.

Incidentally, in the case where reflection surface 17a is not an ideal plane, the unevenness (bending) of the reflection surface is measured and correction data of the bending is obtained in advance. Then, on the movement of wafer stage WST in the +X direction or the −X direction described above, wafer stage WST may accurately be moved in the X-axis direction by controlling the Y-position of wafer stage WST based on the correction data instead of fixing the measurement value of Y-axis interferometer 16 to a predetermined value. Thus, correction information on grating pitch of the X-scales and correction information on deformation (warp) of grating lines 38 can be obtained in the same manner as described above.

As is described above, main controller 20 obtains correction information on grating pitch of the Y scales and correction information on deformation (warp) of grating lines 37, and correction information on grating pitch of the X scales and correction information on deformation (warp) of grating lines 38 at each predetermined timing, for example, with respect to each lot, or the like.

Then, during the exposure processing of wafers in a lot or the like, while correcting the measurement values obtained from head units 62A and 62C (i.e. the measurement values of encoders 70A and 70C) based on the correction information on grating pitch of the Y scales and the correction information on deformation (warp) of grating lines 38, main controller 20 performs position control of wafer stage WST in the Y-axis direction. Thus, it becomes possible to perform position control of wafer stage WST in the Y-axis direction with good accuracy using Y linear encoders 70A and 70C without being affected by change over time in grating pitch of the Y scales and warp of grating lines 38.

Further, during the exposure processing of wafers in a lot or the like, while correcting the measurement values obtained from head units 62B and 62D (i.e. the measurement values of encoders 70B and 70D) based on the correction information on grating pitch of the X scales and the correction information on deformation (warp) of grating lines 37, main controller 20 performs position control of wafer stage WST in the X-axis direction. Thus, it becomes possible to perform position control of wafer stage WST in the X-axis direction with good accuracy using X linear encoders 70B and 70D without being affected by change over time in grating pitch of the X scales and warp of grating lines 37.

Incidentally, in the description above, correction information on grating pitch and grating line warp is to be obtained for all of Y scales $39Y_1$ and $39Y_2$ and X scales $39X_1$ and $39X_2$. However, the present invention is not limited to this, and correction information on grating pitch and grating line warp may be obtained for either one of Y scales $39Y_1$ and $39Y_2$ or X scales $39X_1$ and $39X_2$, or the correction information on either one of grating pitch or grating line warp may be obtained for both of Y scales $39Y_1$ and $39Y_2$ and X scales $39X_1$ and $39X_2$. For example, in the case only correction information on grating line warp is obtained, wafer stage WST may be moved in the Y-axis direction based on the measurement values of Y linear encoders 70A and 70C without using Y-axis interferometer 16, or wafer stage WST may be moved in the X-axis direction based on the measurement values of X linear encoders 70B and 70D without using X-axis interferometer 126.

Figure 12A:
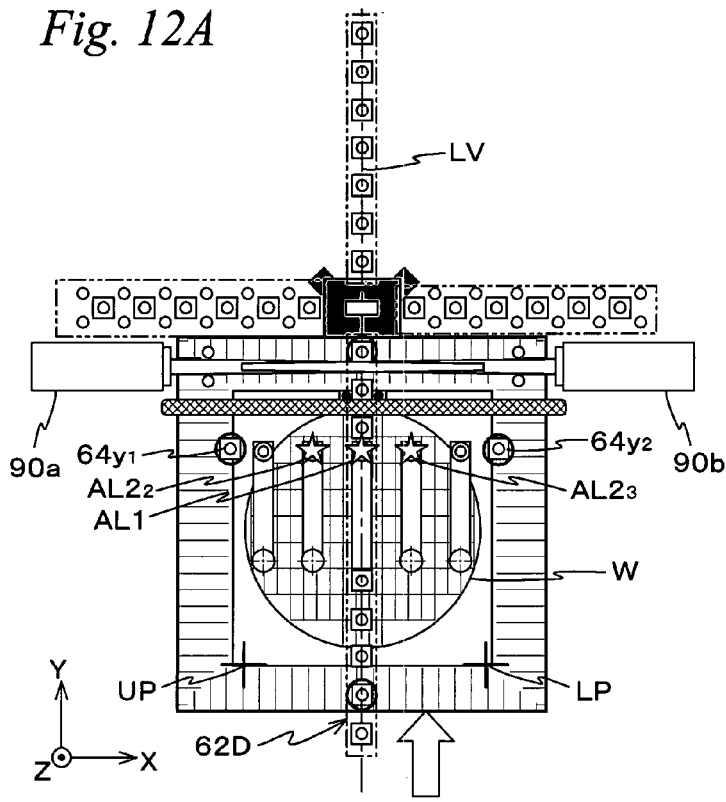
FIGS. 12A to 12C are views used to explain wafer alignment performed in the exposure apparatus related to an embodiment.
Figure 12B:
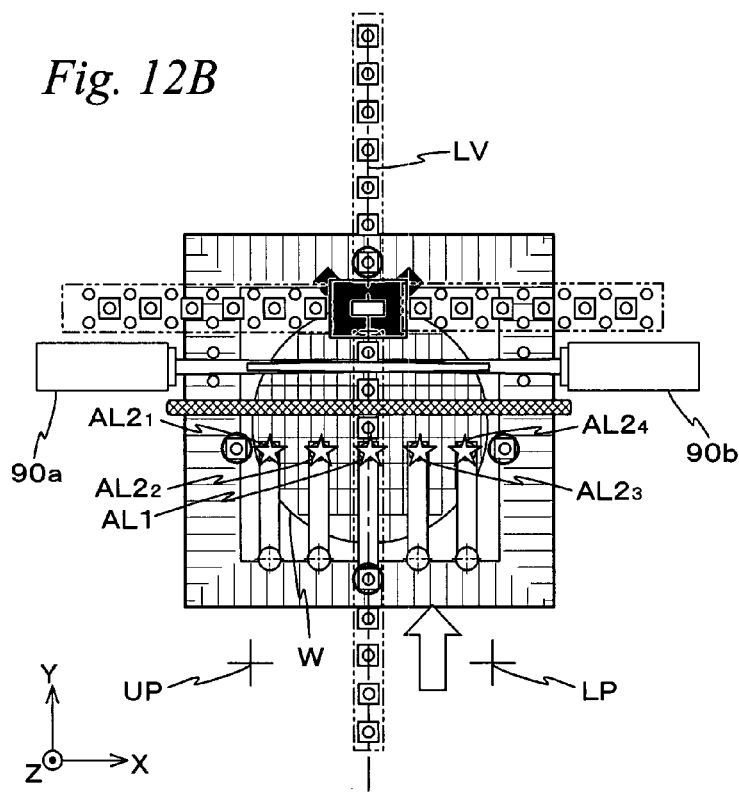
Figure 12C:
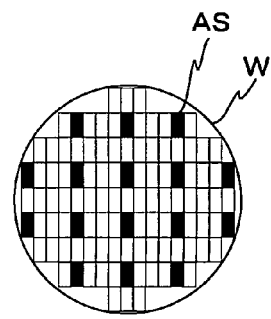

Next, wafer alignment performed in exposure apparatus 100 of the embodiment will be briefly described using FIGS. 12A to 12C. Incidentally, the details will be described later.

Herein, the operation in the case where 16 of colored shot areas AS, on wafer W on which a plurality of shot areas are formed in the layout (shot map) shown in FIG. 12C, are to serve as alignment shot areas will be described. Incidentally, measurement stage MST is omitted in FIGS. 12A and 12B.

It is assumed that position adjustment in the X-axis direction of secondary alignment systems $AL2_1$ to $AL2_4$ has been performed beforehand in accordance with the placement of alignment shot areas AS. Incidentally, a specific method of the position adjustment of secondary alignment systems $AL2_1$ to $AL2_4$ will be described later.

First, main controller 20 moves wafer stages WST, on which the position of the wafer W center is set at loading position LP, toward an obliquely upper left direction in FIG. 12A, and sets the position of wafer stage WST at a predetermined position (alignment starting position to be described later) at which the center of wafer W is located on straight line LV. The movement of wafer stage WST in this case is performed by main controller 20 driving each motor of stage drive system 124 based on the measurement value of X encoder 70D and the measurement value of Y-axis interferometer 16. In a state where the position of wafer stage WST is set at the alignment starting position, control of the position (including the θz rotation) within the XY plane of wafer table WTB on which wafer W is mounted is performed based on the measurement values of two X heads 66 that are equipped in head unit 62D and face X scales $39X_1$ and $39X_2$ respectively, and Y heads $64y_2$ and $64y_1$ that face Y scale $39Y_1$ ad $39Y_2$ respectively (four encoders).

Next, main controller 20 moves wafer stage WST in the +Y direction by a predetermined distance based on the measurement values of the four encoders, and sets the position of wafer stage WST at the position shown in FIG. 12A. And, main controller 20 almost simultaneously and individually detects alignment marks (refer to star-shaped marks in FIG. 12A) arranged in the three first alignment shots areas AS using primary alignment system AL1 and secondary alignment systems $AL2_2$ and $AL2_3$, and links the detection results of the above three alignment systems AL1, $AL2_2$ and $AL2_3$ and the measurement values of the four encoders described above at the time of the detection and stores them in a memory (not shown). Incidentally, secondary alignment systems $AL2_1$ and $AL2_4$ on both sides that do not detect the alignment marks at this point in time may be made not to irradiate a detection light to wafer table WTB (or a wafer), or may be made to irradiate a detection light. Further, in the wafer alignment in the embodiment, the position of wafer stage WST in the X-axis direction is set so that primary alignment system AL1 is placed on the centerline of wafer table WTB, and primary alignment system AL1 detects the alignment mark in the alignment shot area that is located on a meridian of the wafer. Incidentally, the alignment mark may also be formed inside each shot area on wafer W, but in the embodiment the alignment mark is to be formed outside each shot area, that is, on a street line (scribe line) that divides multiple shot areas on wafer W.

Next, main controller 20 moves wafer stage WST in the +Y direction by a predetermined distance based on the measurement values of the four encoders, and sets the position of wafer stage WST at a position at which five alignment systems AL1 and $AL2_1$ to $AL2_4$ can almost simultaneously and individually detect the alignment marks arranged in the five second alignment shot areas AS on wafer W, and almost simultaneously and individually detects the five alignment marks using five alignment systems AL1 and $AL2_1$ to $AL2_4$, and then links the detection results of five alignment systems AL1 and $AL2_1$ to $AL2_4$ and the measurement values of the four encoders at the time of the detection and stores them in a memory (not shown).

Next, main controller 20 moves wafer stage WST in the +Y direction by a predetermined distance based on the measurement values of the four encoders, and sets the position of wafer stage WST at a position at which five alignment systems AL1 and $AL2_1$ to $AL2_4$ can almost simultaneously and individually detect the alignment marks arranged in the five third alignment shot areas AS on wafer W, and almost simultaneously and individually detects the five alignment marks (refer to star-shaped marks in FIG. 12B) using five alignment systems AL1 and $AL2_1$ to $AL2_4$, and then links the detection results of five alignment systems AL1 and $AL2_1$ to $AL2_4$ and the measurement values of the four encoders at the time of the detection and stores them in a memory (not shown).

Next, main controller 20 moves wafer stage WST in the +Y direction by a predetermined distance based on the measurement values of the four encoders, and sets the position of wafer stage WST at a position at which the alignment marks arranged in the three fourth alignment shot areas AS on wafer W can be almost simultaneously and individually detected using primary alignment system AL1 and secondary alignment systems $AL2_2$ and $AL2_3$, and almost simultaneously and individually detects the three alignment marks using three alignment systems AL1, $AL2_2$ and $AL2_3$, and then links the detection results of three alignment systems AL1, $AL2_2$ and $AL2_3$ and the measurement values of the four encoders at the time of the detection and stores them in a memory (not shown).

Then, main controller 20 computes an array of all the shot areas on wafer W on a coordinate system (e.g. an XY coordinate system using the optical axis of projection optical system PL as its origin) that is set by the measurement axes of the four encoders (four head units), by performing a statistical computation by the EGA method, which is disclosed in, for example, Kokai (Japanese Unexamined Patent Application Publication) No. 61-044429 (the corresponding U.S. Pat. No. 4,780,617) and the like, using the detection results of a total of 16 alignment marks and the corresponding measurement values of the four encoders obtained in the manner described above, and the baseline of secondary alignment system $AL2_n$.

As is described above, in the embodiment, by moving wafer stage WST in the +Y direction and setting the position of wafer stage WST at four points on the moving route, position information of alignment marks in the alignment shot areas AS at 16 points in total can be obtained in a remarkably shorter period of time, compared with the case where a single alignment system sequentially detects alignment marks at 16 points. In this case, for example, as it is easier to understand in particular when considering alignment systems AL1, $AL2_2$ and $AL2_3$, each of alignment systems AL1, $AL2_2$ and $AL2_3$ detects a plurality of alignment marks arrayed along the Y-axis direction that are sequentially placed within the detection area (e.g. corresponding to the irradiation area of the detection light), associated with the operation of moving wafer stage WST described above. Therefore, on the foregoing measurement of the alignment marks, it is not necessary to move wafer stage WST in the X-axis direction.

Further, in this case, the number of detection points (the number of measurement points) of alignment marks on wafer W that are almost simultaneously detected by a plurality of alignment systems differs depending on the position within the XY plane of wafer stage WST (the Y-position in particular (i.e. the access degree of wafer W to a plurality of alignment systems). Therefore, when moving wafer stage WST in the Y-axis direction that is orthogonal to the array direction (X-axis direction) of a plurality of alignment systems, the marks at positions different from one another on wafer W can be detected simultaneously using the required number of alignment systems, in accordance with the position of wafer stage WST, in other words, in accordance with the shot array on wafer W.

Meanwhile, the surface of wafer W is not an ideal plane and normally has some unevenness. Accordingly, in the case the simultaneous measurement by a plurality of alignment systems described above is performed only at a certain position in the Z-axis direction (direction parallel to optical axis AX of projection optical system PL) of wafer table WTB, it is highly probable that at least one alignment system performs detection of an alignment mark in a defocused state. Thus, in the embodiment, measurement error of positions of alignment marks, which is caused by detection of alignment marks performed in a defocused state, is suppressed in the manner described below.

That is, main controller 20 controls stage drive system 124 (Z-leveling mechanism (not shown)) and a plurality of alignment systems AL1 and $AL2_1$ to $AL2_4$ so that each of alignment marks formed at the positions that are different from one another on wafer W is almost simultaneously detected by each alignment system corresponding to each alignment mark, while changing a relative positional relation in the Z-axis direction (focus direction) perpendicular to the XY plane between alignment systems AL1 and $AL2_1$ to $AL2_4$ and wafer W mounted on wafer table WTB (wafer stage WST) using the Z-leveling mechanism that constitutes part of stage drive system 124, at each position at which the position of wafer stage WST is set for detecting the alignment marks in the respective alignment shot areas described above.

Figure 13A:
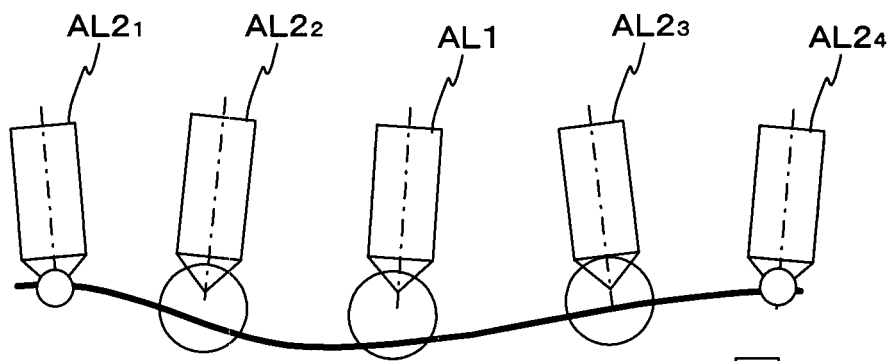
FIGS. 13A to 13C are views used to explain simultaneous detection of marks on a wafer by a plurality of alignment systems performed while changing the Z-position of a wafer table WTB (wafer W)
Figure 13B:
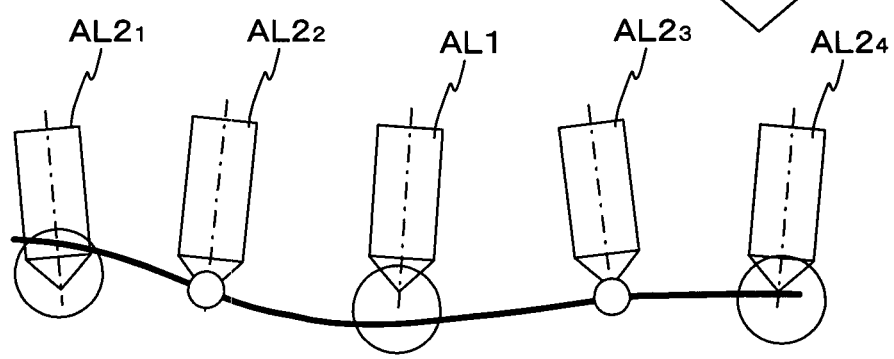
Figure 13C:
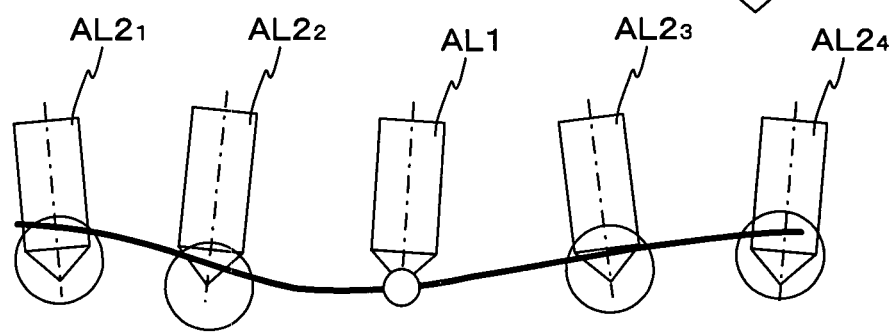

FIGS. 13A to 13C show a status where detection of marks on wafer W is performed by five alignment systems AL1 and $AL2_1$ to $AL2_4$ in the state shown in FIG. 12B where the position of wafer stage WST is set at the detection position of alignment marks in the third alignment shot areas described above. Each of FIGS. 13A to 13C shows a status where wafer table WTB (wafer W) is located at the different Z-position and different alignment marks are almost simultaneously being detected using alignment systems AL1 and $AL2_1$ to $AL2_4$. In the state of FIG. 13A, alignment systems $AL2_1$ and $AL2_4$ on both sides are in a focused state and the remaining alignment systems are in a defocused state. In the state of FIG. 13B, alignment systems $AL2_2$ and $AL2_3$ are in a focused state and the remaining alignment systems are in a defocused state. In the state of FIG. 13C, only alignment system AL1 in the center is in a focused state and the remaining alignment systems are in a defocused state.

In this manner, by performing simultaneous measurement of alignment marks by alignment systems AL1 and $AL2_1$ to $AL2_4$ while changing a relative positional relation in the Z-axis direction (focus direction) between a plurality of alignment systems AL1 and $AL2_1$ to $AL2_4$ and wafer W mounted on wafer table WTB (wafer stage WST) by changing the Z-position of wafer table WTB (wafer W), any of the alignment systems can measure the alignment marks in a substantially best focused state. Accordingly, main controller 20 can accurately detect the marks formed at positions different from one another on wafer W without being affected by unevenness of the wafer W surface or the best focus difference among a plurality of alignment systems, by preferentially using the detection result of the mark, for example, in the most favorable focused state of each alignment system, or the like.

Incidentally, in the description above, for example, the detection result of the mark in the most favorable focused state of each alignment system is to be preferentially used. However, the present invention is not limited to this, and main controller 20 may obtain position information of alignment marks also using the detection results of the marks in a defocused state. In this case, the detection results of the marks in a defocused state may also be used by multiplying the detection results by the weight in accordance with the defocused state. Further, the detection result of the mark in the defocused state is sometimes better than that in the best focused state, for example, depending on materials of layers formed on the wafer. In this case, detection of the marks is performed in the focus state with which the most favorable result can be obtained, that is, in a defocused state, and position information of the marks may be obtained using the detection results.

Further, as can be seen from FIGS. 13A to 13C, all the optical axes of all the alignment systems do not always coincide with the same ideal direction (Z-axis direction) accurately, and due to the influence of this tilt (telecentricity) of the optical axes with respect to the Z-axis, the detection results of positions of the alignment marks could include error. Accordingly, it is preferable that the tilt with respect to the Z-axis of the optical axes of all the alignment systems is measured in advance, and the detection results of positions of the alignment marks are corrected based on the measurement results.

Figure 14A:
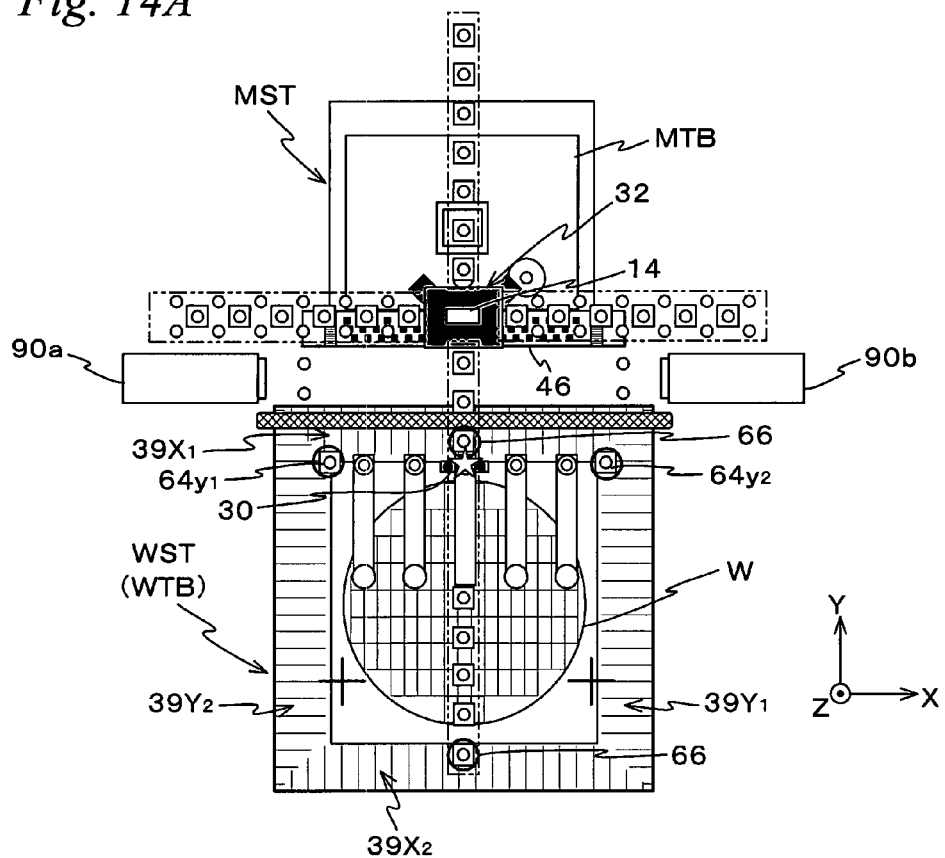
FIGS. 14A and 14B are views used to explain a baseline measurement operation of a primary alignment system.

Next, baseline measurement (baseline check) of primary alignment system AL1 will be described. Herein, the baseline of primary alignment system AL1 means a positional relation (or a distance) between a projection position where a pattern (e.g. a pattern of reticle R) is projected by projection optical system PL and a detection center of primary alignment system AL1.

a. At the point in time when baseline measurement of primary alignment system AL1 is started, as is shown in FIG. 14A, nozzle unit 32 forms liquid immersion area 14 between projection optical system PL and at least one of measurement table MTB and CD bar 46. That is, wafer stage WST and measurement stage MST are in a state of separating from each other.

Figure 14B:
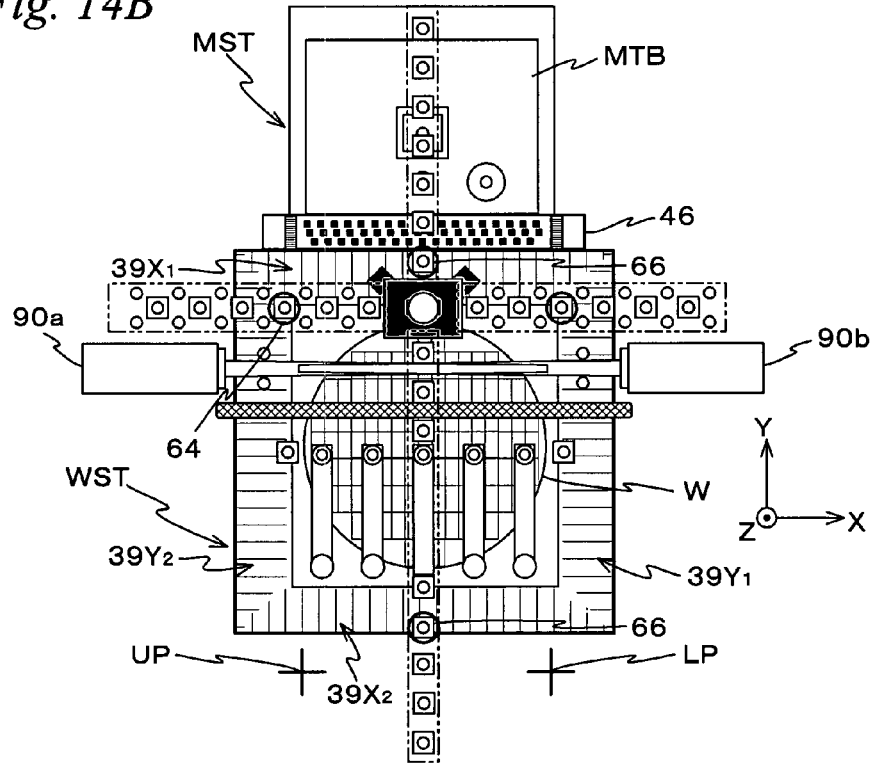

On baseline measurement of primary alignment system AL1, first of all, as is shown in FIG. 14A, main controller 20 detects (observes) fiducial mark FM located in the center on measurement plate 30 with primary alignment system AL1 (refer to a star-shaped mark in FIG. 14A). Then, main controller 20 makes the detection result of primary alignment system AL1 correspond to the measurement values of encoders 70A to 70D at the time of the detection, and stores them in a memory. Hereinafter, this processing is referred to as a Pri-BCHK former processing, for the sake of convenience. On the Pri-BCHK former processing, the position within the XY plane of wafer table WTB is controlled based on two X heads 66 indicated by being circled in FIG. 14A that face X scales $39X_1$ and $39X_2$ (encoders 70B and 70D), and two Y heads $64y_2$ and $64y_1$ indicated by being circled in FIG. 14A that face Y scales $39Y_1$ and $39Y_2$ (encoders 70A and 70C).

b. Next, as is shown in FIG. 14B, main controller 20 starts movement of wafer stage WST in the +Y direction so that measurement plate 30 is located directly below projection optical system PL. After starting the movement in the +Y direction of wafer stage WST, main controller 20 detects the approaching of wafer stage WST and measurement stage MST based on the outputs of clearance detection sensors 43A and 43C. Before and after that, that is, during the movement in the +Y direction of wafer stage WST, main controller 20 starts to open shutters 49A and 49B via drive mechanisms 34A and 34B, and permits the further approaching of wafer stage WST and measurement stage MST by opening the shutters. Further, main controller 20 confirms the opening of shutters 49A and 49B based on detection results of opening/closing sensor 101.

c. Next, immediately after detecting that wafer stage WST and measurement stage MST come into contact with each other (or come closer together at a distance of around 300 μm) based on the outputs of collision detection sensors 43B and 43D, main controller 20 stops wafer stage WST. After that, main controller 20 further moves measurement stage MST and wafer stage WST integrally in the +Y direction while keeping a contact state of measurement stage MST and wafer stage WST (or, keeping a distance of around 300 μm). Then, in the middle of the movement, liquid immersion area 14 is delivered from CD bar 46 to wafer table WTB.

d. Then, when wafer stage WST reaches the position shown in FIG. 14B, main controller 20 stops both stages WST and MST, and measures projected images (aerial images) of a pair of measurement marks on reticle R that are projected by projection optical system PL, using aerial image measuring unit 45 including measurement plate 30. The aerial images of measurement marks in pairs are severally measured in the aerial image measurement operation by a slit-scan method using a pair of aerial image measurement slit patterns SL, similar to the method that is disclosed in, for example, Kokai (Japanese Unexamined Patent Application Publication) No. 2002-014005 (the corresponding U.S. Patent Application Publication No. 2002/0041377) referred to previously and the like, and then stores the measurement results (aerial image intensity in accordance with the XY position of wafer table WTB) in a memory. Hereinafter, this measurement processing of aerial images of measurement marks in pairs on reticle R is referred to as a Pri-BCHK latter processing for the sake of convenience. On the Pri-BCHK latter processing, the position within the XY plane of wafer table WTB is controlled based on two X heads 66 indicated by being circled in FIG. 14B that face X scales $39X_1$ and $39X_2$ (encoders 70B and 70D), and two Y heads 64 indicated by being circled in FIG. 14B that face Y scales $39Y_1$ and $39Y_2$ (encoders 70A and 70C).

Then, main controller 20 computes the baseline of primary alignment system AL1 based on the results of the Pri-BCHK former processing and the results of the Pri-BCHK latter processing described above.

Incidentally, at the point in time when the baseline measurement of primary alignment system AL1 ends (i.e. the Pri-BCHK latter processing ends) as is described above, measurement stage MST and wafer stage WST are in a contact state (or a state of being separate from each other at a distance of around 300 μm).

Figure 15A:
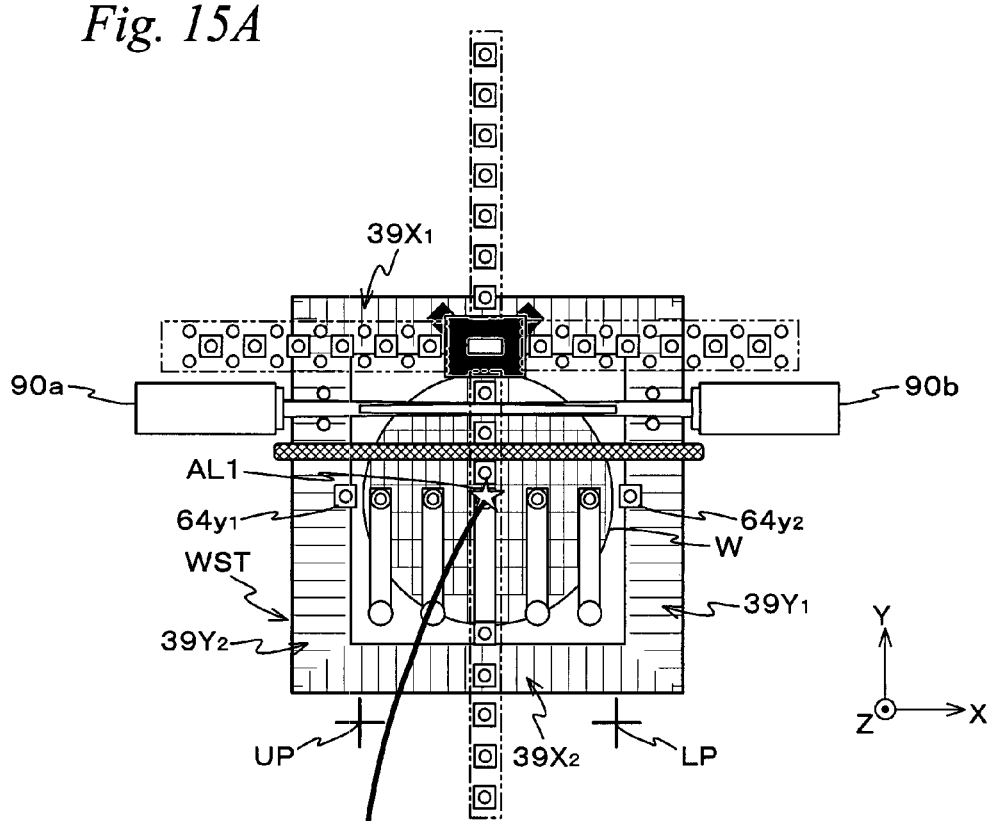
FIGS. 15A and 15B are views to explain a baseline measurement operation of secondary alignment systems performed to a wafer at the head of a lot.
Figure 15B:
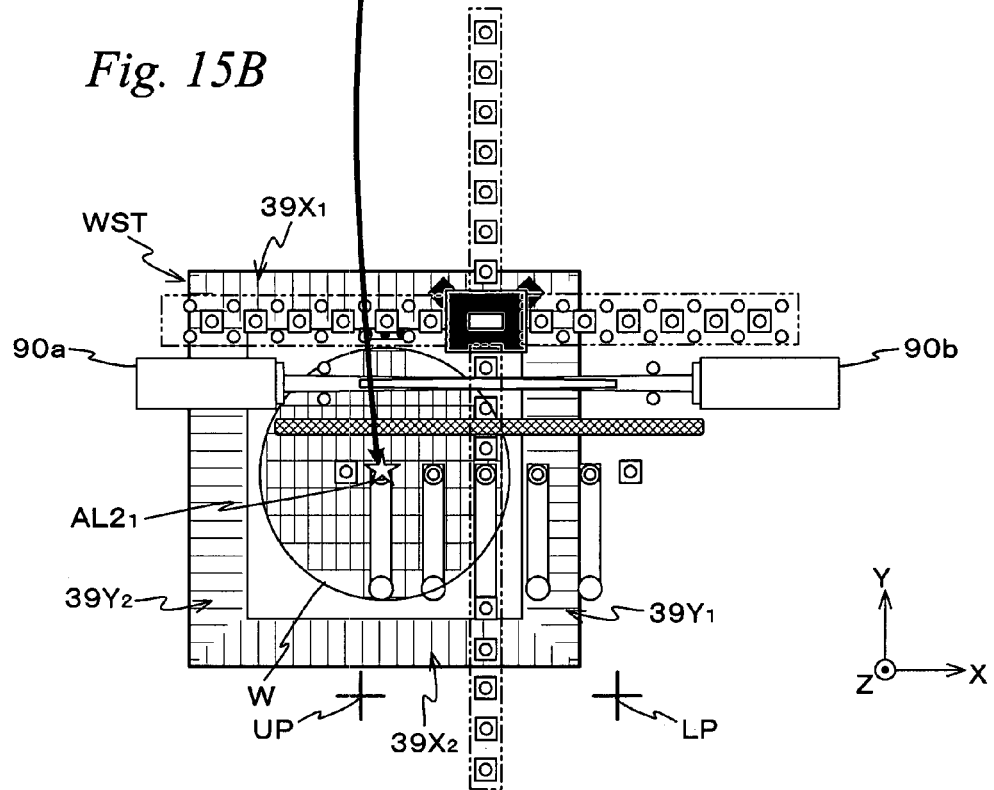

Next, a baseline measurement operation of secondary alignment system $AL2_n$ (n=1 to 4), which is performed mainly (to a wafer at the head of a lot) right before the processing to wafers in the lot is started, will be described. Herein, the baseline of secondary alignment system $AL2_n$ means a relative position of (a detection center of) each secondary alignment system $AL2_n$ with (the detection center of) primary alignment system AL1 as a datum. Incidentally, the position in the X-axis direction of secondary alignment system $AL2_n$ (n=1 to 4) is assumed to be set by being driven by rotation drive mechanism $60_n$, for example, in accordance with the shot map data of the wafers in the lot.

e. On the baseline measurement of the secondary alignment system performed to the wafer at the head of a lot (hereinafter, also referred to as "Sec-BCHK" as needed), first of all, as is shown in FIG. 15A, main controller 20 detects a specific alignment mark on wafer W (process wafer) at the head of a lot with primary alignment system AL1 (refer to a star-shaped mark in FIG. 15A). Then, main controller 20 makes the detection result correspond to the measurement values of encoders 70A to 70D at the time of the detection, and stores them in a memory. In the state of FIG. 15A, the position within the XY plane of wafer table WTB is controlled by main controller 20 based on two X heads 66 facing X scales $39X_1$ and $39X_2$ (encoders 70B and 70D) and two Y heads $64y_2$ and $64y_1$ facing Y scales $39Y_1$ and $39Y_2$ (encoders 70A and 70C).

f. Next, main controller 20 moves wafer stage WST in the −X direction by a predetermined distance, and as is shown in FIG. 15B, detects the specific alignment mark with secondary alignment system $AL2_1$ (refer to a star-shaped mark in FIG. 15B), and makes the detection result correspond to the measurement values of encoders 70A to 70D and stores them in a memory. In the state of FIG. 15B, the position within the XY plane of wafer table WTB is controlled based on two X heads 66 facing X scales $39X_1$ and $39X_2$ (encoders 70B and 70D) and two Y heads 64 facing Y scales $39Y_1$ and $39Y_2$ (encoders 70A and 70C).

g. Similarly, main controller 20 sequentially moves wafer stage WST in the +X direction and sequentially detects the specific alignment mark with the remaining secondary alignment systems $AL2_2$, $AL2_3$ and $AL2_4$, and then sequentially makes the detection results correspond to the measurement values of encoders 70A to 70D at the time of the detection and stores them in a memory.

h. Then, main controller 20 computes the baseline of each secondary alignment system $AL2_n$ based on the processing results of the above "e", and the processing results of the above "f" or "g".

In this manner, since the baseline of each secondary alignment system $AL2_n$ is obtained by detecting the same alignment mark on wafer W with primary alignment system AL1 and each secondary alignment system $AL2_n$ using wafer W (process wafer) at the head of a lot, the difference in detection offset among the alignment systems caused by the process can be corrected by this processing consequently. Incidentally, baseline measurement of secondary alignment system $AL2_n$ may also be performed using a datum mark on wafer stage WST or measurement stage MST, instead of the alignment mark on the wafer. In this case, fiducial mark FM of measurement plate 30 used in the baseline measurement of primary alignment system AL1 may be used, that is, fiducial mark FM may also be measured by each secondary alignment system $AL2_n$. Or, for example, the "n" number of datum marks are arranged on wafer stage WST or measurement stage MST in the same positional relation as that of secondary alignment system $AL2_n$, and detection of the datum marks by secondary alignment system $AL2_n$ may also be executable almost simultaneously. As the datum marks, for example, reference marks M of CD bar 46 may also be used. Moreover, the datum marks for baseline measurement of secondary alignment system $AL2_n$ may be arranged on wafer stage WST in a predetermined positional relation with fiducial mark FM for baseline measurement of primary alignment system AL1, and detection of the datum marks by secondary alignment system $AL2_n$ may also be executable almost simultaneously with detection of fiducial mark FM by primary alignment system AL1. In this case, the number of datum marks for baseline measurement of secondary alignment system $AL2_n$ may be one, or the datum marks may be arranged in plural, for example, the same number as the number of secondary alignment system $AL2_n$. Further, in the embodiment, since each of primary alignment system AL1 and secondary alignment system $AL2_n$ can detect two-dimensional marks (X and Y marks), the baselines in the X-axis and the Y-axis directions of secondary alignment system $AL2_n$ can be obtained simultaneously by using the two-dimensional marks at the time of baseline measurement of secondary alignment system $AL2_n$. In the embodiment, fiducial mark FM and reference marks M, and the alignment marks on the wafer include, for example, the one-dimensional X mark and Y mark in which a plurality of line marks are periodically arrayed in the X-axis and Y-axis directions respectively.

Next, a Sec-BCHK operation, which is performed at predetermined timing during the processing of wafers in a lot, for example, a period from when exposure of a wafer ends until when the loading of the next wafer on wafer table WTB is completed, that is, during wafer replacement, will be described. In this case, because the Sec-BCHK is performed at intervals of each wafer replacement, hereinafter the Sec-BCHK is also referred to as the Sec-BCHK (interval).

Figure 16:
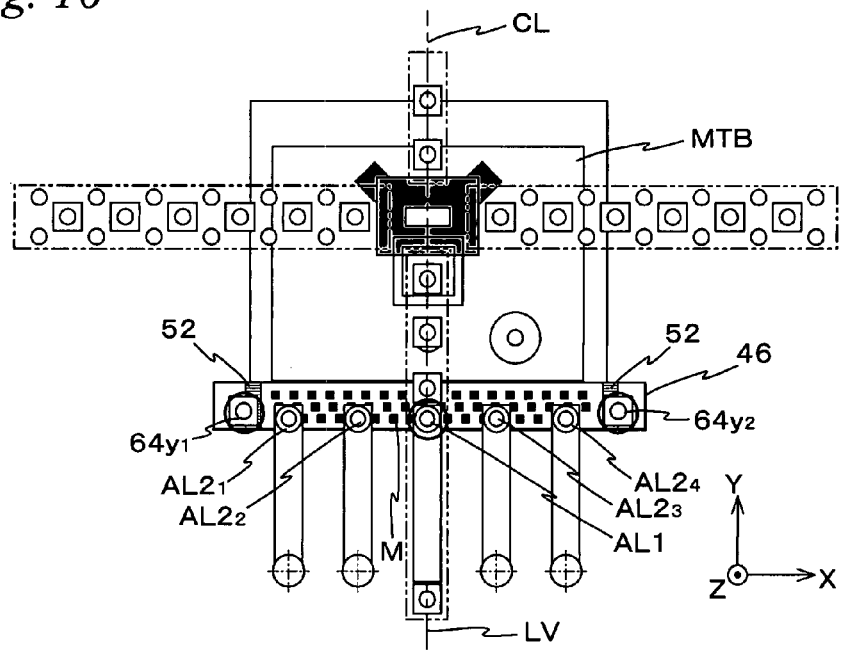
FIG. 16 is a view used to explain a baseline check operation of the secondary alignment systems performed at every wafer replacement.

On this Sec-BCHK (interval), as is shown in FIG. 16, main controller 20 moves measurement stage MST so that straight line LV on which the detection center of primary alignment system AL1 is placed substantially coincides with centerline CL and also CD bar 46 faces primary alignment system AL1 and secondary alignment system $AL2_n$. Then, main controller 20 adjusts the θz rotation of CD bar 46 based on the measurement values of a pair of reference gratings 52 on CD bar 46 and Y heads $64y_1$ and $64y_2$ indicated by being circled in FIG. 16 that face the pair of reference gratings 52 respectively (Y-axis linear encoders 70E and 70F), and also adjusts the XY-position of CD bar 46, for example, using the measurement values of the interferometers, based on the measurement values of primary alignment system AL1 indicated by being circled in FIG. 16 that detects reference mark M located on centerline CL of measurement table MTB or in the vicinity thereof.

Then, in this state, main controller 20 obtains each of the baselines of four secondary alignment systems $AL2_1$ to $AL2_4$, by simultaneously measuring reference mark M on CD bar 46 that is located within the field of each of the secondary alignment systems using four secondary alignment systems $AL2_1$ to $AL2_4$. Then, on the subsequent processing, drift of the baselines of four secondary alignment systems $AL2_1$ to $AL2_4$ is corrected by using the newly measured baselines.

Incidentally, the Sec-BCHK (interval) described above is to be performed by simultaneous measurement of different reference marks by a plurality of secondary alignment systems. However, the present invention is not limited to this, and each of the baselines of four secondary alignment systems $AL2_1$ to $AL2_4$ may also be obtained by sequentially (nonsimultaneously) measuring the same reference mark M on CD bar 46 with a plurality of secondary alignment systems.

Figure 17A:
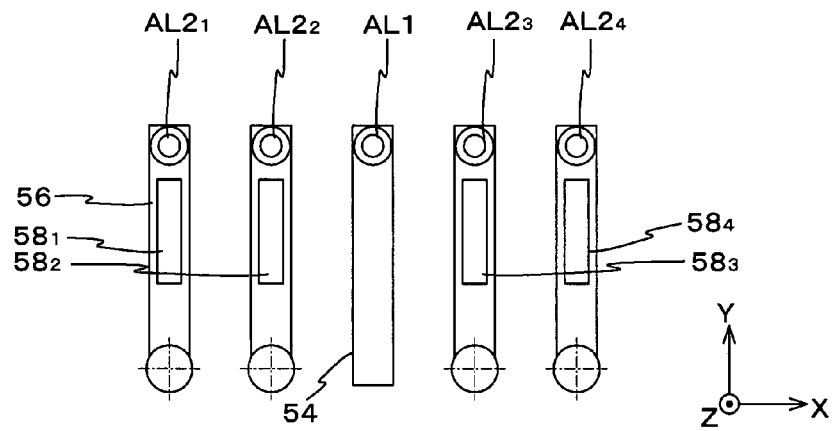
FIGS. 17A and 17B are views used to explain a position adjustment operation of the secondary alignment systems.
Figure 17B:
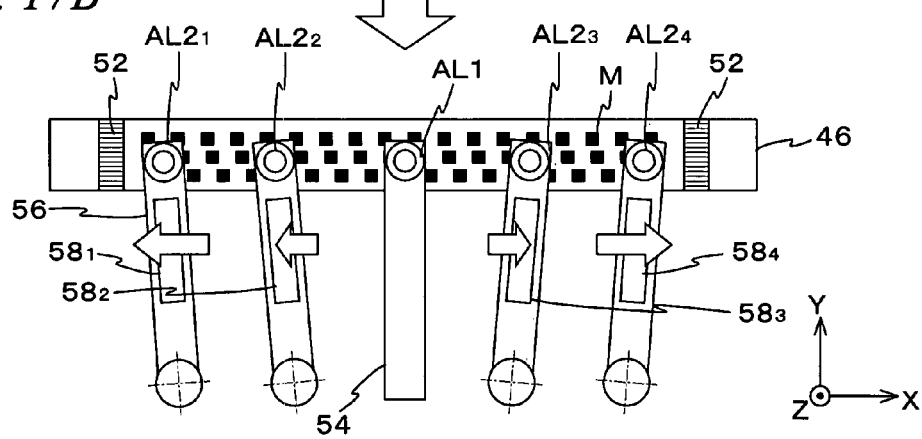

Next, the operation of position adjustment of secondary alignment system $AL2_n$ will be briefly described based on FIGS. 17A and 17B.

It is assumed that a positional relation between primary alignment system AL1 and four secondary alignment systems $AL2_1$ to $AL2_4$ is the positional relation shown in FIG. 17A, before the adjustment.

As is shown in FIG. 17B, main controller 20 moves measurement stage MST so that primary alignment system AL1 and four secondary alignment systems $AL2_1$ to $AL2_4$ are located above CD bar 46. Next, in the similar manner to the case of the Sec-BCHK (interval) described above, main controller 20 adjusts the θz rotation of CD bar 46 based on the measurement values of Y-axis linear encoders 70E and 70F (Y heads $64y_1$ and $64y_2$), and also adjust the XY-position of CD bar 46 based on the measurement values of primary alignment system AL1 that detects reference mark M located on centerline CL of measurement table MTB or in the vicinity thereof. Simultaneously with this adjustment, main controller 20 rotates each of arms 56 at the tip of which each secondary alignment system $AL2_n$ is arranged, around each rotation center as indicated by arrows in FIG. 17B, by driving rotation drive mechanisms $60_1$ to $60_4$ based on shot map information including information on size and placement of alignment shot areas on a wafer to be exposed next (i.e. placement of alignment marks on the wafer). In this case, main controller 20 stops the rotation of each arm 56 at the position where a desired reference mark M on CD bar 46 is located in the field (detection area) of each secondary alignment system $AL2_n$, while monitoring detection results of each secondary alignment system $AL2_n$. Thus, the baseline of secondary alignment system $AL2_n$ is adjusted (changed) in accordance with the placement of alignment marks arranged in the alignment shot areas to be detected. In other words, the position in the X-axis direction of the detection area of secondary alignment system $AL2_n$ is changed. Thus, only by moving wafer W in the Y-axis direction, a plurality alignment marks whose positions in the X-axis direction are substantially the same and whose positions in the Y-axis direction are different on wafer W can be sequentially detected by each secondary alignment system $AL2_n$. In the embodiment, in the wafer alignment operation, that is, in the detection operation of the alignment marks on the wafer by primary alignment system AL1 and secondary alignment system $AL2_n$, wafer W is to be one-dimensionally moved only in the Y-axis direction. However, during the operation, the detection area of at least one secondary alignment system $AL2_n$ and wafer W may also be relatively moved in a direction different from the Y-axis direction (e.g. in the X-axis direction). In this case, the position of the detection area may be adjusted by the movement of secondary alignment system $AL2_n$, or only wafer W may be moved in view of the adjustment period of time or change in the baseline.

Then, after the baseline of secondary alignment system $AL2_n$ is adjusted in this manner, main controller 20 fixes each arm $56_n$ to a main frame (not shown) by suction by activating each vacuum pad $58_n$. Thus, a state of each arm $56_n$ after the rotation angle adjustment is maintained.

Incidentally, in the above description, reference marks M formed at different positions on CD bar 46 are to be simultaneously and individually detected with five alignment systems AL1 and $AL2_1$ to $AL2_4$. However, the present invention is not limited to this, and the baseline of secondary alignment system $AL2_n$ can also be adjusted, for example, by simultaneously and individually detecting alignment marks formed at different positions on wafer W (process wafer) with five alignment systems AL1 and $AL2_1$ to $AL2_4$ and adjusting the rotation of each arm $56_n$. Further, in the embodiment, the baseline (the position of the detection area) of secondary alignment system $AL2_n$ is to be adjusted using reference marks M of CD bar 46 or the like. However, the adjustment operation is not limited to this, and for example, secondary alignment system $AL2_n$ only has to be moved to a target position while measuring its position with the sensor described above. In this case, it is only necessary to employ the sequence in which the baseline that has been measured before the movement is corrected based on the position or the movement amount of secondary alignment system $AL2_n$ measured by the sensor, or the baseline measurement is executed again after the movement, or at least the baseline measurement of secondary alignment system $AL2_n$ is performed after the movement.

Next, detection of position information (surface position information) of the wafer W surface in the Z-axis direction (hereinafter, referred to as focus mapping) that is performed in exposure apparatus 100 of the embodiment will be described.

Figure 18A:
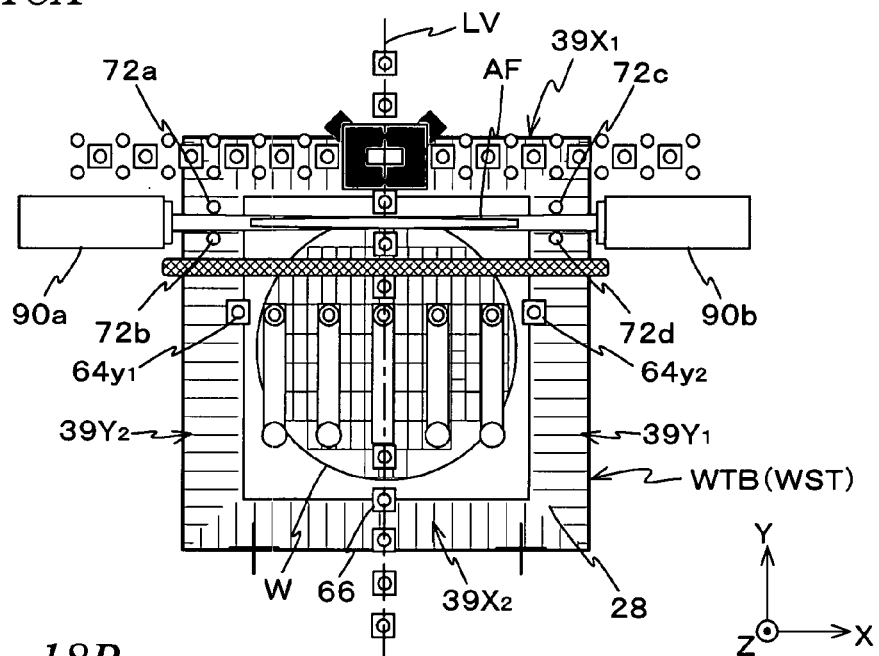
FIGS. 18A to 18C are views used to explain focus mapping performed in the exposure apparatus related to an embodiment.

On the focus mapping, as is shown in FIG. 18A, main controller 20 controls the position within the XY plane of wafer table WTB based on X head 66 facing X scale $39X_2$ (X linear encoder 70D) and two Y heads $64y_2$ and $64y_1$ facing Y scales $39Y_1$ and $39Y_2$ respectively (Y linear encoders 70A and 70C). In the state of FIG. 18A, a straight line (centerline) parallel to the Y-axis that passes through the center of wafer table WTB (which substantially coincides with the center of wafer W) coincides with straight line LV.

Then, in this state, main controller 20 starts scanning of wafer stage WST in the +Y direction, and after starting the scanning, activates (turns ON) both Z sensors 72a to 72d and the multipoint AF system (90a, 90b) by the time when detection beams of the multipoint AF system (90a, 90b) begin to be irradiated on wafer W due to movement of wafer stage WST in the +Y direction.

Figure 18B:
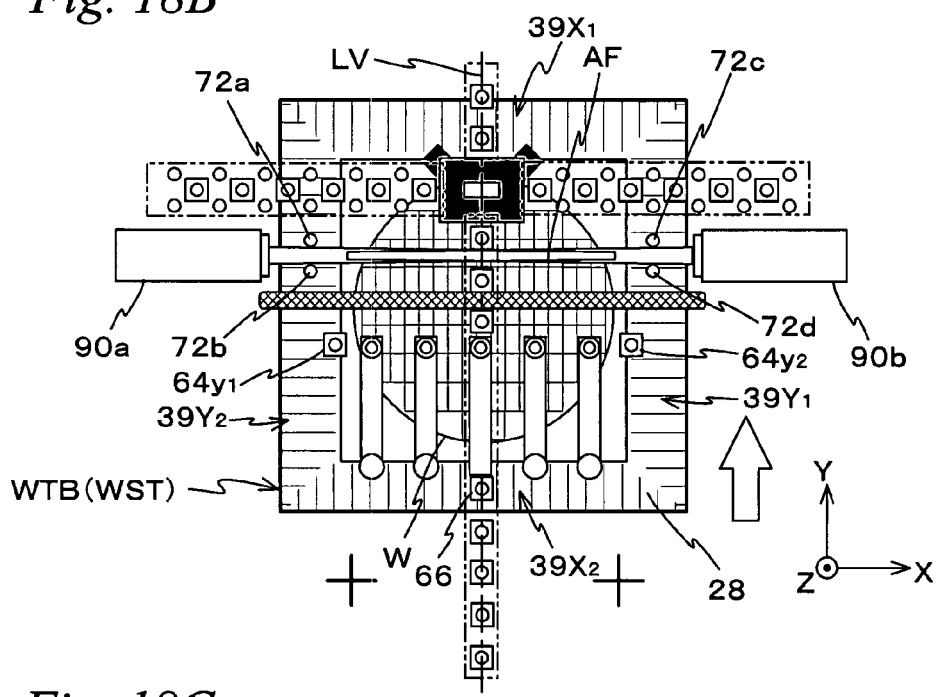

Then, in a state where Z sensors 72a to 72d and the multipoint AF system (90a, 90b) simultaneously operate, as is shown in FIG. 18B, position information (surface position information) of the wafer table WTB surface (surface of plate 28) in the Z-axis direction that is measured by Z sensors 72a to 72d and position information (surface position information) of the wafer W surface in the Z-axis direction at a plurality of detection points that is detected by the multipoint AF system (90a, 90b) are loaded at predetermined sampling intervals during a period when wafer stage WST is proceeding in the +Y direction, and loaded three kinds of information, i.e. two kinds of the loaded surface position information and the measurement values of Y linear encoders 70A and 70C at each sampling timing are made to correspond to one another, and are sequentially stored in a memory (not shown).

Then, when the detection beams of the multipoint AF system (90a, 90b) begin to miss wafer W, main controller 20 ends the sampling described above and converts the surface position information at each detection point of the multipoint AF system (90a, 90b) into data, using the surface position information by Z sensors 72a to 72d that has been loaded simultaneously, as a datum.

Figure 18C:
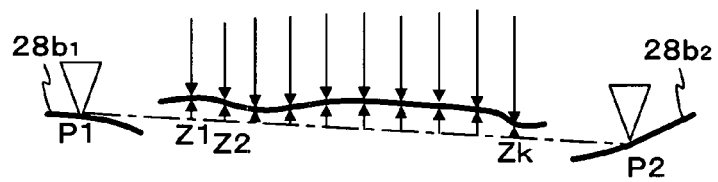

More specifically, based on the average value of the measurement values of Z sensors 72a and 72b, surface position information at a predetermined point (e.g. corresponding to a midpoint between the respective measurement points of Z sensors 72a and 72b, that is, a point on the substantially same X-axis as the array of a plurality of detection points of the multipoint AF system (90a, 90b): hereinafter, this point is referred to as a left measurement point) on an area (area where Y scale $39Y_2$ is formed) in the vicinity of the −X side end portion of plate 28 is obtained. Further, based on the average value of the measurement values of Z sensors 72c and 72d, surface position information at a predetermined point (e.g. corresponding to a midpoint between the respective measurement points of Z sensors 72c and 72d, that is, a point on the substantially same X-axis as the array of a plurality of detection points of the multipoint AF system (90a, 90b): hereinafter, this point is referred to as a right measurement point) on an area (area where Y scale $39Y_1$ is formed) in the vicinity of the +X side end portion of plate 28 is obtained. Then, as is shown in FIG. 18C, main controller 20 converts the surface position information at each detection point of the multipoint AF system (90a, 90b) into surface position data z1 to zk using a straight line that connects the surface position of a left measurement point P1 and the surface position of a right measurement point P2 as a datum. Main controller 20 performs such conversion to the information loaded at all the sampling timings.

Since the foregoing converted data is obtained in advance as is described above, afterward, for example, on exposure or the like, the Z-position and the tilt (mainly the θy rotation) with respect to the XY plane of wafer table WTB are computed, by measuring the wafer table WTB surface (a point on the area where Y scale $39Y_2$ is formed and a point on the area where Y scale $39Y_1$ is formed) with Z sensors $74_{1,j}$ and $74_{2,j}$, and $76_{1,q}$ and $76_{2,q}$. By using the computed Z-position and tilt with respect to the XY plane of wafer table WTB and surface position data z1 to zk described above, surface position control of the upper surface of wafer W can be performed without actually obtaining surface position information of the wafer surface. Accordingly, since there is no problem even if the multipoint AF system is placed at a position away from projection optical system PL, the focus mapping of the embodiment can suitably be applied also to an exposure apparatus whose working distance is short, or the like.

Incidentally, in the description above, the surface position of left measurement point P1 and the surface position of right measurement point P2 are to be computed based on the average value of measurement values of Z sensors 72a and 72b and the average value of measurement values of Z sensors 72c and 72d respectively. However, the present invention is not limited to this, and the surface position information at each detection point of the multipoint AF system (90a, 90b) may also be converted into surface position data, for example, using a straight line that connects the surface positions measured by Z sensors 72a and 72c, as a datum. In this case, the difference between the measurement value of Z sensor 72a and the measurement value of Z sensor 72b obtained at each sampling timing, and the difference between the measurement value of Z sensor 72c and the measurement value of Z sensor 72d obtained at each sampling timing are obtained severally in advance. Then, when performing surface position control at the time of exposure or the like, by measuring the wafer table WTB surface with Z sensors $74_{1,j}$ and $74_{2,j}$, and $76_{1,q}$ and $76_{2,q}$ and computing the Z-position and the tilt (not only the θy rotation but also the θx rotation) with respect to the XY plane of wafer table WTB, surface position control of wafer W can be performed using the computed Z-position and tilt with respect to the XY plane of wafer table WTB, and surface position data z1 to zk described above and the differences described above, without actually obtaining surface position information of the wafer surface.

The description so far is made assuming that unevenness does not exist on the wafer table WTB surface. In actual, however, as is shown in FIG. 18C, there is unevenness on the surface of wafer table WTB, that is, the surface of a first partial area $28b_1$ where Y scale $39Y_2$ is formed, the surface of a second partial area $28b_2$ where Y scale $39Y_1$ is formed, or the like. However, even in the case unevenness exits on the surface of wafer table WTB as is described above, surface position control with extremely high precision can be performed at a point on a meridian of wafer W (a straight line parallel to the Y-axis that passes through the wafer center).

The surface position control at a point on the meridian will be described below.

When the focus mapping is performed, Z sensors 72a to 72d that serve as datums when performing the mapping detect surface position information of certain positions (XY coordinate positions) on the wafer table WTB surface. Then, as is obvious from the description above, the focus mapping is performed fixing the X-position of wafer stage WST while moving wafer stage WST straight in the +Y direction. In other words, the lines (on the surface of second water repellent plate 28b) that Z sensors 72a to 72d detect the surface position information when performing the focus mapping also become straight lines parallel to the Y-axis.

When the focus mapping is being performed (when wafer stage WST is moving in the +Y direction), the shot area located on the meridian of the wafer is to be placed at an exposure position (below projection optical system PL) without moving wafer stage WST in the X-axis direction. When the shot area on the meridian reaches the exposure position, a pair of Z sensors $74_{1,4}$ and $74_{2,4}$ that are on the same straight line parallel to the Y-axis as Z sensors 72a and 72b, and a pair of Z sensors $76_{1,3}$ and $76_{2,3}$ that are on the same straight line parallel to the Y-axis as Z sensors 72c and 72d are to detect surface position information at points that are the same as the points on wafer table WTB at which Z sensors 72a and 72b, and Z sensors 72c and 72d severally detect surface position information at the time of focus mapping. That is, the datum surface measured by the Z sensors that serves as a datum in the detection of surface position information by the multipoint AF system (90a, 90b) is the same at the time of focus mapping and at the time of exposure. Therefore, when exposing the shot area on the meridian, even if unevenness or undulation occurs on the surface of wafer table WTB, focus control of the wafer on exposure can be performed using the Z-position obtained at the time of focus mapping without change, without taking the unevenness or undulation into consideration, and therefore highly accurate focus control can be performed.

When exposing the shot areas other than the shot area on the meridian, in the case there is neither unevenness nor undulation on the surface of wafer table WTB, focus control accuracy of the same level as the case of the shot area on the meridian can be secured. In the case there is unevenness or undulation on the surface of wafer table WTB, however, focus control accuracy depends on accuracy of traverse-Z-moving correction (to be described later). Further, in the cases such as when moving wafer stage WST, for example, in the X-axis direction in order to expose the shot areas other than the one on the meridian, main controller 20 performs the transfer of the measurement values between a plurality of Z sensors along with the movement of wafer stage WST.

Next, focus calibration will be described. The focus calibration means the operation in which the processing (focus calibration former processing) of obtaining a relation between surface position information at end portions on one side and the other side of wafer table WTB in the X-axis direction in a certain datum state and a detection result (surface position information) at a representative detection point on the measurement plate 30 surface of the multipoint AF system (90a, 90b), and the processing (focus calibration latter processing) of obtaining surface position information at end portions on one side and the other side of wafer table WTB in the X-axis direction that corresponds to the best focus position of projection optical system PL detected using aerial image measuring unit 45, in a state similar to the datum state described above, are performed, and based on the processing results, the processing of obtaining an offset at the representative detection point of the multipoint AF system (90a, 90b), that is, the deviation between the best focus position of projection optical system PL and the detection origin of the multipoint AF system, or the like is performed.

Figure 19A:
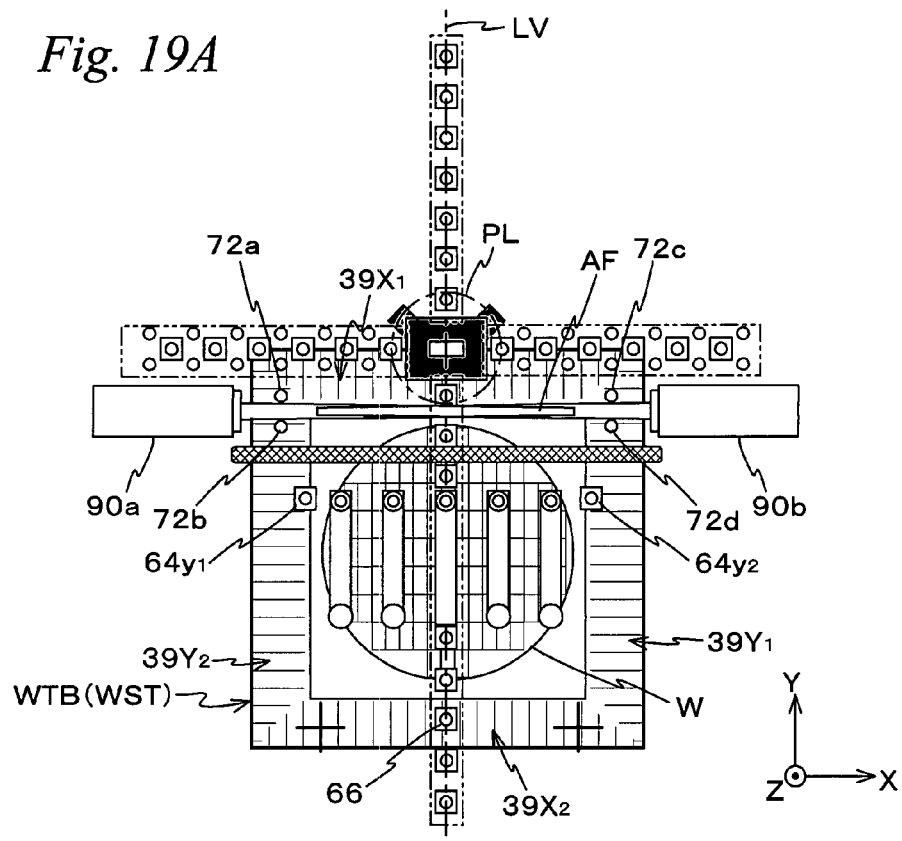
FIGS. 19A and 19B are views used to explain focus calibration performed in the exposure apparatus related to an embodiment.

On the focus calibration, as is shown in FIG. 19A, main controller 20 controls the position within the XY plane of wafer table WTB based on two X heads 66 facing X scales 39X$_1$ and 39X$_2$ respectively (X linear encoders 70B and 70D) and two Y heads 64y$_2$ and 64y$_1$ facing Y scales 39Y$_1$ and 39Y$_2$ respectively (Y linear encoders 70A and 70C). In the state of FIG. 19A, the centerline of wafer table WTB coincides with straight line LV. Further, in the state of FIG. 19A, wafer table WTB is located at a position in the Y-axis direction with which detection beams from the multipoint AF system (90a, 90B) are irradiated to measurement plate 30. Further, although omitted in the drawing, there is measurement stage MST on the +Y side of wafer table WTB (wafer stage WST) and water is held in the space between CD bar 46 and wafer table WTB, and tip lens 191 of projection optical system PL (refer to FIG. 31).

(a) In this state, main controller 20 performs the focus calibration former processing as follows. That is, while detecting surface position information of the end portions on one side and the other side of wafer table WTB in the X-axis direction that is detected by Z sensors 72a, 72b, 72c and 72d in the vicinity of each of detection points that are located at both end portions of the detection area of the multipoint AF system (90a, 90b), main controller 20 uses the surface position information as a datum and detects surface position information of the surface of measurement plate 30 (refer to FIG. 3) using the multipoint AF system (90a, 90b). Thus, a relation between the measurement values of Z sensors 72a, 72b, 72c and 72d (surface position information at end portions on one side and the other side of wafer table WTB in the X-axis direction) and the detection result (surface position information) at a detection point (the detection point located in the center or the vicinity thereof out of a plurality of detection points) on the measurement plate 30 surface of the multipoint AF system (90a, 90b), in a state where the centerline of wafer table WTB coincides with straight line LV, is obtained.

Figure 19B:
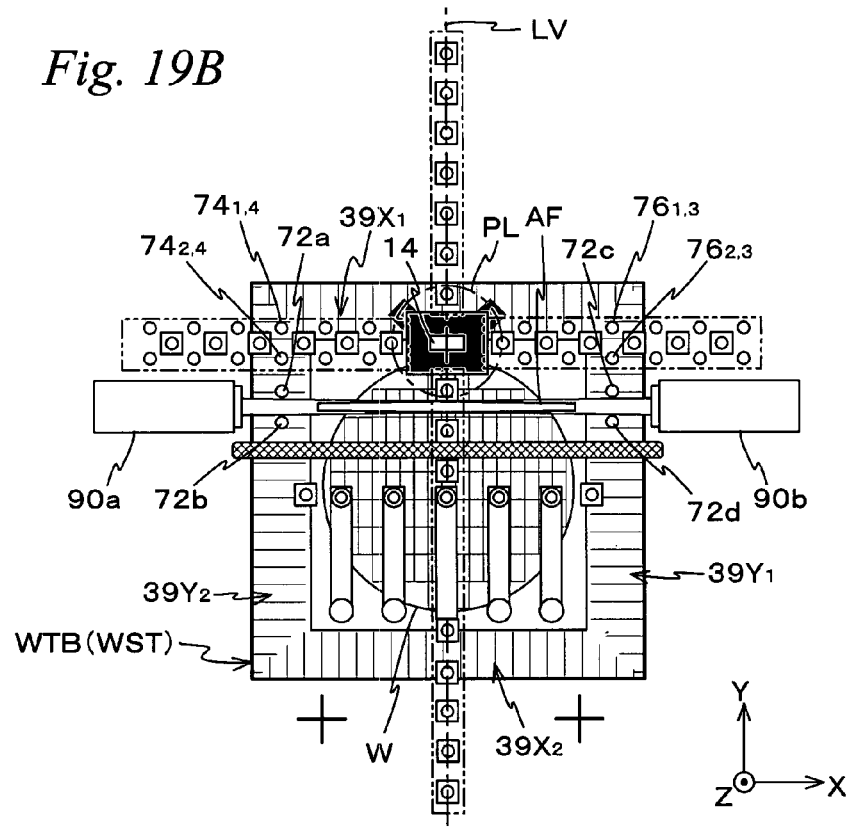

(b) Next, main controller 20 moves wafer stage WST in the +Y direction by a predetermined distance, and stops wafer stage WST at a position with which measurement plate 30 is located directly below projection optical system PL. Then, main controller 20 performs the focus calibration latter processing as follows. That is, as is shown in FIG. 19B, while controlling the position in the optical axis direction of projection optical system PL (Z-position) of measurement plate 30 (wafer table WTB), using surface position information as a datum, which is measured by a pair of Z sensors 74$_{1,4}$ and 74$_{2,4}$, and a pair of Z sensors 76$_{1,3}$ and 76$_{2,3}$ that measure surface position information at the end portions on one side and the other side in the X-axis direction of wafer table WTB, main controller 20 measures an aerial image of a measurement mark formed on a mark plate (not shown) on reticle R or reticle stage RST by a slit-scan method using aerial image measuring unit 45, and based on the measurement results, measures the best focus position of projection optical system PL. In this case, as is shown in FIG. 19B, since liquid immersion area 14 is formed between projection optical system PL and measurement plate 30 (wafer table WTB), the aerial image measurement described above is performed via projection optical system PL and water. Further, although omitted in FIG. 19B, since measurement plate 30 of aerial image measuring unit 45 and the like are mounted on wafer stage WST (wafer table WTB) and the light-receiving element and the like are mounted on measurement stage MST, the aerial image measurement described above is performed while keeping wafer stage WST and measurement stage MST in a contact state (or a proximity state) (refer to FIG. 33). By the measurement described above, the measurement values of Z sensors 74$_{1,4}$ and 74$_{2,4}$, and 76$_{1,3}$ and 76$_{2,3}$ (i.e. surface position information at the end portions on one side and the other side in the X-axis direction of wafer table WTB) in a state where the centerline of wafer table WTB coincides with straight line LV are obtained. These measurement values correspond to the best focus position of projection optical system PL.

(c) Thus, main controller 20 can obtain the offset at the representative detection point of the multipoint AF system (90a, 90b), that is, the deviation between the best focus position of projection optical system PL and the detection origin of the multipoint AF system, based on the relation between the measurement values of Z sensors 72a and 72b, and 72c and 72d (surface position information at the end portions on one side and the other side in the X-axis direction of wafer table WTB) and the detection result (surface position information) of the measurement plate 30 surface by the multipoint AF system (90a, 90b) that is obtained in the focus calibration former processing in the above (a), and based on the measurement values of Z sensors 74$_{1,4}$ and 74$_{2,4}$, and 76$_{1,3}$ and 76$_{2,3}$ (i.e. surface position information at the end portions on one side and the other side in the X-axis direction of wafer table WTB) corresponding to the best focus position of projection optical system PL that are obtained in the focus calibration latter processing in the above (b). In the embodiment, the representative detection point is, for example, the detection point in the center of the plurality of detection points or in the vicinity thereof, but the number and/or the position may be arbitrary. In this case, main controller 20 performs adjustment of the detection origin of the multipoint AF system so that the offset at the representative detection point becomes zero. For example, the adjustment may be performed optically by performing angle adjustment of a plane parallel plate (not shown) inside photodetection system 90b, or the detection offset may be electrically adjusted. Alternatively, the offset may be stored, without performing adjustment of the detection origin. Herein, adjustment of the detection origin is to be performed in the optical method referred to above. Thus, the focus calibration of the multipoint AF system (90a, 90b) ends. Incidentally, in the optical adjustment of the detection origin, since it is difficult to make the offsets at all the remaining detection points other than the representative detection point be zero, the offsets after the optical adjustment at the remaining detection points are preferably stored.

Next, offset correction of detection values among a plurality of light-receiving elements (sensors) that individually correspond to a plurality of detection points of the multiple AF system (90a, 90b) (hereinafter, referred to as offset correction among AF sensors) will be described.

Figure 20A:
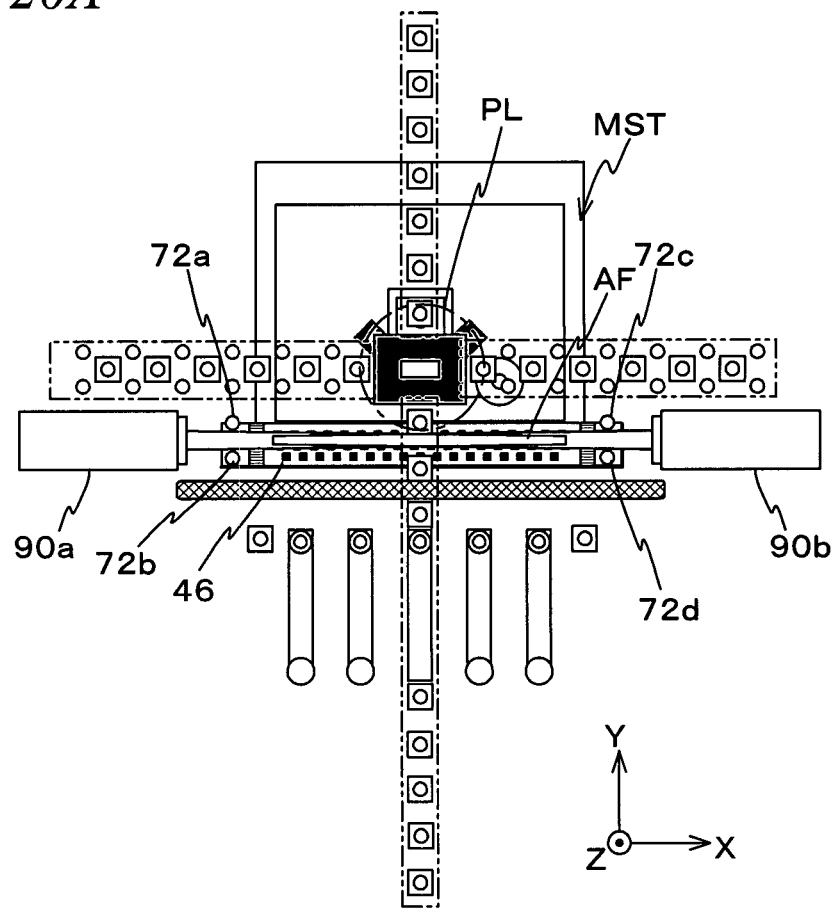
FIGS. 20A and 20B are views used to explain offset correction among AF sensors performed in the exposure apparatus related to an embodiment.
Figure 20B:
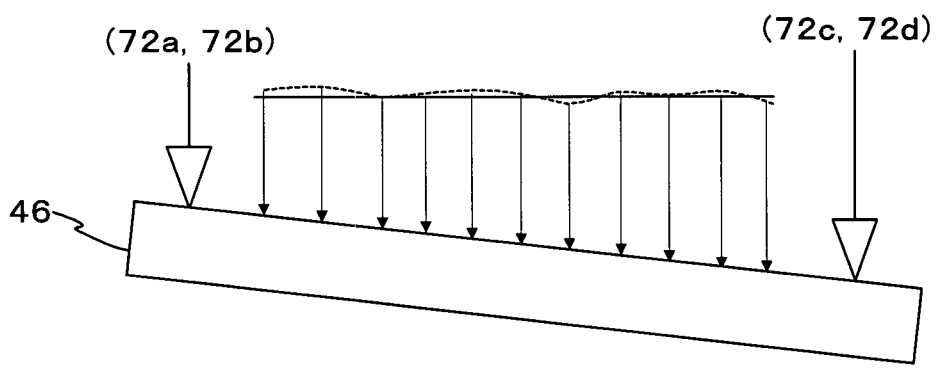

On the offset correction among AF sensors, as is shown in FIG. 20A, main controller 20 makes irradiation system 90a of the multipoint AF system (90a, 90b) irradiate detection beams to CD bar 46 equipped with a predetermined datum plane, and loads output signals from photodetection system 90b of the multipoint AF system (90a, 90b) that receives the reflected lights from the CD bar 46 surface (datum plane).

In this case, if the CD bar 46 surface is set parallel to the XY plane, main controller 20 can perform the offset correction among AF sensors by obtaining a relation among the detection values (measurement values) of a plurality of sensors that individually correspond to a plurality of detection points based on the output signals loaded in the manner described above and storing the relation in a memory, or electrically adjusting the detection offset of each sensor so that the detection values of all the sensors become, for example, the same value as the detection value of a sensor that corresponds to the representative detection point on the focus calibration described above.

In the embodiment, however, as is shown in FIG. 20A, main controller 20 detects a tilt of the CD bar 46 surface using Z sensors 72a, 72b, 72c and 72d when loading the output signals from photodetection system 90b of the multipoint AF system (90a, 90b), and therefore, the CD bar 46 surface does not always have to be set parallel to the XY plane. In other words, as is modeled in FIG. 20B, when it is assumed that the detection value at each detection point is the value as severally indicated by arrows in the drawing and a line that connects the upper ends of the detection values has unevenness as shown in a dotted line in the drawing, each detection value only has to be adjusted so that the line that connects the upper ends of the detection values becomes a line shown in a solid line in the drawing.

Next, traverse-Z-moving correction, in which information used to correct influence of unevenness related to the X-axis direction of the wafer table WTB surface, to be more accurate, of the second water repellent plate 28b surface is obtained, will be described. Herein, the traverse-Z-moving correction is performed by simultaneously loading the measurement values of the Z sensors that detect position information of either side areas in a horizontal direction on the surface of second water repellent plate 28b of wafer table WTB and the detection values of surface position information of the wafer by the multipoint AF system at predetermined sampling intervals while moving wafer table WTB in the X-axis direction.

Figure 21A:
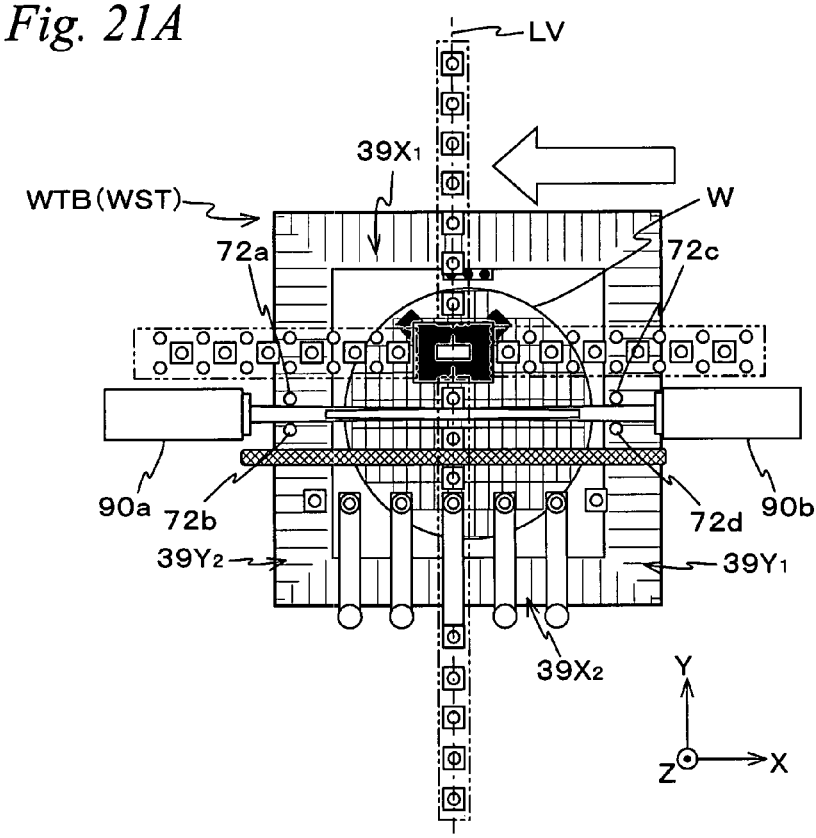
FIGS. 21A and 21B are views used to explain traverse-Z-moving correction performed in the exposure apparatus related to an embodiment.

On the traverse-Z-moving correction, similar to the case of the focus mapping described above, as is shown in FIG. 21A, main controller 20 controls the position within the XY plane of wafer table WTB based on two X heads 66 facing X scales 39X$_1$ and 39X$_2$ respectively (X linear encoders 70B and 70D) and two Y heads 64y$_2$ and 64y$_1$ facing Y scales 39Y$_1$ and 39Y$_2$ respectively (Y linear encoders 70A and 70C). In the state of FIG. 21A, the centerline of wafer table WTB is located on the +X side of straight line LV, and main controller 20 measures surface position information of the points in the vicinity of the −X side end portions of the either side areas on the surface of second water repellent plate 28b of wafer table WTB using Z sensors 72a and 72b, and Z sensors 72c and 72d, and at the same time, detects surface position information of the wafer using the multipoint AF system (90a, 90b).

Figure 21B:
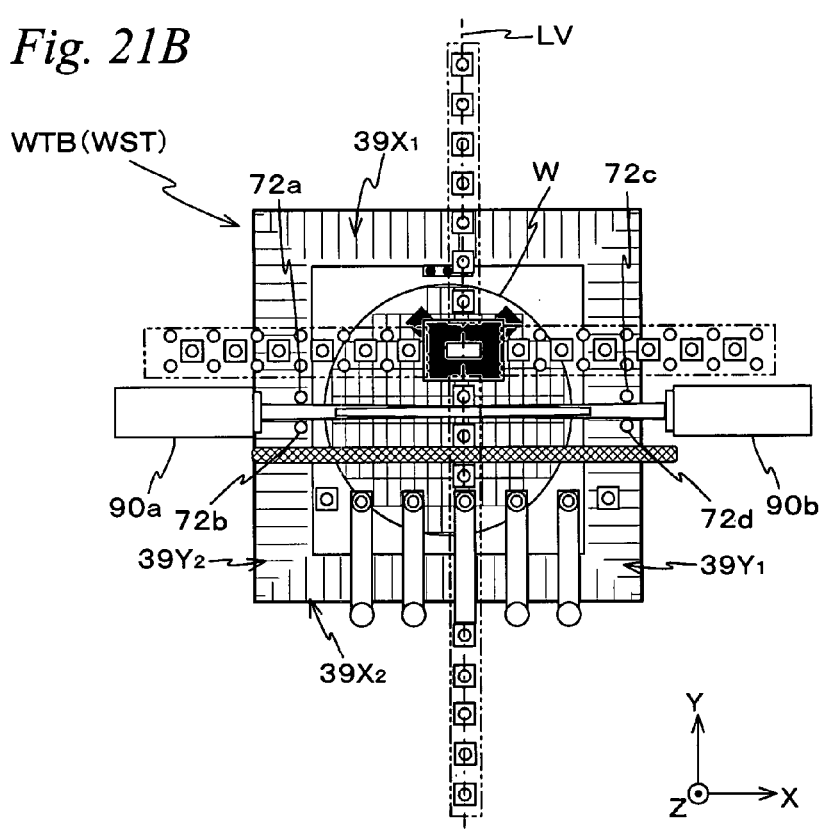

Subsequently, main controller 20 moves wafer stage WST in the −X direction at a predetermined speed as is indicated by an outline arrow in FIG. 21A. During the movement, main controller 20 repeatedly executes simultaneous loading of the measurement values of Z sensors 72a and 72b and Z sensors 72c and 72d and the detection values of the multipoint AF system (90a, 90b) at predetermined sampling intervals. Then, as is shown in FIG. 21B, at the point in time when the simultaneous loading described above in a state where Z sensors 72a and 72b and Z sensors 72c and 72d face the points in the vicinity of the +X end portions of the either side areas on the surface of second water repellent plate 28b of wafer table WTB is completed, main controller 20 ends the operation.

Then, main controller 20 obtains a relation between the surface position information at each detection point of the multipoint AF system (90a, 90b) and the surface position information by Z sensors 72a to 72d that has been simultaneously loaded. Then, main controller 20 computes unevenness related to the X-axis direction of the surface of second water repellent plate 28b from a plurality of relations that have been obtained at different sampling timings. In other words, in this case, since the offset among sensors of the multipoint AF system (90a, 90b) has been adjusted, the detection values of the sensors corresponding to any detection points should be the same value as far as the same point on the surface of second water repellent plate 28b is detected. Accordingly, the differences among the detection values obtained when detecting the same point on the surface of second water repellent plate 28b by the sensors corresponding to different detection points are directly reflected by unevenness of the surface of second water repellent plate 28b and position variation in the Z-axis direction of the wafer table during the movement. Then, by making use of this relation, unevenness related to the X-axis direction of the surface of second water repellent plate 28b is computed from the plurality of relations that have been obtained at different sampling timings.

In this manner, main controller 20 obtains information on position variation in the Z-axis direction of the wafer table WTB surface that occurs when wafer table WTB (wafer stage WST) moves in the X-axis direction (is located at different X-positions), based on the results that have been sequentially detected using the multipoint AF system (90a, 90b) while moving wafer table WTB (wafer stage WST) in the X-axis direction. Main controller 20 performs focus control of wafer W while adding this information as a correction amount, on exposure.

Next, a parallel processing operation using wafer stage WST and measurement stage MST in exposure apparatus 100 of the embodiment will be described based on FIGS. 22 to 36. Incidentally, during the operation described below, main controller 20 performs opening/closing control of each valve of liquid supply unit 5 and liquid recovery unit 6 of local liquid immersion unit 8 as is described earlier, and the space on the outgoing surface side of tip lens 191 of projection optical system PL is constantly filled with water. However, description regarding control of liquid supply unit 5 and liquid recovery unit 6 will be omitted in the following description, in order to make the description easily understandable. Further, the following description regarding the operations will be made using many drawings, but the reference codes of the same members are shown in some drawings and not shown in the other drawings. That is, the reference codes shown are different in each of the drawings, but these drawings show the same configuration regardless of existence or non-existence of the reference codes. The same is true also in each of the drawings used in the description above.

Figure 22:
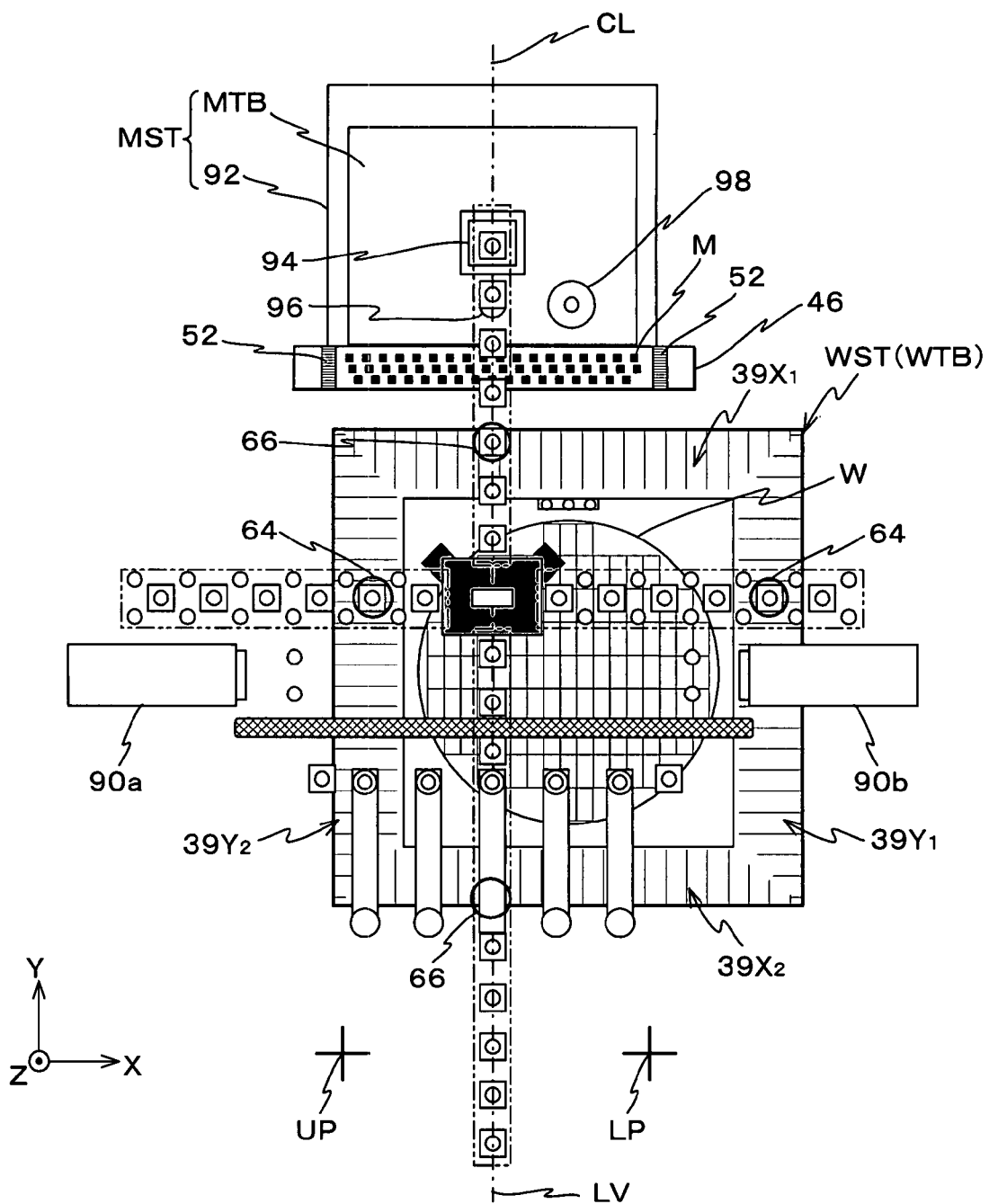
FIG. 22 is a view showing a state of the wafer stage and the measurement stage while exposure by a step-and-scan method is being performed to a wafer on the wafer stage.

FIG. 22 shows a state where exposure by a step-and-scan method is being performed to wafer W (in this case, to be a mid wafer of a certain lot (one lot containing 25 or 50 wafers), as an example) on wafer stage WST. At this point in time, measurement stage MST is moving following wafer stage WST while keeping a predetermined distance between them. Therefore, the same distance as the predetermined distance is sufficient as a moving distance of measurement stage MST that is needed when going into the contact state (or proximity state) with wafer stage WST described above after the exposure ends.

During the exposure, main controller 20 controls the position (including the θz rotation) within the XY plane of wafer table WTB (wafer stage WST) based on the measurement values of two X heads 66 indicated by being circled in FIG. 22 that face X scales $39X_1$ and $39X_2$ respectively (X encoders 70B and 70D) and two Y heads 64 indicated by being circled in FIG. 22 that face Y scales $39Y_1$ and $39Y_2$ respectively (Y encoders 70A and 70C). Further, main controller 20 controls the position in the Z-axis direction, and the θy rotation (rolling) and the θx rotation (pitching) of wafer table WTB, based on the measurement values of a pair of Z sensors $74_{1,j}$ and $74_{2,j}$, and a pair of Z sensors $76_{1,q}$ and $76_{2,q}$ that respectively face the end portions on one side and the other side in the X-axis direction of the wafer table WTB surface. Incidentally, the position in the Z-axis direction and the θy rotation (rolling) of wafer table WTB may be controlled based on the measurement values of Z sensors $74_{1,j}$ and $74_{2,j}$, and $76_{1,q}$ and $76_{2,q}$ and the θx rotation (pitching) may be controlled based on the measurement values of Y-axis interferometer 16. In either case, the control of the position in the Z-axis direction, the θy rotation and θx rotation of wafer table WTB (focus leveling control of wafer W) during the exposure is performed based on the results of the above-described focus mapping performed beforehand.

Further, during the exposure, shutters 49A and 49B are set in a state of closing openings 51A and 51B, in order to prevent wafer stage WST and measurement stage MST from coming closer together than a predetermined distance.

The foregoing exposure operation is performed by main controller 20 repeating a moving operation between shots in which wafer stage WST is moved to a scanning starting position (accelerating starting position) for exposure of each shot area on wafer W based on the result of the above-described wafer alignment (EGA) performed beforehand, the latest baselines of alignment systems AL1 and $AL2_1$ to $AL2_4$, and the like, and a scanning exposure operation in which a pattern formed on reticle R is transferred to each shot area by a scanning exposure method. Incidentally, the exposure operation described above is performed in a state where water is held in the space between tip lens 191 and wafer W. Further, the exposure operation is performed in the order from the shot area located on the −Y side to the shot area located on the +Y side in FIG. 22.

Further, main controller 20 may also accumulate the measurement values of encoders 70A to 70D and the measurement values of interferometers 16 and 126 during exposure and update the correction map described earlier as needed.

Figure 23:
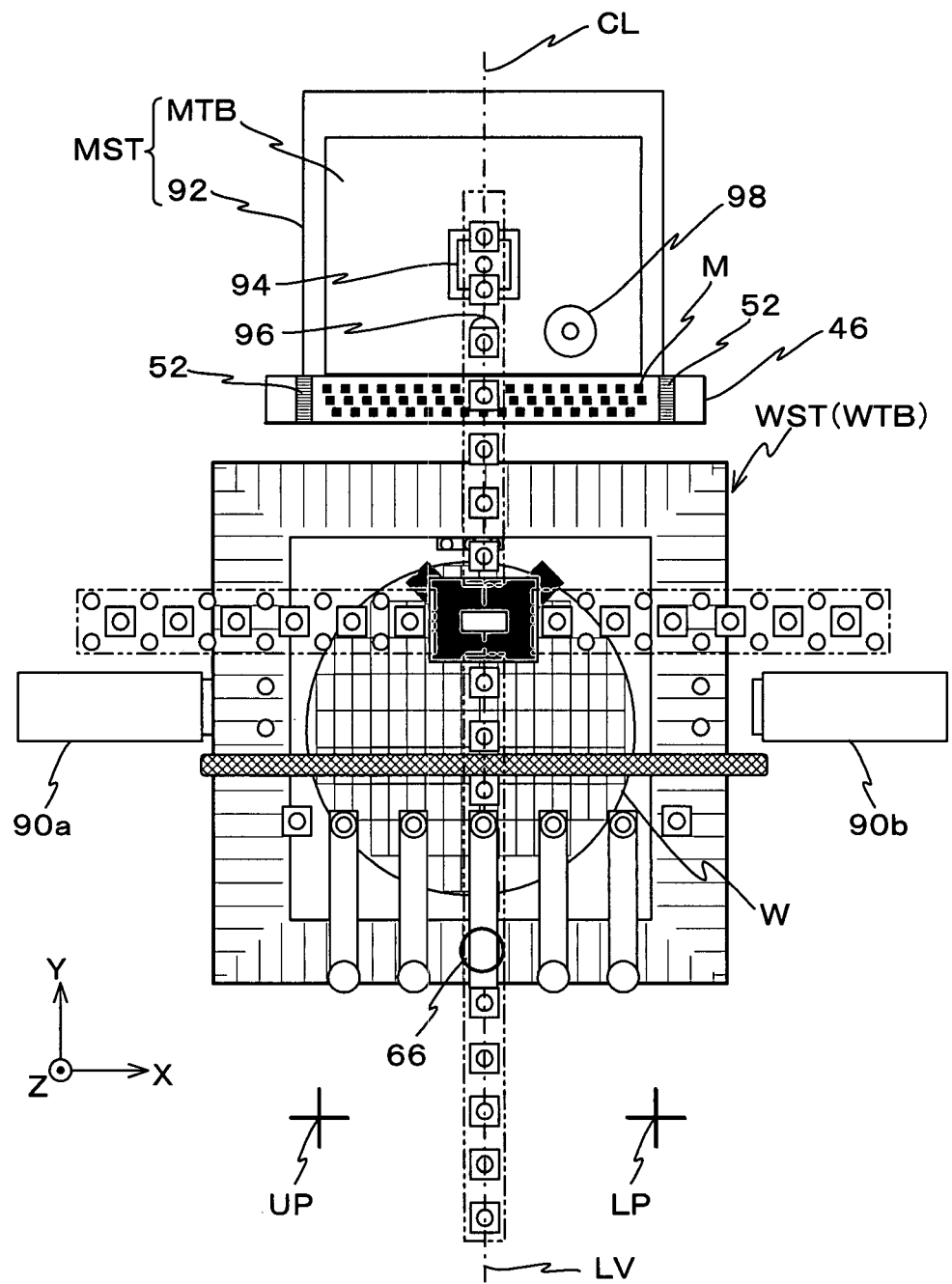
FIG. 23 is a view showing a state of the wafer stage and the measurement stage when exposure to wafer W has ended on the wafer stage WST side.
Figure 24:
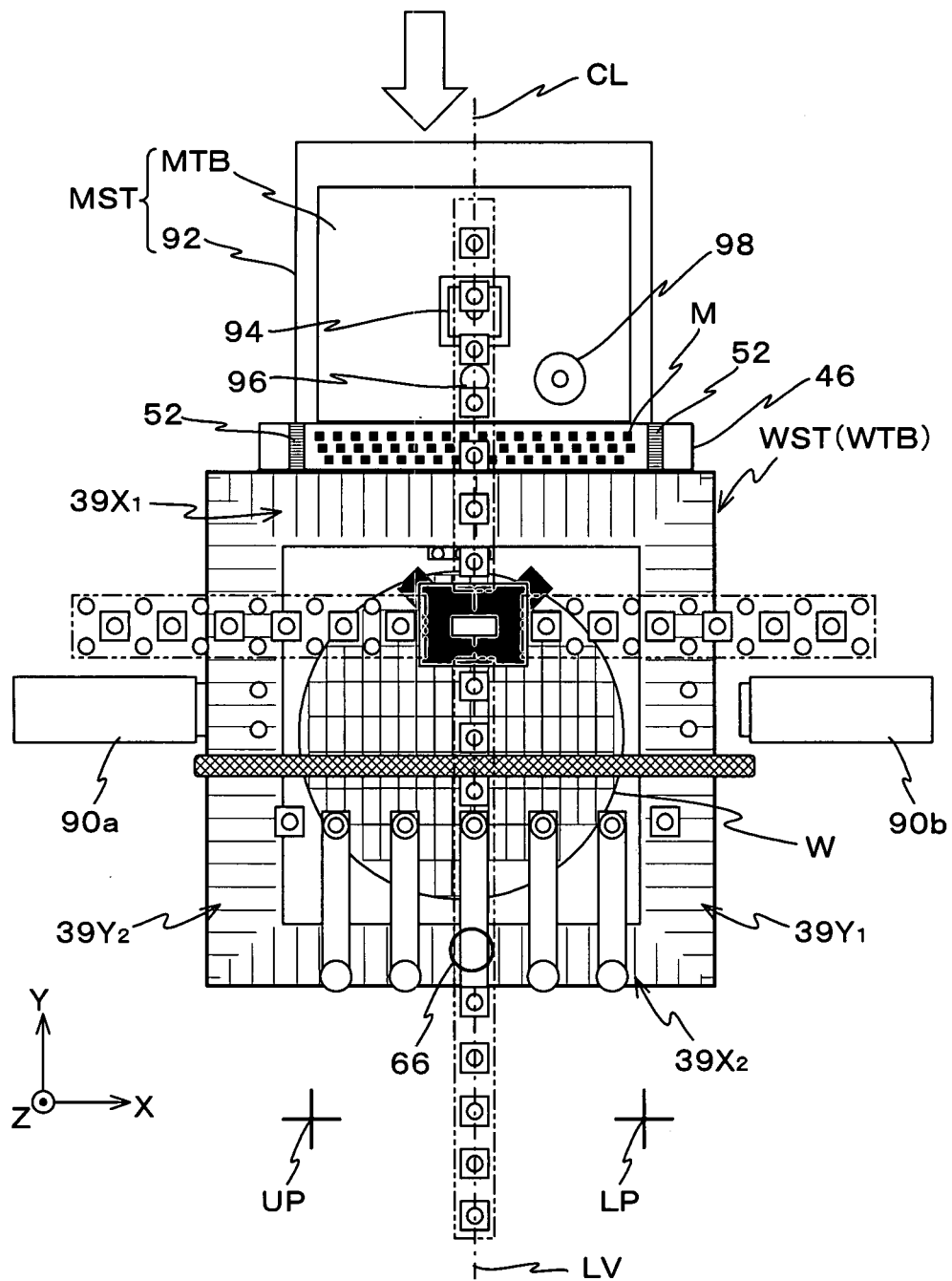
FIG. 24 is a view showing a state of the wafer stage and the measurement stage right after a state where both stages are separate has been shifted to a state where both stages are in contact with each other, after exposure ends.

Then, as is shown in FIG. 23, before exposure to wafer W ends, for example, before the last shot area is exposed when different shot areas on wafer W are sequentially exposed, main controller 20 starts the lowering drive of shutters 49A and 49B via drive mechanisms 34A and 34B, and sets openings 51A and 51B in an opened state. After confirming that shutters 49A and 49B are in a fully opened state via opening/closing sensor 101, main controller 20 moves measurement stage MST (measurement table MTB) to the position shown in FIG. 24 by controlling stage drive system 124 based on the measurement value of Y-axis interferometer 18 while maintaining the measurement value of X-axis interferometer 130 to a constant value. At this point in time, the end surface on the −Y side of CD bar 46 (measurement table MTB) and the end surface on the +Y side of wafer table WTB are in contact with each other. Incidentally, the noncontact state (proximity state) may also be kept by, for example, monitoring the measurement values of the interferometer or the encoder that measures the position of each table in the Y-axis direction and separating measurement table MTB and wafer table WTB in the Y-axis direction at a distance of around 300 μm.

Figure 25:
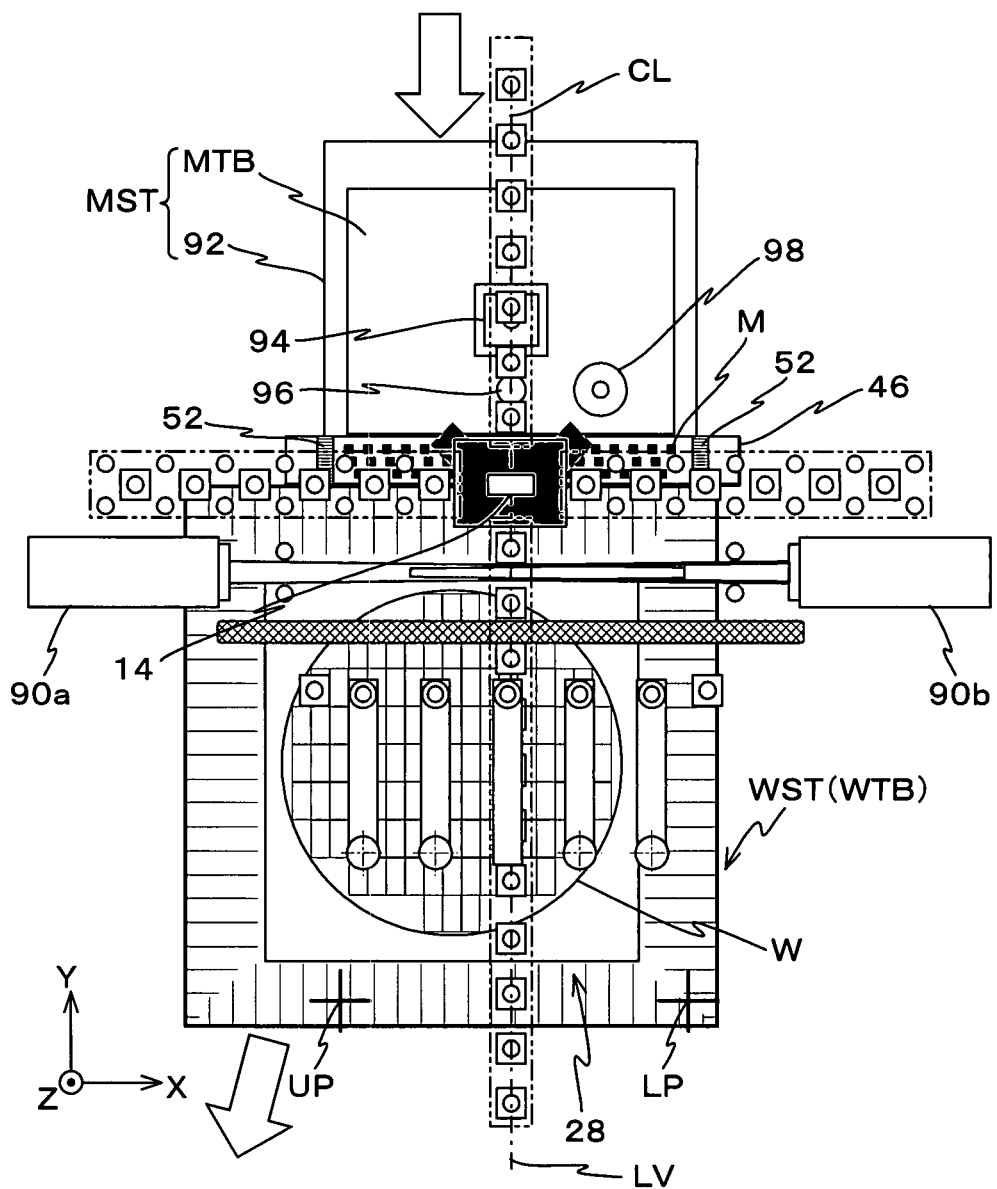
FIG. 25 is a view showing a state of both stages when the measurement stage is moving in a −Y direction and the wafer stage is moving toward an unloading position while keeping a positional relation between the wafer table and a measurement table in a Y-axis direction.

Subsequently, as is shown in FIG. 25, while keeping the positional relation in the Y-axis direction between wafer table WTB and measurement table MTB, main controller 20 starts an operation of driving measurement stage MST in the −Y direction and also starts an operation of driving wafer stage WST toward unloading position UP. When these operations are started, in the embodiment, measurement stage MST is moved only in the −Y direction, and wafer stage WST is moved in the −Y direction and −X direction.

When main controller 20 drives wafer stage WST and measurement stage MST simultaneously as is described above, water that is held in the space between tip lens 191 of projection unit PU and wafer W (water in liquid immersion area 14) sequentially moves from wafer W to plate 28, CD bar 46, and measurement table MTB, according to movement of wafer stage WST and measurement stage MST to the −Y side. Incidentally, during the foregoing movement, the contact state (or proximity state) of wafer table WTB and measurement table MTB is maintained. Incidentally, FIG. 25 shows a state right before water in liquid immersion area 14 is delivered from plate 28 to CD bar 46.

When wafer stage WST and measurement stage MST are simultaneously and slightly driven further in the −Y direction from the state of FIG. 25, position measurement of wafer stage WST (wafer table WTB) by Y encoders 70A and 70C cannot be performed. Therefore, right before that, main controller 20 switches the control of the Y-position and the θz rotation of wafer stage WST (wafer table WTB) from the control based on the measurement values of Y encoders 70A and 70C to the control based on the measurement value of Y-axis interferometer 16. Then, since after a predetermined period of time, measurement stage MST reaches a position where the Sec-BCHK (interval) described earlier is performed as is shown in FIG. 26, main controller 20 stops measurement stage MST at the position, and also drives further wafer stage WST toward unloading position UP while measuring the X-position of wafer stage WST by X head 66 indicated by being circled in FIG. 26 that faces X scale $39X_1$ (X-linear encoder 70B) and measuring the Y-position, the θz rotation and the like by Y-axis interferometer 16, and stops wafer stage WST at unloading position UP. Incidentally, in the state of FIG. 26, water is held in the space between measurement table MTB and tip lens 191.

Figure 26:
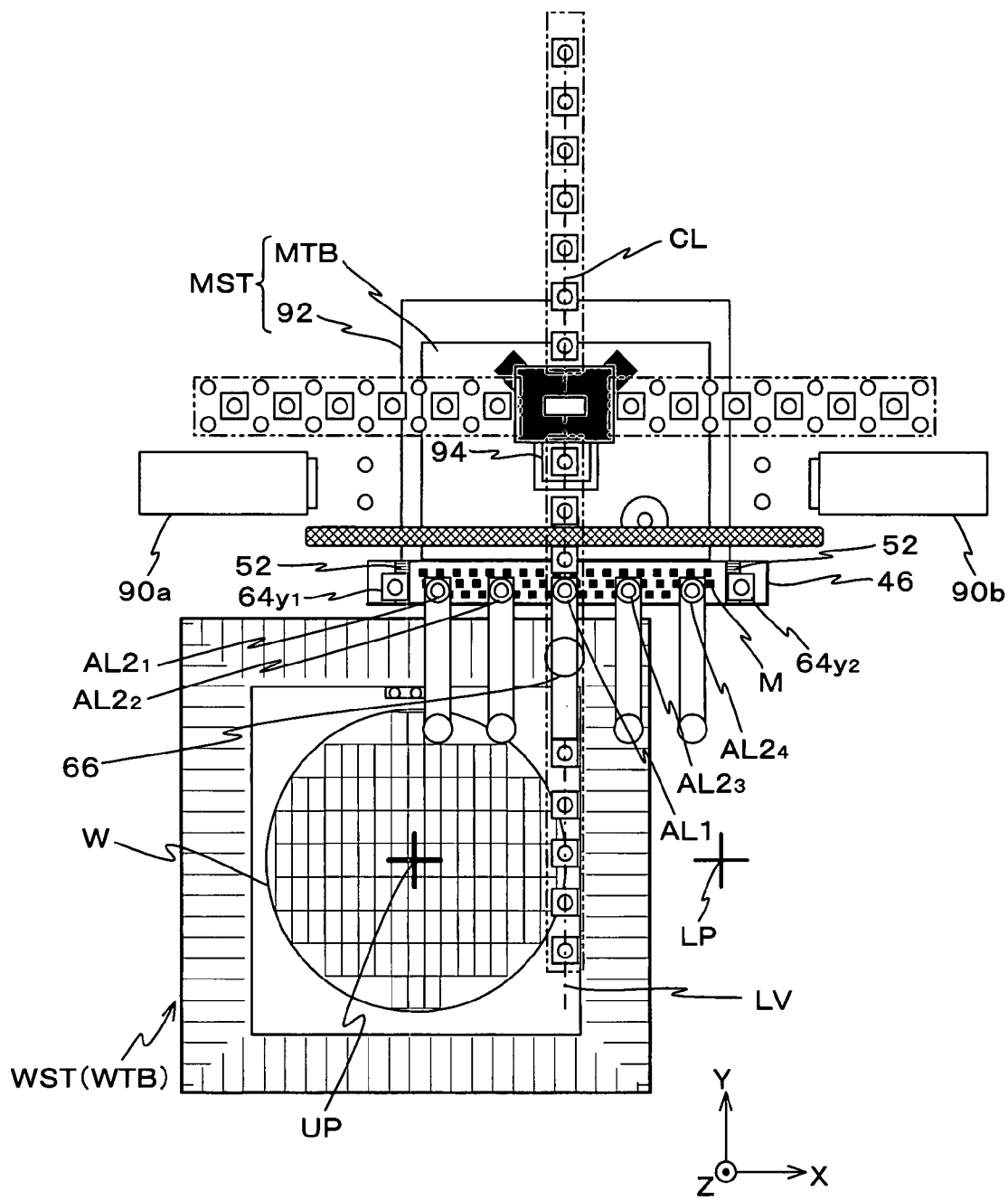
FIG. 26 is a view showing a state of the wafer stage and the measurement stage when the measurement stage has reached a position where a Sec-BCHK (interval) is performed.
Figure 27:
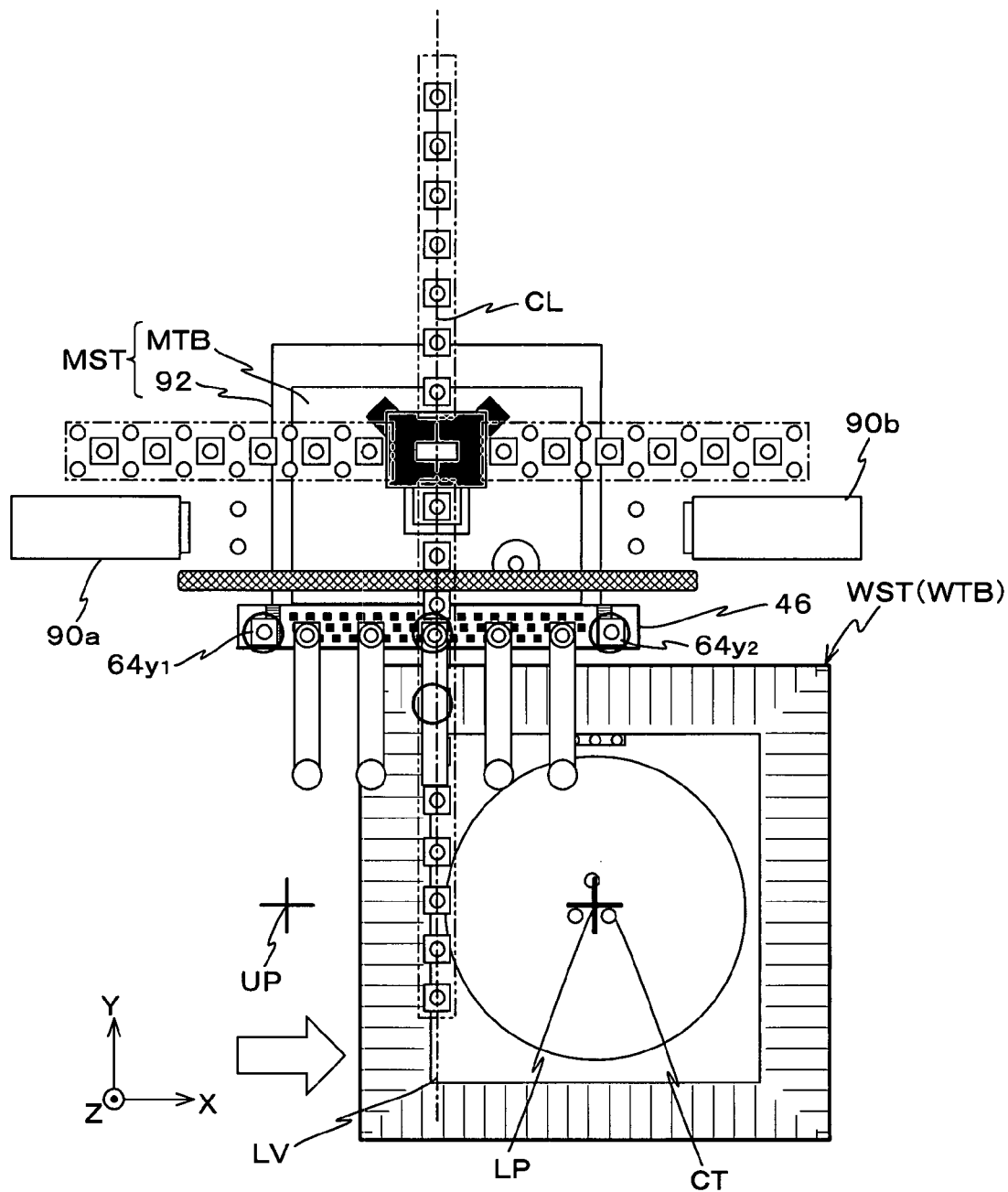
FIG. 27 is a view showing a state of the wafer stage and the measurement stage when the wafer stage has moved from the unloading position to a loading position in parallel with the Sec-BCHK (interval) being performed.

Subsequently, as is shown in FIGS. 26 and 27, main controller 20 performs the Sec-BCHK (interval) in which relative positions of four secondary alignment systems with respect to primary alignment system AL1 are measured in the procedures described previously, using CD bar 46 of measurement stage MST. In parallel with the Sec-BCHK (interval), main controller 20 gives the command and makes a drive system of an unload arm (not shown) unload wafer W on wafer stage WST that stops at unloading position UP, and also drives wafer stage WST in the +X direction to move it to loading position LP with a vertical movement pin CT (not shown in FIG. 26, refer to FIG. 27), which has been driven upward when performing the unloading, kept upward a predetermined amount. In this case, the unloading of the wafer is performed as follows: vertical movement pin CT supports wafer W from below and lifts the wafer, and the unload arm proceeds to below wafer W, and then vertical movement pin CT is slightly lowered or the unload arm is slightly raised or the like, and the wafer is delivered from vertical movement pin CT to the unload arm.

Figure 28:
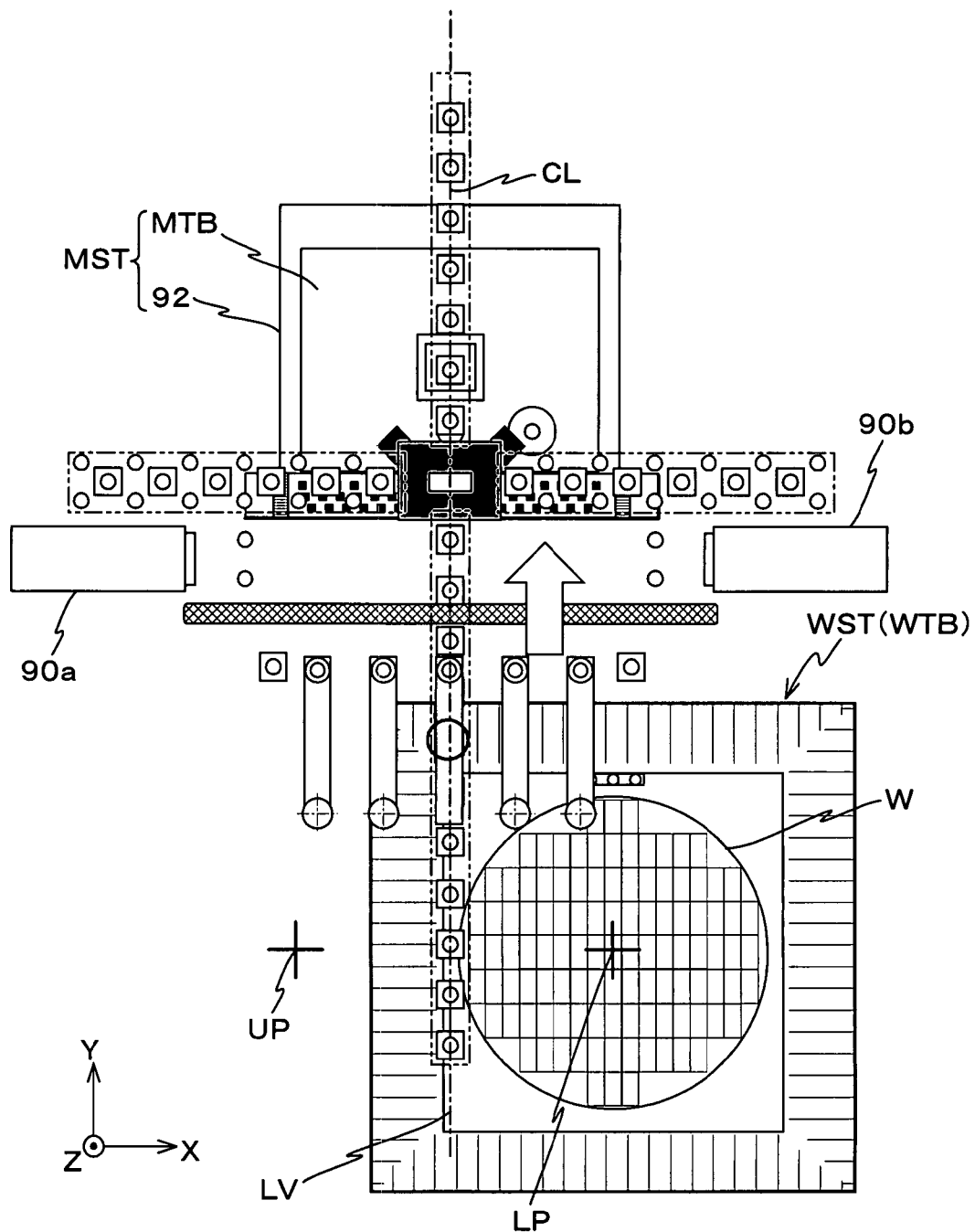
FIG. 28 is a view showing a state of the wafer stage and the measurement stage when the measurement stage has moved to an optimal scrum waiting position and a wafer has been loaded on the wafer table.

Next, as is shown in FIG. 28, main controller 20 moves measurement stage MST to an optimal waiting position (hereinafter, referred to as an "optimal scrum waiting position") used to shift a state of measurement stage MST from a state of being away from wafer stage WST to the contact state (or proximity state) with wafer stage WST described previously, and closes shutters 49A and 49B in the foregoing procedures. In parallel with this operation, main controller 20 gives the command and makes a drive system of a load arm (not shown) load new wafer W onto wafer table WTB. The loading of wafer W is performed in the following procedures: wafer W held by the load arm is delivered from the load arm to vertical movement pin CT whose state of being raised upward a predetermined amount is maintained, and after the load arm is withdrawn, wafer W is mounted onto the wafer holder by vertical movement pin CT being lowered and the wafer is sucked by a vacuum chuck (not shown). In this case, since the state where vertical movement pin CT is raised upward a predetermined amount is maintained, the wafer loading can be performed in a shorter period of time, compared with the case where vertical movement pin CT is driven downward to be housed inside the wafer holder. Incidentally, FIG. 28 shows the state where wafer W is loaded on wafer table WTB.

In the embodiment, the foregoing optimal scrum waiting position of measurement stage MST is appropriately set in accordance with the Y-coordinates of the alignment marks arranged in the alignment shot areas on the wafer. With this setting, an operation of moving measurement stage MST to the optimal scrum waiting position becomes unnecessary when the state of measurement stage MST shifts to the contact state (or proximity state) described above, and therefore, the number of movement of measurement stage MST can be decreased by one compared with the case where measurement stage MST is made to wait at a position that is away from the optimal scrum waiting position. Further, in the embodiment, as the optimal scrum waiting position described above, the optimal scrum waiting position is set so that the shift to the contact state (or proximity state) described above can be performed at a position where wafer stage WST stops for the wafer alignment described above.

Figure 29:
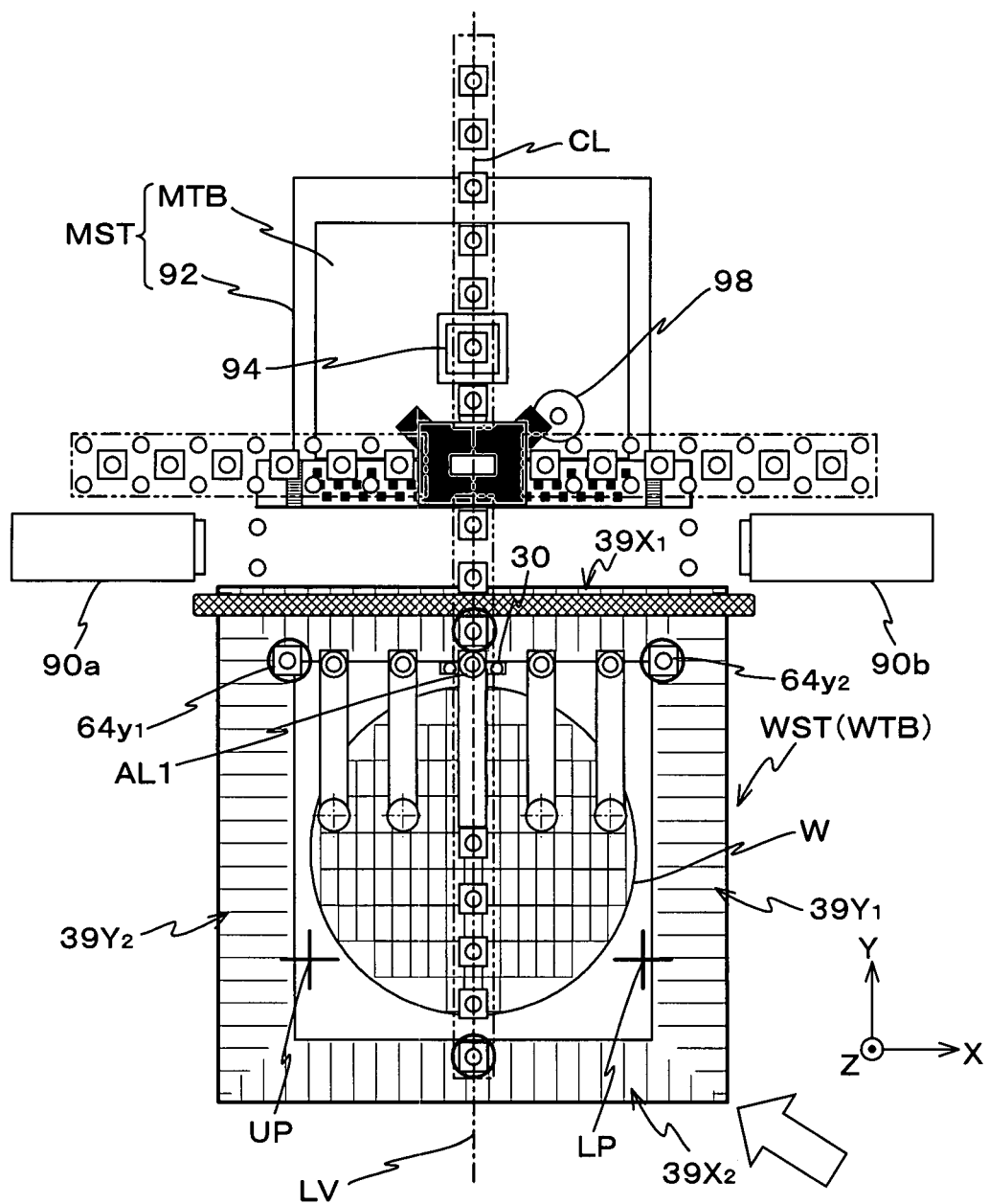
FIG. 29 is a view showing a state of both stages when the wafer stage has moved to a position where the Pri-BCHK former processing is performed while the measurement stage is waiting at the optimal scrum waiting position.

Next, as is shown in FIG. 29, main controller 20 moves wafer stage WST from loading position LP to a position with which the position of fiducial mark FM on measurement plate 30 is set within the field (detection area) of primary alignment system AL1 (i.e. the position where the foregoing Pri-BCHK former processing is performed). In the middle of the movement, main controller 20 switches control of the position within the XY plane of wafer table WTB from the control based on the measurement value of encoder 70B regarding the X-axis direction and the measurement value of Y-axis interferometer 16 regarding the Y-axis direction and the θz rotation, to the control based on the measurement values of two X heads 66 indicated by being circled in FIG. 29 that face X scales $39X_1$ and $39X_2$ (encoders 70B and 70D) and the measurement values of two Y heads $64y_2$ and $64y_1$ indicated by being circled in FIG. 29 that face Y scales $39Y_1$ and $39Y_2$ (encoders 70A and 70C).

Then, main controller 20 performs the Pri-BCHK former processing in which fiducial mark FM is detected using primary alignment system AL1. At this point in time, measurement stage MST is waiting at the optimal scrum waiting position described above.

Next, main controller 20 starts movement of wafer stage WST in the +Y direction toward a position where the alignment marks arranged in the three first alignment shot areas AS (refer to FIG. 12C) are detected, while controlling the position of wafer stage WST based on the measurement values of the four encoders described above. After starting the movement of wafer stage WST in the +Y direction, main controller 20 opens shutters 49A and 49B in the procedures described earlier, and permits the further approaching of wafer stage WST and measurement stage MST. Further, main controller 20 confirms the opening of shutters 49A and 49B based on the detection result of opening/closing sensor 101.

Figure 30:
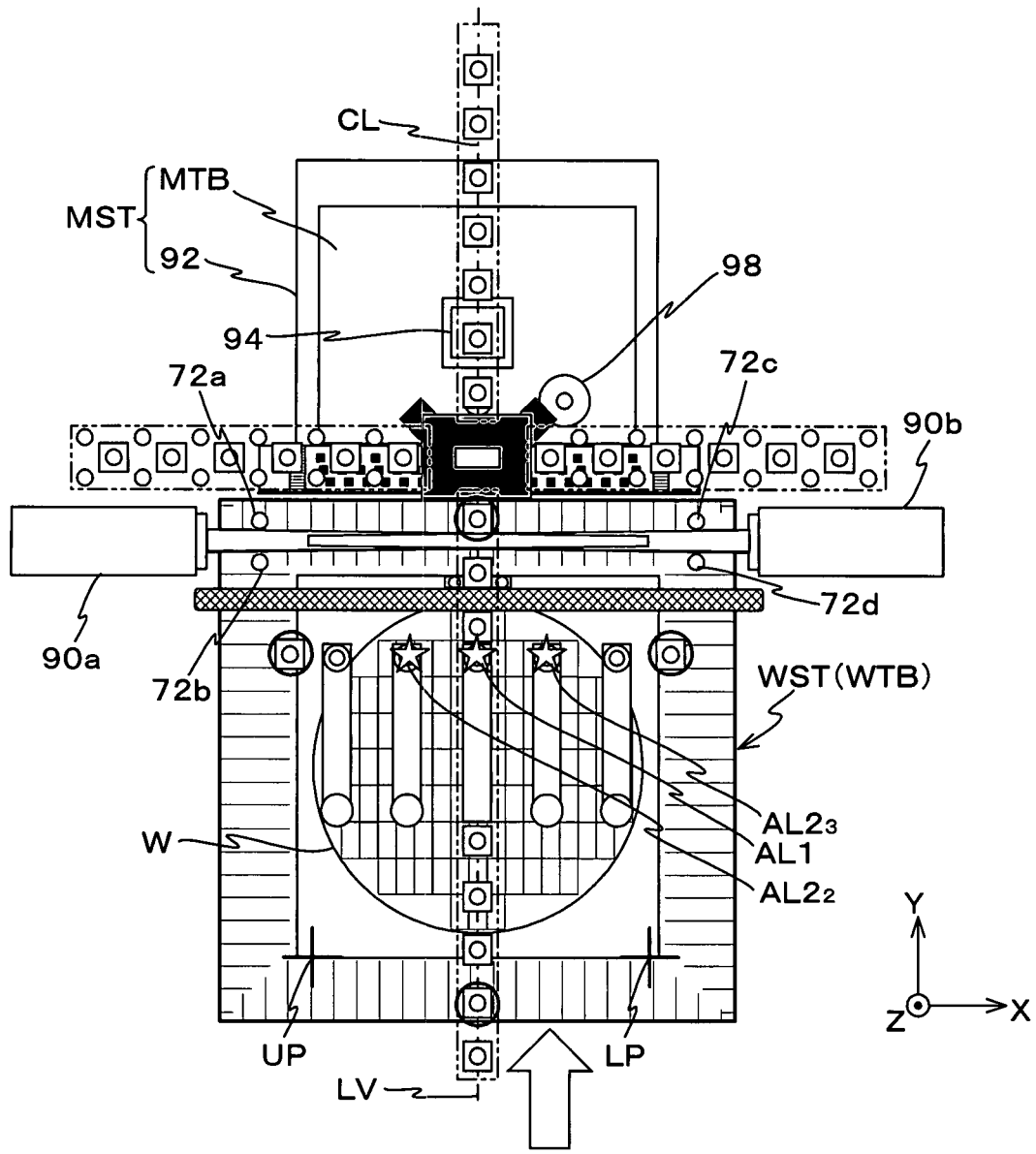
FIG. 30 is a view showing a state of the wafer stage and the measurement stage when alignment marks arranged in three first alignment shot areas are being simultaneously detected using alignment systems AL1, $AL2_2$ and $AL2_3$.

Then, when wafer stage WST reaches the position shown in FIG. 30, main controller 20 detects that wafer stage WST and measurement stage MST come into contact with each other (or come closer together at a distance of around 300 μm), based on the outputs of collision detection sensors 43B and 43D, and immediately stops wafer stage WST. Prior to this operation, main controller 20 activates (turns ON) Z sensors $72a$ to $72d$ and starts measurement of the Z-position and the tilt (the θy rotation and the θx rotation) of wafer table WTB at the point in time when all of or part of Z sensors $72a$ to $72d$ face(s) wafer table WTB, or before that point in time.

After the stop of wafer stage WST, main controller 20 almost simultaneously and individually detects the alignment marks arranged in the three first alignment shot areas AS (refer to star-shaped marks in FIG. 30) using primary alignment system AL1 and secondary alignment systems $AL2_2$ and $AL2_3$, and links the detection results of three alignment systems AL1, $AL2_2$ and $AL2_3$ and the measurement values of the four encoders at the time of the detection, and stores them in a memory (not shown). Incidentally, the simultaneous detection of the alignment marks arranged in the three first alignment shot areas AS in this case is performed while changing the relative positional relation in the Z-axis direction (focus direction) between a plurality of alignment systems AL1 and $AL2_1$ to $AL2_4$ and wafer W mounted on wafer table WTB by changing the Z-position of wafer table WTB, as is described previously.

As is described above, in the embodiment, the shift to the contact state (or proximity state) of measurement stage MST and wafer stage WST is completed at the position where detection of the alignment marks in the first alignment shot areas AS is performed, and from the position, the movement in the +Y direction (step movement toward a position where the alignment marks arranged in the five second alignment shot areas AS are detected as described previously) of both stages WST and MST in the contact state (or proximity state) is started by main controller 20. Prior to the start of movement in the +Y direction of both stages WST and MST, as is shown in FIG. 30, main controller 20 starts irradiation of detection beams of the multipoint AF system (90a, 90b) to wafer table WTB. With this operation, the detection area of the multipoint AF system is formed on wafer table WTB.

Figure 31:
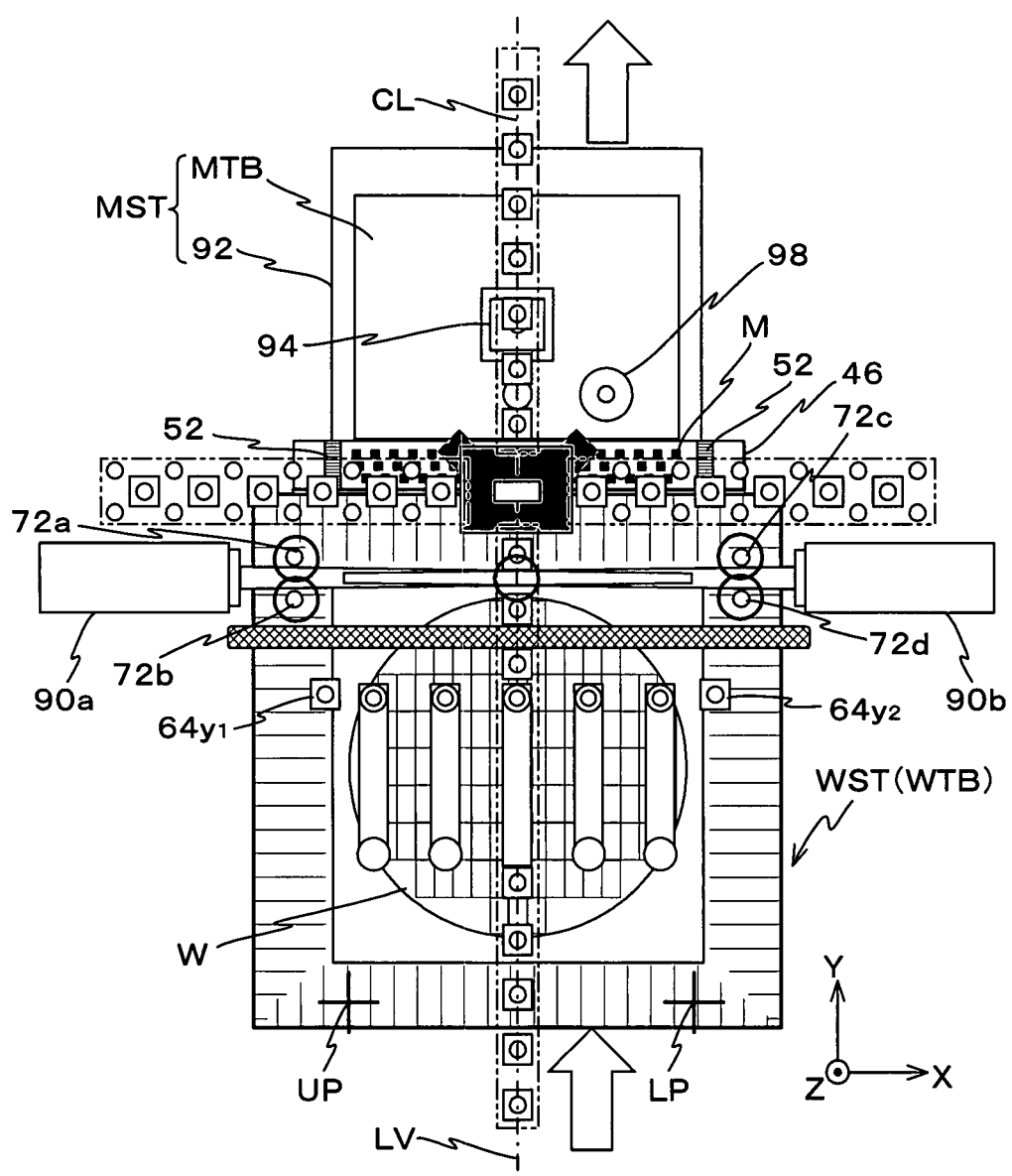
FIG. 31 is a view showing a state of the wafer stage and the measurement stage when the focus calibration former processing is being performed.

Then, during the movement of both stages WST and MST in the +Y direction, when both stages WST and MST reach the position shown in FIG. 31, main controller 20 performs the focus calibration former processing described above, and obtains a relation between the measurement values of Z sensors 72a, 72b, 72c and 72d (surface position information at the end portions on one side and the other side in the X-axis direction of wafer table WTB) and the detection result (surface position information) of the measurement plate 30 surface by the multipoint AF system (90a, 90b) in a state where the centerline of wafer table WTB coincides with straight line LV. At this point in time, liquid immersion area 14 is formed near the boundary between CD bar 46 and wafer table WTB. That is, water in liquid immersion area 14 is about to be delivered from CD bar 46 to wafer table WTB.

Figure 32:
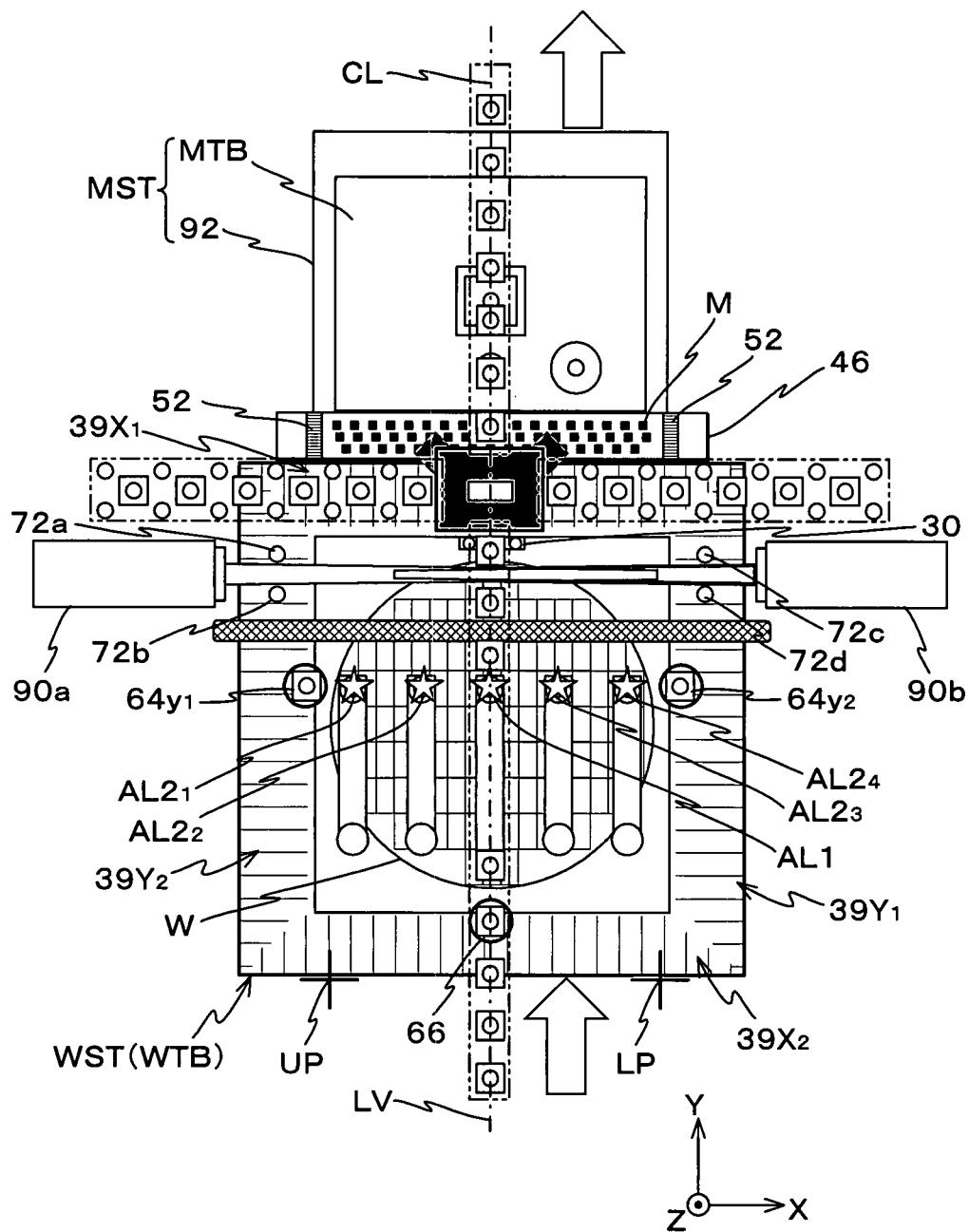
FIG. 32 is a view showing a state of the wafer stage and the measurement stage when alignment marks arranged in five second alignment shot areas are being simultaneously detected using alignment systems AL1 and $AL2_1$ to $AL2_4$.

Then, when both stages WST and MST further move in the +Y direction while keeping their contact state (or proximity state) and reach the position shown in FIG. 32, main controller 20 almost simultaneously and individually detects the alignment marks arranged in the five second alignment shot areas AS (refer to star-shaped marks in FIG. 32) using five alignment systems $AL_1$ and $AL2_1$ to $AL2_4$, links the detection results of five alignment systems $AL_1$ and $AL2_1$ to $AL2_4$ and the measurement values of the four encoders at the time of the detection, and stores them in a memory (not shown). Incidentally, the simultaneous detection of the alignment marks arranged in the five second alignment shot areas AS in this case is also performed while changing the Z-position of wafer table WTB, as is described earlier.

Further, at this point in time, since the X head that faces X scale $39X_1$ and is located on straight line LV does not exist, main controller 20 controls the position within the XY plane of wafer table WTB based on the measurement values of X head 66 facing X scale $39X_2$ (X linear encoder 70D) and Y linear encoders 70A and 70C.

As is described above, in the embodiment, position information (two-dimensional position information) of eight alignment marks in total can be detected at the point in time when detection of the alignment marks in the second alignment shot areas AS ends. Then, at this stage, main controller 20 obtains the scaling (shot magnification) of wafer W by, for example, performing a statistical computation by the EGA method described above using the position information, and based on the computed shot magnification, main controller 20 may also adjust optical properties of projection optical system PL, for example, the projection magnification. In the embodiment, optical properties of projection optical system PL are adjusted by controlling adjusting unit 68 (refer to FIG. 8) that adjusts the optical properties of projection optical system PL, by driving a specific movable lens constituting projection optical system PL or changing the pressure of gas inside the airtight room that is formed between specific lenses constituting projection optical system PL, or the like. That is, at the stage where alignment systems AL1 and $AL2_1$ to $AL2_4$ have ended detection of the predetermined number (eight, in this case) of the marks on wafer W, main controller 20 may also control adjusting unit 68 so that adjusting unit 68 adjusts the optical properties of projection optical system PL based on the detection results. Incidentally, the number of marks is not limited to eight, or a half of the total number of marks subject to detection, but only has to be the number, for example, required for computing the scaling of the wafer or the like.

Further, after the simultaneous detection of the alignment marks arranged in the five second alignment shot areas AS ends, main controller 20 starts again movement in the +Y direction of both stages WST and MST in the contact state (or proximity state), and at the same time, starts the focus mapping described earlier using Z sensors 72a to 72d and the multipoint AF system (90a, 90b), as is shown in FIG. 32.

Then, when both stages WST and MST reach the position with which measurement plate 30 is located directly below projection optical system PL shown in FIG. 33, main controller 20 performs the Pri-BCHK latter processing described earlier and the focus calibration latter processing described earlier.

Then, main controller 20 computes the baseline of primary alignment system AL1 based on the result of the Pri-BCHK former processing described earlier and the result of the Pri-BCHK latter processing. Along with this operation, based on a relation between the measurement values of Z sensors 72a, 72b, 72c and 72d (surface position information at the end portions on one side and the other side in the X-axis direction of wafer table WTB) and the detection result (surface position information) of the measurement plate 30 surface by the multipoint AF system (90a, 90b) that has been obtained in the focus calibration former processing, and based on the measurement values of Z sensors $74_{1,4}$, $74_{2,4}$, $76_{1,3}$ and $76_{2,3}$ (i.e. surface position information at the end portions on one side and the other side in the X-axis direction of wafer table WTB) corresponding to the best focus position of projection optical system PL that have been obtained in the focus calibration latter processing, main controller 20 obtains the offset at a representative detection point of the multipoint AF system (90a, 90b), and adjusts the detection origin of the multipoint AF system in the optical method described previously so that the offset becomes zero.

In this case, from the viewpoint of throughput, only one of the Pri-BCHK latter processing and the focus calibration latter processing may be performed, or the procedure may shift to the next processing without performing both processings. As a matter of course, in the case the Pri-BCHK latter processing is not performed, the Pri-BCHK former processing does not need to be performed either. And, in this case, main controller 20 only has to move wafer stage WST from loading position LP to a position at which the alignment marks arranged in the first alignment shot areas AS are detected.

Figure 33:
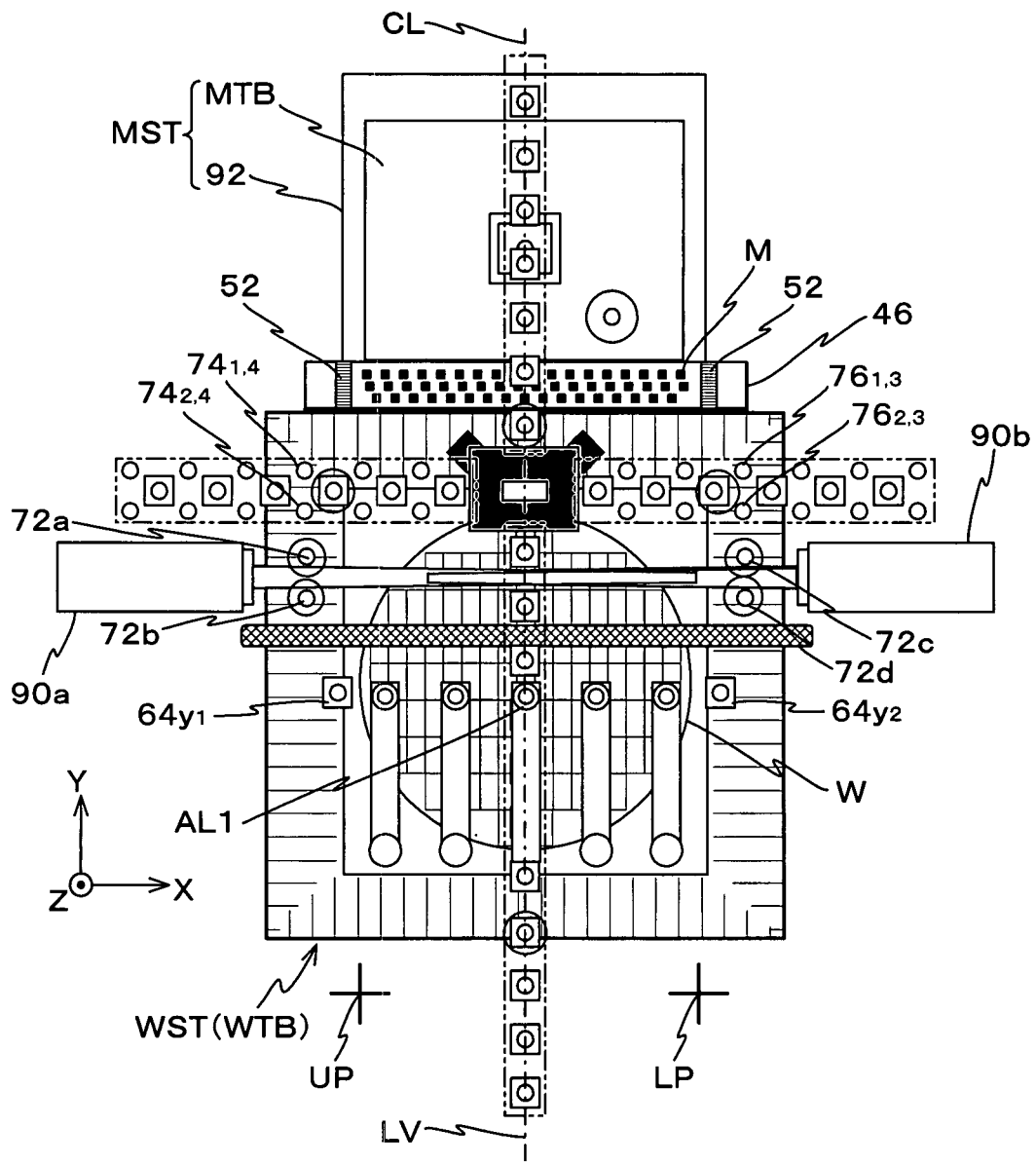
FIG. 33 is a view showing a state of the wafer stage and the measurement stage when at least one of the Pri-BCHK latter processing and the focus calibration latter processing is being performed.

Incidentally, in the state of FIG. 33, the focus mapping is being continued.

Figure 34:
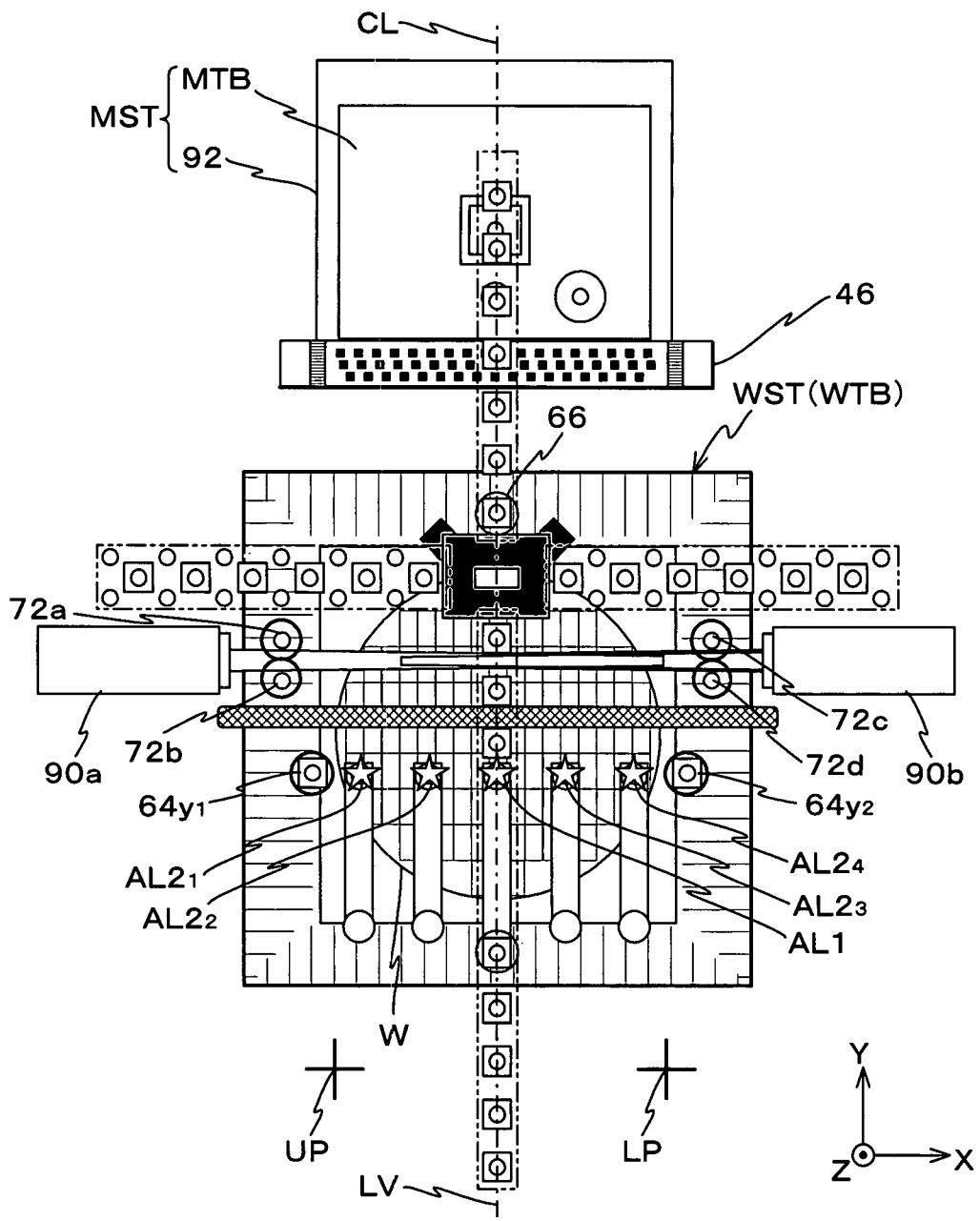
FIG. 34 is a view showing a state of the wafer stage and the measurement stage when alignment marks arranged in five third alignment shot areas are being simultaneously detected using alignment systems AL1 and $AL2_1$ to $AL2_4$.

When wafer stage WST reaches the position shown in FIG. 34 by movement in the +Y direction of both stages WST and MST in the contact state (or proximity state) described above, main controller 20 stops wafer stage WST at that position, and also continues the movement of measurement stage MST in the +Y direction without stopping it. Then, main controller 20 almost simultaneously and individually detects the alignment marks arranged in the five third alignment shot areas AS (refer to star-shaped marks in FIG. 34) using five alignment systems AL1 and $AL2_1$ to $AL2_4$, links the detection results of five alignment systems AL1 and $AL2_1$ and $AL2_4$ and the measurement values of the four encoders at the time of the detection and stores them in a memory (not shown). Incidentally, the simultaneous detection of the alignment marks arranged in the five third alignment shot areas AS in this case is also performed while changing the Z-position of wafer table WTB, as is described previously. Further, also at this point in time, the focus mapping is being continued.

On the other hand, after a predetermined period of time from the stop of wafer stage WST described above, shock absorbers 47A and 47B withdraw from openings 51A and 51B formed at X-axis stator 80, and the state of measurement stage MST and wafer stage WST shifts from the contact state (or proximity state) to the separation state. After the shift to the separation state, main controller 20 sets openings 51A and 51B in a closed state by driving shutters 49A and 49B upward via drive mechanisms 34A and 34B, and when measurement stage MST reaches an exposure start waiting position where measurement stage MST waits until exposure is started, main controller 20 stops measurement stage MST at the position.

Next, main controller 20 starts movement of wafer stage WST in the +Y direction toward a position at which the alignment marks arranged in the three fourth alignment shot areas AS are detected. At this point in time, the focus mapping is being continued. Meanwhile, measurement stage MST is waiting at the exposure start waiting position described above.

Figure 35:
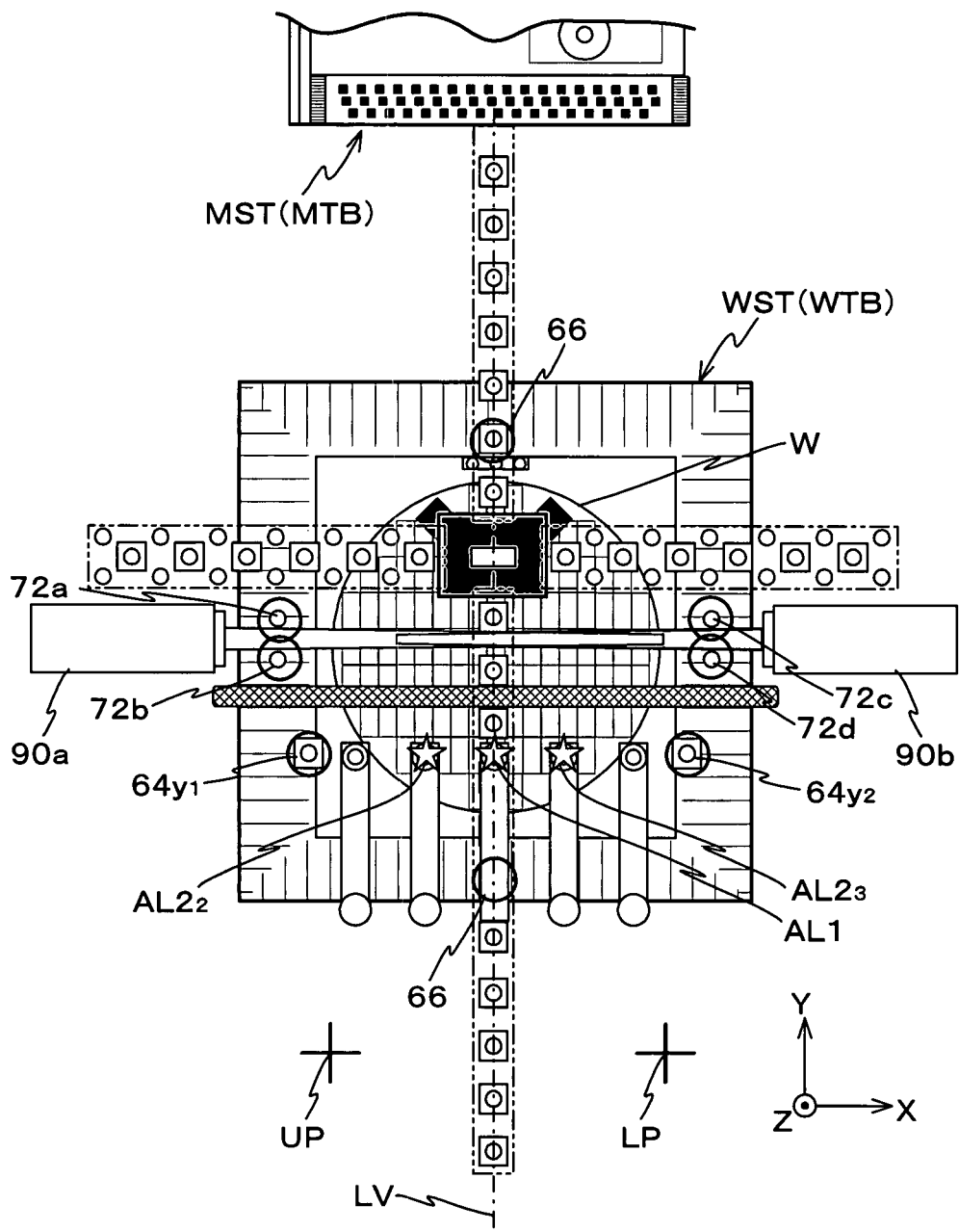
FIG. 35 is a view showing a state of the wafer stage and the measurement stage when alignment marks arranged in three fourth alignment shot areas are being simultaneously detected using alignment systems AL1, $AL2_2$ and $AL2_3$.

Then, when wafer stage WST reaches the position shown in FIG. 35, main controller 20 immediately stops wafer stage WST, and almost simultaneously and individually detects the alignment marks arranged in the three fourth alignment shot areas AS on wafer W (refer to star-shaped marks in FIG. 35) using primary alignment system AL1 and secondary alignment systems $AL2_2$ and $AL2_3$, links the detection results of three alignment systems AL1, $AL2_2$ and $AL2_3$ and the measurement values of the four encoders at the time of the detection, and stores them in a memory (not shown). Incidentally, the simultaneous detection of the alignment marks arranged in the three fourth alignment shot areas AS in this case is also performed while changing the Z-position of wafer table WTB, as is described previously. Also at this point in time, the focus mapping is being continued, and measurement stage MST is still waiting at the exposure start waiting position. Then, main controller 20 computes array information (coordinate values) of all the shot areas on wafer W on the XY coordinate system that is set by the measurement axes of the four encoders, for example, by performing a statistical computation by the EGA method described earlier, using the detection results of 16 alignment marks in total obtained as is described above and the corresponding measurement values of the four encoders.

Figure 36:
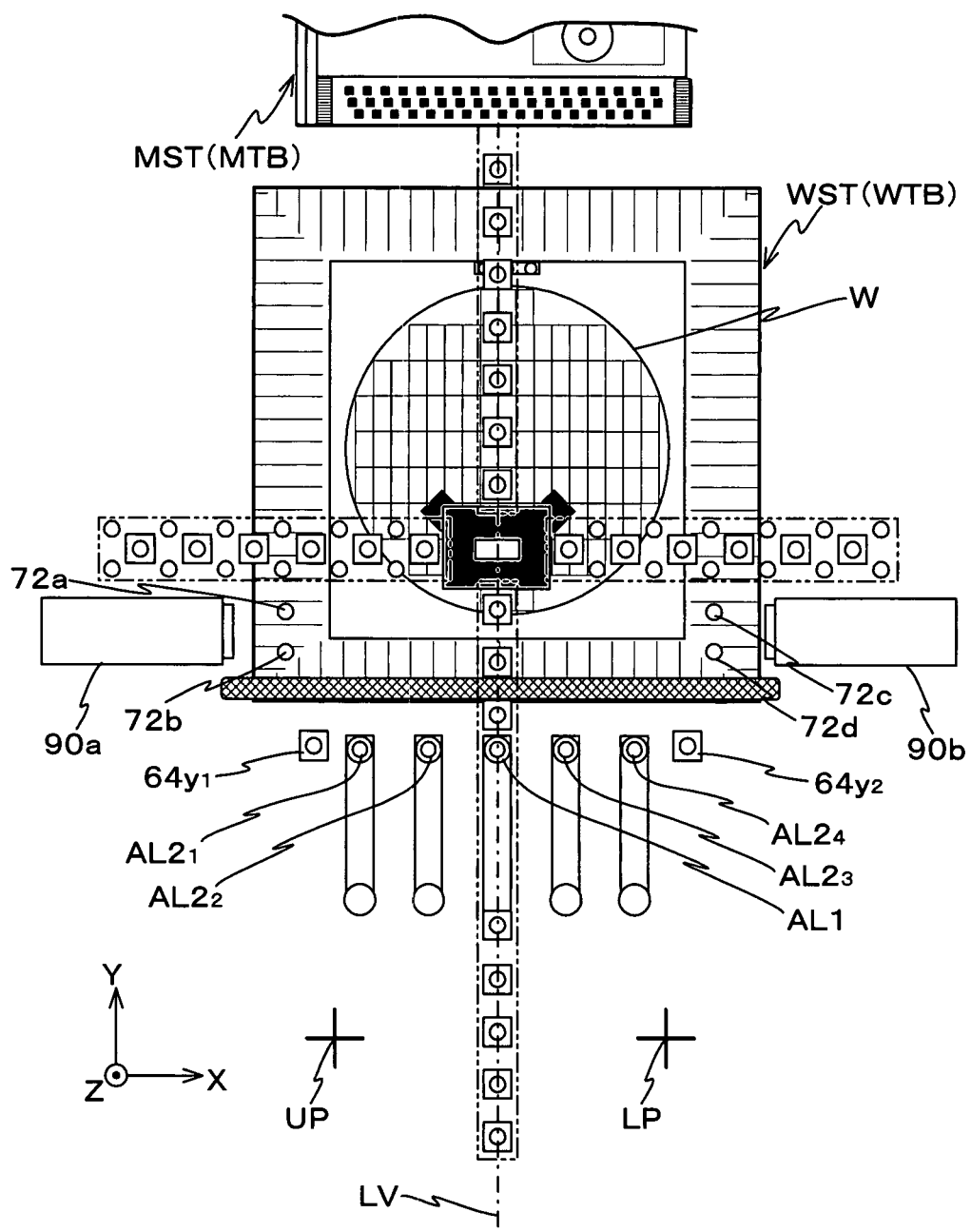
FIG. 36 is a view showing a state of the wafer stage and the measurement stage when the focus mapping has ended.

Next, main controller 20 continues the focus mapping while moving wafer stage WST in the +Y direction again. Then, when the detection beam from the multipoint AF system (90a, 90b) begins to miss the wafer W surface, as is shown in FIG. 36, main controller 20 ends the focus mapping. After that, based on the result of the foregoing wafer alignment (EGA), the latest measurement results of the baselines of five alignment systems $AL1$ and $AL2_1$ to $AL2_4$, and the like, main controller 20 performs exposure by a step-and-scan method in a liquid immersion exposure method and sequentially transfers a reticle pattern to a plurality of shot areas on wafer W. Afterwards, the similar operations are repeatedly performed to the remaining wafers within the lot.

As is described above, according to the embodiment, a partial section of aerial image measuring unit 45 is arranged at wafer table WTB (wafer stage WST) and part of the remaining section is arranged at measurement stage MST, and aerial image measuring unit 45 measures an aerial image of a measurement mark formed by projection optical system PL. Therefore, for example, at the time of the focus calibration described previously, when aerial image measuring unit 45 measures the best focus position of projection optical system PL, the measurement can be performed using the position of wafer table WTB (wafer stage WST), at which a partial section of aerial image measuring unit 45 is arranged, in a direction parallel to the optical axis of projection optical system PL as a datum of the best focus position. Accordingly, when exposing a wafer with illumination light IL, the position of wafer table WTB (wafer stage WST) in a direction parallel to the optical axis of projection optical system PL is adjusted with high precision based on the measurement result of the best focus position. Further, since only a partial section of aerial image measuring unit 45 is arranged at wafer table WTB (wafer stage WST), wafer table WTB (wafer stage WST) is not increased in size and the position controllability can favorably be secured. Incidentally, the whole remaining section of aerial image measuring unit 45 does not have to be arranged at measurement stage MST, but the remaining section may also be arranged partially at measurement stage MST and outside the measurement stage MST, respectively.

Further, according to the embodiment, Y-axis interferometer 18 and X-axis interferometer 130 measure position information of measurement stage MST, and four linear encoders 70A to 70D measure position information of wafer table WTB (wafer stage WST). Herein, linear encoders 70A to 70D are reflective encoders that include a plurality of gratings (i.e. Y scales $39Y_1$ and $39Y_2$, or X scales $39X_1$ and $39X_2$) that are placed on wafer table WTB and have a grating in a predetermined pitch whose periodic direction is a direction parallel to the Y-axis or the X-axis respectively, and a plurality of heads (Y heads 64 or X heads 66) to which scales $39Y_1$, $39Y_2$, $39X_1$ and $39X_2$ are placed facing. Therefore, in linear encoders 70A to 70D, the optical path length of the beam irradiated from each head to the facing scale (grating) is much shorter, compared with those of Y-axis interferometer 18 and X-axis interferometer 130, and therefore, the beam is difficult to be affected by air fluctuations, and short-term stability of the measurement values is superior to those of Y-axis interferometer 18 and X-axis interferometer 130. Accordingly, it becomes possible to stably perform position control of wafer table WTB (wafer stage WST) holding a wafer.

Further, according to the embodiment, the placement distance in the X-axis direction between a plurality of Y heads 64 whose measurement direction is the Y-axis direction is narrower than a width in the X-axis direction of Y scale $39Y_1$ or $39Y_2$, and the placement distance in the Y-axis direction between a plurality of X heads 66 whose measurement direction is the X-axis direction is narrower than a width in the Y-axis direction of X scale $39X_1$ or $39X_2$. Therefore, when moving wafer table WTB (wafer stage WST), the Y-position of wafer table WTB (wafer stage WST) can be measured based on the measurement values of Y linear encoder 70A or 70C that irradiates detection lights (beams) to Y scale $39Y_1$ or $39Y_2$, while sequentially switching a plurality of Y heads 64, and in parallel with this operation, the X-position of wafer table WTB (wafer stage WST) can be measured based on the measurement values of X linear encoder 70B or 70D that irradiates detection lights (beams) to X scale $39X_1$ or $39X_2$, while sequentially switching a plurality of X heads 66.

Further, according to the embodiment, when moving wafer table WTB (wafer stage WST) in the Y-axis direction for obtaining the correction information on grating pitch of the scales described above, main controller 20 obtains correction information (correction information on grating warp) used to correct warp of each grating line 37 that constitutes X scales $39X_1$ and $39X_2$, in the procedures described previously. Then, while correcting the measurement values obtained from head units 62B and 62D based on the Y-position information of wafer table WTB (wafer stage WST) and the correction information on grating warp of X scales $39X_1$ and $39X_2$, (and the correction information on grating pitch), main controller 20 performs the driving of wafer table WTB (wafer stage WST) in the X-axis direction using X scales $39X_1$ and $39X_2$ and head units 62B and 62D. Accordingly, it becomes possible to accurately perform the driving of wafer table WTB (wafer stage WST) in the X-axis direction using head units 62B and 62D that use X scales $39X_1$ and $39X_2$ (encoders 70B and 70D), without being affected by the warp of each grating constituting X scales $39X_1$ and $39X_2$. Further, by performing the similar operation to the above operation also with respect to the Y-axis direction, the driving of wafer table WTB (wafer stage WST) in the Y-axis direction can also be performed with good accuracy.

Further, according to the embodiment, while wafer stage WST is moving linearly in the Y-axis direction, surface position information of the wafer W surface is detected by the multipoint AF system (90a, 90b) having a plurality of detection points that are set at a predetermined distance in the X-axis direction, and also the alignment marks whose positions are different from one another on wafer W are detected by a plurality of alignment systems AL1 and $AL2_1$ to $AL2_4$ having the detection areas that are arrayed in a line along the X-axis direction. In other words, only by wafer stage WST (wafer W) linearly passing though the plurality of detection points (detection area AF) of the multipoint AF system (90a, 90B) and the detection areas of a plurality of alignment systems AL1 and $AL2_1$ to $AL2_4$, detection of surface position information on the substantially entire surface of wafer W and detection of all the alignment marks to be detected on wafer W (e.g. the alignment marks in the alignment shot areas in the EGA) are finished, and therefore, the throughput can be improved, compared with the case where a detection operation of alignment marks and a detection operation of surface position information (focus information) are independently (separately) performed.

In the embodiment, as is obvious from the description of the parallel processing operations using wafer stage WST and measurement stage MST described above, in the middle of movement of wafer stage WST from the loading position toward the exposure position (exposure area IA) (i.e. during the movement of wafer stage WST in the Y-axis direction), main controller 20 makes a plurality of alignment systems AL1 and $AL2_1$ to $AL2_4$ simultaneously detect a plurality of the marks (alignment marks in the alignment shot areas) whose positions in the X-axis direction are different on wafer W, and also makes the multipoint AF system (90a, 90B) detect surface position information of wafer W that passes through the detection areas of the plurality of alignment systems according to the movement of wafer stage WST in the Y-axis direction. Therefore, the throughput can be improved, compared with the case where a detection operation of alignment marks and a detection operation of surface position information (focus information) are independently performed. Incidentally, in the embodiment, the loading position and the exposure position are to be different in the X-axis direction, but the positions in the X-axis direction may also be substantially the same. In this case, wafer stage WST can be moved substantially linearly from the loading position to the detection areas of the alignment systems (and the multipoint AF system). Further, the loading position and the unloading position may be the same position.

Further, according to the embodiment, while measuring the position in the Y-axis direction and the θz rotation (yawing) of wafer table WTB (wafer stage WST) based on the measurement values of a pair of Y heads $64y_2$ and $64y_1$ facing a pair of Y scales $39Y_1$ and $39Y_2$ respectively (a pair of Y-axis linear encoders 70A and 70C), wafer table WTB (wafer stage WST) can be moved in the Y-axis direction. Further, in this case, since movement of wafer table WTB (wafer stage WST) in the Y-axis direction can be realized in a state where the relative positions in the X-axis direction of secondary alignment systems $AL2_1$ to $AL2_4$ with respect to primary alignment system AL1 are adjusted according to the array (such as the size) of the shot areas formed on wafer W, the alignment marks in a plurality of shot areas (e.g. alignment shot areas) whose positions in the Y-axis direction are the same and whose positions in the X-axis direction are different on wafer W can be measured simultaneously by a plurality of alignment systems AL1 and $AL2_1$ to $AL2_4$.

Further, according to the embodiment, main controller 20 detects the alignment marks on wafer W using alignment systems AL1 and $AL2_1$ to $AL2_4$, while controlling the position of wafer table WTB (wafer stage WST) based on the measurement values by the encoder system (Y linear encoders 70A and 70C, X linear encoders 70B and 70D). In other words, the alignment marks on wafer W can be detected using alignment systems AL1 and $AL2_1$ to $AL2_4$ while controlling the position of wafer table WTB (wafer stage WST) with high precision based on the measurement values of Y heads 64 facing Y scales $39Y_1$ and $39Y_2$ respectively (Y linear encoders 70A and 70C) and X heads 66 facing X scales $39X_1$ and $39X_2$ respectively (X linear encoders 70B and 70D).

Further, according to the embodiment, the number of detection points (the number of measurement points) of the alignment marks on wafer W that are simultaneously detected by alignment systems AL1 and $AL2_1$ to $AL2_4$ differs depending on the position within the XY plane of wafer table WTB (wafer stage WST). Therefore, for example, at the time of the foregoing wafer alignment or the like, when moving wafer table WTB (wafer stage WST) in a direction intersecting the X-axis, for example, in the Y-axis direction, it becomes possible to simultaneously detect the alignment marks whose positions are different from one another on wafer W using the required number of alignment systems, in accordance with the position of wafer table WTB (wafer stage WST) in the Y-axis direction, in other words, in accordance with the placement (layout) of the shot areas on wafer W.

Further, according to the embodiment, at the stage where the alignment marks on wafer W to be detected by the alignment systems remain (e.g. at the point in time when detection of the alignment marks arranged in the second alignment shot areas AS ends), in some cases, main controller 20 controls adjusting unit 68 so that adjusting unit 68 adjusts the optical properties of projection optical system PL based on the detection results of a plurality of (e.g. 8) alignment marks on wafer W that have been detected by the alignment systems by then. In such cases, for example, in the case detection of an image of a predetermined measurement mark (or pattern) by projection optical system PL is performed after the adjustment of the optical properties of projection optical system PL, even if the image of the measurement mark shifts due to the adjustment, the image of the measurement mark after the shift is measured, and as a consequence, the shift of the image of the measurement mark due to the adjustment of the optical properties of projection optical system PL does not become a measurement error factor. Further, since the adjustment described above is started based on the detection results of the alignment marks that have been detected by then before detection of all the alignment marks to be detected is finished, the adjustment can be performed in parallel with the detection operation of the remaining alignment marks. That is, in the embodiment, a period of time required for the adjustment can be overlapped with a period of time from when detection of the alignment marks in the third alignment shot areas AS is started until when detection of the alignment marks in the fourth alignment shot areas AS is finished. Thus, the throughput can be improved, compared with the conventional art in which the adjustment is started after detection of all the marks is finished.

Further, according to the embodiment, during a period from when an operation (e.g. the Pri-BCHK former processing) of measuring the positional relation between a projection position of an image of a pattern (e.g. a pattern of reticle R) by projection optical system PL and a detection center of alignment system AL1 (baseline of alignment system AL1) is started until when the operation is completed (e.g. the Pri-BCHK latter processing is finished), a detection operation of the alignment marks (e.g. the alignment marks in the three first alignment shot areas and the five second alignment shot areas) on wafer W by alignment systems AL1 and $AL2_1$ to $AL2_4$ is performed. That is, at least part of the detection operation of the marks by the alignment systems can be performed in parallel with the measurement operation of the positional relation. Accordingly, at the point in time when the measurement operation of the positional relation is completed, at least part of the detection operation by the alignment systems of a plurality of alignment marks to be detected on wafer W can be finished. Thus, the throughput can be improved, compared with the case where the detection operation of a plurality of alignment marks by alignment systems is performed before or after the measurement operation of the positional relation.

Further, according to the embodiment, during a period from when starting a detection operation by alignment systems AL1 and $AL2_1$ to $AL2_4$ of a plurality of alignment marks to be detected on wafer W (e.g. the wafer alignment operation described above, i.e. a detection operation of 16 alignment marks in total severally arranged in the first alignment shot areas AS to the fourth alignment shot areas AS) until before completing the operation, main controller 20 performs a measurement operation of the positional relation between a projection position of an image of a pattern of reticle R by projection optical system PL and a detection center of alignment system AL1 (baseline of alignment system AL1). That is, the measurement operation of the positional relation can be performed in parallel with part of the detection operation of the marks by the alignment systems. Accordingly, during a period when the detection operation by alignment systems AL1 and $AL2_1$ to $AL2_4$ of a plurality of alignment marks to be detected on wafer W is performed, the measurement operation of the positional relation can be finished. Thus, the throughput can be improved, compared with the case where the measurement operation of the positional relation is performed before or after the detection operation by alignment systems of a plurality of alignment marks to be detected on wafer W.

Further, according to the embodiment, during a period from when a detection operation of a plurality of marks to be detected on wafer W (e.g. the wafer alignment operation described above, i.e. a detection operation of 16 alignment marks) is started until before the detection operation is completed, main controller 20 performs a state switching operation between a contact state of wafer table WTB and measurement table MTB (or a proximity state of making both tables come closer together, for example, at 300 μm or less) and a separation state of separating both tables. In other words, according to the embodiment, both tables (or both stages) are controlled so that the detection operation by the alignment systems of a plurality of marks to be detected on wafer W is started in the contact state (or proximity state), and the switching from the contact state (or proximity state) to the separation state is performed before the detection operation of all the plurality of marks is completed. Accordingly, during a period when the detection operation of a plurality of marks to be detected on wafer W is performed, the state switching operation can be finished. Thus, the throughput can be improved, compared with the case where the state switching operation is performed before or after the detection operation of a plurality of marks to be detected on wafer W.

Further, according to the embodiment, main controller 20 starts the measurement operation of the baseline of alignment system AL1 in the separation state, and ends the measurement operation in the contact state (or proximity state).

Further, according to the embodiment, main controller 20 controls stage drive system 124 (Z-leveling mechanism (not shown)) and alignment system AL1 and $AL2_1$ to $AL2_4$ so that while changing a relative positional relation in the Z-axis direction (a focus direction) between the plurality of alignment systems and wafer W by the Z-leveling mechanism, the alignment marks whose positions are different from one another on wafer W are simultaneously detected by a plurality of corresponding alignment systems. In other words, while changing the relative positional relation in the focus direction between the plurality of alignment systems and wafer W simultaneously among the plurality of alignment systems, the marks whose positions are different from one another on wafer W are simultaneously detected by a plurality of corresponding alignment systems. Thus, each alignment system can perform the mark detection, for example, in the most favorable focused state, and by preferentially using the detection result or the like, the marks whose positions are different from one another on wafer W can be detected with good accuracy without being affected by unevenness of the wafer W surface and the best focus differences among the plurality of alignments systems. Incidentally, in the embodiment, alignment systems AL1 and $AL2_1$ to $AL2_4$ are to be placed substantially along the X-axis direction. However, the method in which while changing the relative positional relation in the focus direction between a plurality of alignment systems and wafer W simultaneously among the plurality of alignment systems, the marks whose positions are different from one another on wafer W are simultaneously measured by a plurality of corresponding alignment systems is also effective in other placements of alignment systems different from the placement described above. The point is that marks formed at positions different from one another on wafer W only have to be detected almost simultaneously with a plurality of alignment systems.

Further, according to the embodiment, the encoder system, which includes encoders 70A to 70D whose measurement values have good short-term stability, and the like, measures position information of wafer table WTB within the XY plane with high precision without being affected by air fluctuations or the like, and also the surface position measuring system, which includes Z sensors 72a to 72d, $74_{1,1}$ to $74_{2,6}$, $76_{1,1}$ to $76_{2,6}$, and the like, measures position information of wafer table WTB in the Z-axis direction orthogonal to the XY plane with high precision without being affected by air fluctuations or the like. In this case, since both of the encoder system and the surface position measuring system directly measure the upper surface of wafer table WTB, simple and direct position control of wafer table WTB, and therefore, of wafer W can be performed.

Further, according to the embodiment, on the focus mapping described previously, main controller 20 simultaneously activates the surface position measuring system and the multipoint AF system (90a, 90b), and converts the detection results of the multipoint AF system (90a, 90b) into data, using the measurement results of the surface position measuring system as datums. Accordingly, by obtaining the converted data in advance, it becomes possible to perform surface position control of wafer W by only measuring position information of wafer table WTB in the Z-axis direction and position information in a tilt direction with respect to the XY plane by the surface position measuring system afterward, without obtaining surface position information of wafer W. Accordingly, in the embodiment, although the working distance between tip lens 191 and the wafer W surface is short, focus-leveling control of wafer W on exposure can be executed with good accuracy, without problems.

In the embodiment, as is obvious from the description of the parallel processing operation using wafer stage WST and measurement stage MST described above, in the process in which wafer W moves from the position (loading position LP) where wafer W is carried to wafer stage WST to the position where predetermined processing to wafer W, for example, exposure (pattern formation) is performed, main controller 20 performs the simultaneous operation of the surface position measuring system and the multipoint AF system (90a, 90b) and the data converting processing (focus mapping) described above.

Further, in the embodiment, in the process from when a detection operation by alignment systems AL1 and AL2$_1$ to AL2$_4$ of a plurality of marks to be detected (e.g. the wafer alignment operation described above) is started until when the detection operation of a plurality of marks is completed, main controller 20 starts the simultaneous operation of the surface position measuring system and the multipoint AF system (90a, 90b) and also starts the data converting processing.

Further, according to the embodiment, as is described above, since the surface position of wafer table WTB, and thus, the surface position of wafer W can be controlled with high precision, it becomes possible to perform highly accurate exposure hardly having exposure defect caused by surface position control error, which makes it possible to form an image of a pattern on wafer W without image blur.

Further, according to the embodiment, for example, prior to exposure, main controller 20 measures surface position information of wafer W using the detection values (measurement values) of the multipoint AF system (90a, 90b), and taking surface position information at end portions of wafer table WTB on one side and the other side in the X-axis direction as a datum. Also on exposure, main controller 20 performs position adjustment of wafer W in a direction parallel to optical axis AX of projection optical system PL and a tilt direction with respect to the plane orthogonal to optical axis AX, taking surface position information at end portions of wafer table WTB on one side and the other side in the X-axis direction as a datum. Accordingly, although surface position information of wafer W is measured prior to exposure, surface position control of wafer W can be performed with high precision on actual exposure.

Incidentally, in the embodiment above, the case has been exemplified where a pair of Y scales 39Y$_1$ and 39Y$_2$ used for Y-axis direction position measurement and a pair of X scales 39X$_1$ and 39X$_2$ used for X-axis direction position measurement are arranged on wafer table WTB, and corresponding to these scales, a pair of head units 62A and 62C are placed on one side and the other side in the X-axis direction with projection optical system PL in between, and two head units 62B and 62D are placed on one side and the other side in the Y-axis direction with projection optical system PL in between. However, the present invention is not limited to this, and only one scale of at least either pair of Y scales 39Y$_1$ and 39Y$_2$ for Y-axis direction position measurement or X scales 39X$_1$ and 39X$_2$ for X-axis direction position measurement may be arranged alone, not in pairs on wafer table WTB, or only one head unit of at least either of a pair of head units 62A and 62C or two head units 62B and 62D may be arranged. Further, the direction in which the scales are arranged and the direction in which head units are arranged are not limited to orthogonal directions such as the X-axis direction and the Y-axis direction as in the embodiment above, but only have to be directions that intersect each other.

Incidentally, in the description above, the case has been described where while wafer replacement is being performed on wafer stage WST, the Sec-BCHK (interval) is performed using CD bar 46 of measurement stage MST. However, the present invention is not limited to this, and at least one of irregular illuminance measurement (and illuminance measurement), aerial image measurement, wavefront aberration measurement and the like is performed using the measurement members of measurement stage MST, and the measurement result may also be reflected in exposure of a wafer that is performed after that. Specifically, for example, adjustment of projection optical system PL can be performed by adjusting unit 68 based on the measurement result.

Incidentally, in the embodiment above, the case has been described where wafer table WTB is moved at a low speed (extremely low speed) at a level in which short-term fluctuation of the measurement values of the interferometers can be ignored when performing the calibration to obtain the correction information on grating pitch of scales. However, the present invention is not limited to this, and wafer table WTB can also be moved at a speed which is not an extremely low speed. In this case, for example, in the case correction information on grating pitch of Y scales 39Y$_1$ and 39Y$_2$, or the like is obtained, correction information (e.g. correction map) of grating pitch of the Y scales may also be independently obtained, by setting the wafer table at the positions that are different in the X-axis direction, and while moving the wafer table in the Y-axis direction as in the embodiment above at each of the X-positions, simultaneously loading the measurement values of encoders 70A and 70C, the measurement value of Y-axis interferometer 16 and the measurement values of head units 62A and 62C during the movement, setting up the simultaneous equations using the sampling values that have been obtained in the twice-operations of simultaneous loading, and solving the simultaneous equations.

Further, in the embodiment above, as is shown in FIG. 10A, an encoder by a diffraction interference method in which the light from the light source is branched by the optical element such as the beam splitter and two reflection mirrors to reflect the light after the branch are equipped is to be used as encoders 70A to 70F. However, the types of encoders are not limited to this, and an encoder by a diffraction interference method using three gratings, or an encoder equipped with light reflection block that is disclosed in, for example, Kokai (Japanese Unexamined Patent Application Publication) No. 2005-114406 and the like may also be used. Further, in the embodiment above, head units 62A to 62D are to have a plurality of heads placed at a predetermined distance. However, the present invention is not limited this, and a single head may also be employed, which is equipped with a light source that emits a light beam to an area elongated in the pitch direction of the Y scale or X scale, and multiple light-receiving elements that are densely arrayed in the pitch direction of the Y scale or the X scale and receive a reflected light (diffracted light) of the light beam from the Y scale or X scale (diffraction grating).

Further, in the embodiment above, damage of the diffraction gratings may also be prevented by covering the reflective diffraction gratings with a protection member (such as a thin film, or a glass plate) that can transmit the detection lights from head units 62A to 62D. Further, in the embodiment above, the reflective diffraction gratings are to be arranged on the upper surface of wafer stage WST substantially parallel to the XY plane, but the reflective diffraction gratings may also be arranged on the lower surface of wafer stage WST, for example. In this case, head units 62A to 62D are, for example, placed on the base plate to which the lower surface of wafer stage WST faces. Moreover, in the embodiment above, wafer stage WST is to be moved within the horizontal plane, but may also be moved within a plane that intersect the horizontal plane (such as a ZX plane). Further, in the case reticle stage RST is two-dimensionally moved, an encoder system having the configuration similar to the above-described encoder system may also be arranged to measure position information of reticle stage RST.

Incidentally, in the embodiment above, interferometer system 118 is to be capable of measuring position information of wafer stage WST in directions of five degrees of freedom (the X-axis, Y-axis, θx, θy and θz directions), but may be capable of measuring also position information in the Z-axis direction. In this case, at least at the time of exposure operation, position control of wafer stage WST may also be performed using the measurement values of the encoder system described above and the measurement values of interferometer system 118 (including at least position information in the Z-axis direction). Interferometer system 118 measures position information in the Z-axis direction of wafer stage WST, by arranging a reflection surface, which is inclined at a predetermined angle (e.g. 45 degrees) with respect to the XY plane, on the side surface of wafer stage WST, and irradiating a measurement beam via the reflection surface to a reflection surface arranged on, for example, on the barrel platform or the measurement frame described above, as is disclosed in, for example, Kokai (Japanese Unexamined Patent Application Publication) No. 2000-323404 (the corresponding U.S. Pat. No. 7,116,401), Kohyo (published Japanese translation of International Publication for Patent Application) No. 2001-513267 (the corresponding U.S. Pat. No. 6,208,407), and the like. Interferometer system 118 can also measure position information in the θx direction and/or the θy direction, in addition to the Z-axis direction, using a plurality of measurement beams. In this case, the measurement beams used to measure position information in the θx direction and/or the θy direction that are irradiated to the movable mirror of wafer stage WST do not have to be used.

Incidentally, in the embodiment above, a plurality of Z sensors $74_{i,j}$ and $76_{p,q}$ are to be arranged at head units 62C and 62A. However, the present invention is not limited to this, and a surface position sensor similar to the Z sensor may also be arranged on, for example, the measurement frame. Further, a distance between the encoder head or the Z sensor and the upper surface of the wafer stage is preferably equal to or less than a distance between tip optical element 191 of projection optical system PL and the upper surface of the wafer stage, for example, shorter than the distance. Thus, the measurement accuracy can be improved. In this case, a simple Z sensor is effective, precisely because it is difficult to arrange the AF sensor.

Incidentally, in the embodiment above, the lower surface of nozzle unit 32 and the lower end surface of the tip optical element of projection optical system PL are to be substantially flush. However, the present invention is not limited to this, and for example, the lower surface of nozzle unit 32 may also be placed closer to the image plane of projection optical system (i.e. to the wafer) than the outgoing surface of the tip optical element. That is, the configuration of local liquid immersion unit 8 is not limited to the above-described configuration, and the configurations can be used, which are described in, for example, EP Patent Application Publication No. 1 420 298, the pamphlet of International Publication No. 2004/055803, the pamphlet of International Publication No. 2004/057590, the pamphlet of International Publication No. 2005/029559 (the corresponding U.S. Patent Application Publication No. 2006/0231206), the pamphlet of International Publication No. 2004/086468 (the corresponding U.S. Patent Application Publication No. 2005/0280791), Kokai (Japanese Unexamined Patent Application Publication) No. 2004-289126 (the corresponding U.S. Pat. No. 6,952,253), and the like. Further, as disclosed in the pamphlet of International Publication No. 2004/019128 (the corresponding U.S. Patent Application Publication No. 2005/0248856), the optical path on the object plane side of the tip optical element may also be filled with liquid, in addition to the optical path on the image plane side of the tip optical element. Furthermore, a thin film that is lyophilic and/or has dissolution preventing function may also be formed on the partial surface (including at least a contact surface with liquid) or the entire surface of the tip optical element. Incidentally, quartz has a high affinity for liquid, and also needs no dissolution preventing film, while in the case of fluorite, at least a dissolution preventing film is preferably formed.

Incidentally, in the embodiment above, pure water (water) is to be used as liquid, however, the present invention is not limited to this as matter of course. As the liquid, liquid that is chemically stable, having high transmittance to illumination light IL and safe to use, such as a fluorine-containing inert liquid may be used. As the fluorine-containing inert liquid, for example, Fluorinert (the brand name of 3M United States) can be used. The fluorine-containing inert liquid is also excellent from the point of cooling effect. Further, as the liquid, liquid which has a refractive index higher than pure water (a refractive index is around 1.44), for example, liquid having a refractive index equal to or higher than 1.5 may be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane, or decalin (decahydronaphthalene) having a refractive index of about 1.60, or the like can be cited. Alternatively, a liquid obtained by mixing arbitrary two or more of these liquids may be used, or a liquid obtained by adding (mixing) at least one of these liquids to (with) pure water may be used. Alternatively, as the liquid, a liquid obtained by adding (mixing) base or acid such as $H^+$, $Cs^+$, $K^+$, $Cl^-$, $SO_4^{2-}$, or $PO_4^{2-}$ to (with) pure water may be used. Moreover, a liquid obtained by adding (mixing) particles of Al oxide or the like to (with) pure water may be used. These liquids can transmit ArF excimer laser light. Further, as the liquid, liquid, which has a small absorption coefficient of light, is less temperature-dependent, and is stable to a projection optical system (tip optical member) and/or a photosensitive agent (or a protection film (top coat film), an antireflection film, or the like) coated on the surface of a wafer, is preferable. Further, in the case an $F_2$ laser is used as the light source, fomblin oil may be selected. Further, as the liquid, a liquid having a higher refractive index to illumination light IL than that of pure water, for example, a refractive index of around 1.6 to 1.8 may be used. As the liquid, supercritical fluid can also be used. Further, the tip optical element of projection optical system PL may be formed by quartz (silica), or single-crystal materials of fluoride compound such as calcium fluoride (fluorite), barium fluoride, strontium fluoride, lithium fluoride, and sodium fluoride, or may be formed by materials having a higher refractive index than that of quartz or fluorite (e.g. equal to or higher than 1.6). As the materials having a refractive index equal to or higher than 1.6, for example, sapphire, germanium dioxide, or the like disclosed in the pamphlet of International Publication No. 2005/059617, or kalium chloride (having a refractive index of about 1.75) or the like disclosed in the pamphlet of International Publication No. 2005/059618 can be used.

Further, in the embodiment above, the recovered liquid may be reused, and in this case, a filter that removes impurities from the recovered liquid is preferably arranged in a liquid recovery unit, a recovery pipe or the like.

Further, in the embodiment above, the case has been described where the exposure apparatus is a liquid immersion type exposure apparatus. However, the present invention is not limited to this, but can also be employed in a dry type exposure apparatus that performs exposure of wafer W without liquid (water).

Incidentally, in the embodiment above, the case has been described where the present invention is applied to the exposure apparatus that is equipped with all of wafer stage WST (movable body), measurement sage MST (another movable body), the alignment systems (AL1, $AL2_1$ to $AL2_4$), the multipoint AF system (90a, 90b), the Z sensors, interferometer system 118, the encoder system (70A to 70F) and the like, but the present invention is not limited to this. For example, the present invention can also be applied to an exposure apparatus in which measurement stage MST or the like is not arranged. The present invention can be applied as far as an exposure apparatus is equipped with the wafer stage (movable body) and other partial constituents out of the above-described constituents. As an example, the invention focusing on the mark detection system, for example, can be applied as far as an exposure apparatus is equipped with at least wafer stage WST and the alignment systems. Further, it is a matter of course that both of the interferometer system and the encoder system do not always have to be arranged.

Further, in the embodiment above, the case has been described where aerial image measuring unit 45 is dividedly placed at different stages, specifically, at wafer stage WST and measurement stage MST. However, the sensor that is dividedly placed is not limited to the aerial image measuring unit, but may be a wavefront aberration measuring instrument or the like, for example. Further, the different stages do not limited to the combination of the substrate stage and measurement stage.

Further, in the embodiment above, the case has been described where the present invention is applied to a scanning exposure apparatus by a step-and-scan method or the like. However, the present invention is not limited to this, but may also be applied to a static exposure apparatus such as a stepper. Even with the stepper or the like, by measuring the position of a stage on which an object subject to exposure is mounted by encoders, generation of position measurement error caused by air fluctuations can substantially be nulled likewise. In this case, it becomes possible to set the position of the stage with high precision based on correction information used to correct short-term fluctuation of the measurement values of the encoders using the measurement values of the interferometers and based on the measurement values of the encoders, and as a consequence, highly accurate transfer of a reticle pattern onto the object can be performed. Further, the present invention can also be applied to a reduction projection exposure apparatus by a step-and-stitch method that synthesizes a shot area and a shot area, an exposure apparatus by a proximity method, a mirror projection aligner, or the like. Moreover, the present invention can also be applied to a multi-stage type exposure apparatus equipped with plural wafer stages, as is disclosed in, for example, Kokai (Japanese Unexamined Patent Application Publications) No. 10-163099 and No. 10-214783 (the corresponding U.S. Pat. No. 6,590,634), Kohyo (published Japanese translation of International Publication for Patent Application) No. 2000-505958 (the corresponding U.S. Pat. No. 5,969,441), the U.S. Pat. No. 6,208,407, and the like.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image. Moreover, exposure area IA to which illumination light IL is irradiated via projection optical system PL is an on-axis area that includes optical axis AX within the field of projection optical system PL. However, for example, as is disclosed in the pamphlet of International Publication No. 2004/107011, exposure area IA may also be an off-axis area that does not include optical axis AX, similar to a so-called inline type catadioptric system, in part of which an optical system (catoptric system or catadioptric system) that has plural reflection surfaces and forms an intermediate image at least once is arranged, and which has a single optical axis. Further, the illumination area and exposure area described above are to have a rectangular shape. However, the shape is not limited to rectangular, but may also be circular arc, trapezoidal, parallelogram or the like.

Incidentally, a light source of the exposure apparatus in the embodiment above is not limited to the ArF excimer laser, but a pulse laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm) or an i-line (wavelength: 365 nm) can also be used. Further, a harmonic wave generating unit of a YAG laser or the like can also be used. Besides, as is disclosed in, for example, the pamphlet of International Publication No. 1999/46835 (the corresponding U.S. Pat. No. 7,023,610), a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, may also be used.

Further, in the embodiment above, illumination light IL of the exposure apparatus is not limited to the light having a wavelength equal to or more than 100 nm, and it is needless to say that the light having a wavelength less than 100 nm may be used. For example, in recent years, in order to expose a pattern equal to or less than 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. Besides, the present invention can also be applied to an exposure apparatus that uses charged particle beams such as an electron beam or an ion beam.

Further, in the embodiment above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed may also be used.

Further, as is disclosed in, for example, the pamphlet of International Publication No. 2001/035168, the present invention can also be applied to an exposure apparatus (lithography system) that forms line-and-space patterns on a wafer by forming interference fringes on the wafer.

Moreover, the present invention can also be applied to an exposure apparatus that synthesizes two reticle patterns via a projection optical system and almost simultaneously performs double exposure of one shot area by one scanning exposure, as is disclosed in, for example, Kohyo (published Japanese translation of International Publication for Patent Application) No. 2004-519850 (the corresponding U.S. Pat. No. 6,611,316).

Further, an apparatus that forms a pattern on an object is not limited to the exposure apparatus (lithography system) described above, and for example, the present invention can also be applied to an apparatus that forms a pattern on an object by an ink-jet method.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The usage of the exposure apparatus is not limited to the exposure apparatus used for manufacturing semiconductor devices. The present invention can be widely applied also to, for example, an exposure apparatus for manufacturing liquid crystal display devices which transfers a liquid crystal display device pattern onto a square-shaped glass plate, and to an exposure apparatus for manufacturing organic EL, thin-film magnetic heads, imaging devices (such as CCDs), micromachines, DNA chips or the like. Further, the present invention can also be applied to an exposure apparatus that transfers a circuit pattern onto a glass substrate or a silicon wafer not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

Incidentally, the movable body drive system and the movable body drive method of the present invention can be applied not only to the exposure apparatus, but can also be applied widely to other substrate processing apparatuses (such as a laser repair apparatus, a substrate inspection apparatus and the like), or to apparatuses equipped with a movable body such as a stage that moves within a two-dimensional plane such as a position setting apparatus for specimen or a wire bonding apparatus in other precision machines.

Further, the exposure apparatus (the pattern forming apparatus) of the embodiment above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the above disclosures of the various publications, the pamphlets of the International Publications, and the U.S. Patent Application Publication descriptions and the U.S. Patent descriptions that are cited in the embodiment above and related to exposure apparatuses and the like are each incorporated herein by reference.

Next, an embodiment of a device manufacturing method in which the foregoing exposure apparatus (pattern forming apparatus) is used in a lithography process will be described.

Figure 37:
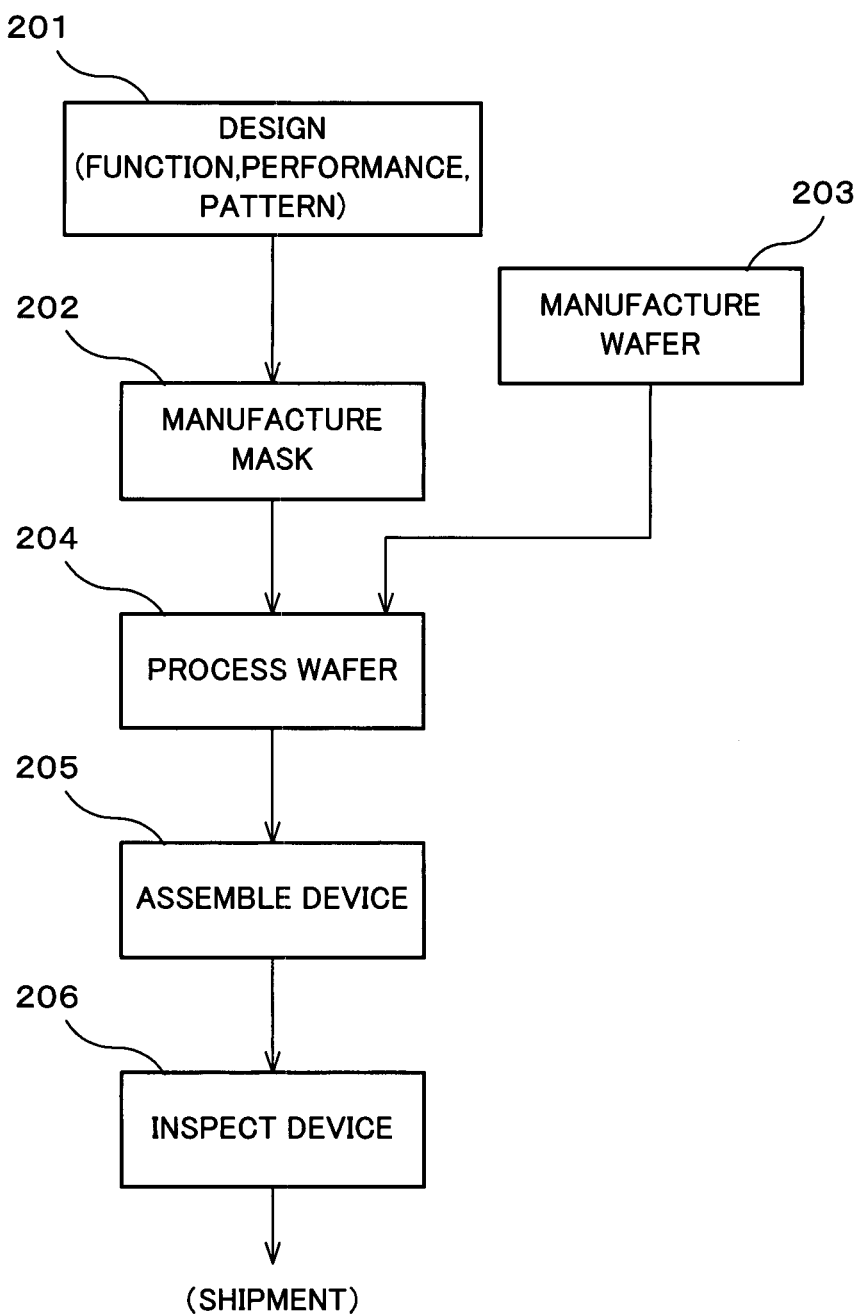
FIG. 37 is a flowchart used to explain an embodiment of a device manufacturing method.

FIG. 37 shows a flowchart of an example when manufacturing a device (a semiconductor chip such as an IC or an LSI, a liquid crystal panel, a CCD, a thin film magnetic head, a micromachine, and the like). As is shown in FIG. 37, first of all, in step 201 (design step), function and performance design of device (such as circuit design of semiconductor device) is performed, and pattern design to realize the function is performed. Then, in step 202 (mask manufacturing step), a mask on which the designed circuit pattern is formed is manufactured. Meanwhile, in step 203 (wafer manufacturing step), a wafer is manufactured using materials such as silicon.

Next, in step 204 (wafer processing step), the actual circuit and the like are formed on the wafer by lithography or the like in a manner that will be described later, using the mask and the wafer prepared in steps 201 to 203. Then, in step 205 (device assembly step), device assembly is performed using the wafer processed in step 204. Step 205 includes processes such as the dicing process, the bonding process, and the packaging process (chip encapsulation), and the like when necessary.

Finally, in step 206 (inspection step), tests on operation, durability, and the like are performed on the devices made in step 205. After these steps, the devices are completed and shipped out.

Figure 38:
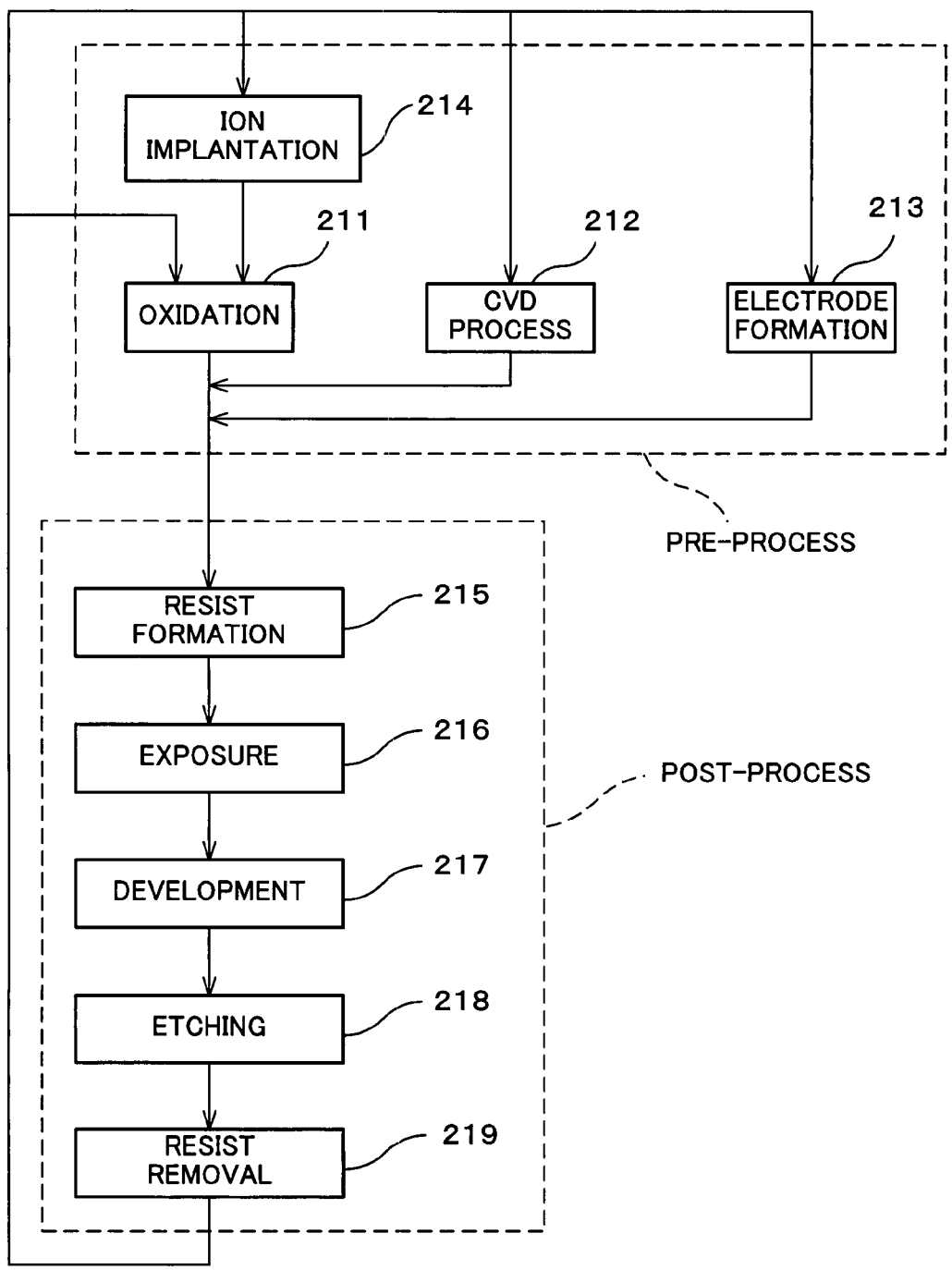
FIG. 38 is a flowchart used to explain a specific example of step 204 in FIG. 37.

FIG. 38 is a flowchart showing a detailed example of step 204 described above. Referring to FIG. 38, in step 211 (oxidation step), the surface of wafer is oxidized. In step 212 (CDV step), an insulating film is formed on the wafer surface. In step 213 (electrode formation step), an electrode is formed on the wafer by deposition. In step 214 (ion implantation step), ions are implanted into the wafer. Each of the above steps 211 to 214 constitutes the pre-process in each stage of wafer processing, and the necessary processing is chosen and is executed at each stage.

When the above-described pre-process ends in each stage of wafer process, post-process is executed as follows. In the post-process, first in step 215 (resist formation step), a photosensitive agent is coated on the wafer. Then, in step 216 (exposure step), the circuit pattern of the mask is transferred onto the wafer by the exposure apparatus (pattern forming apparatus) described above and the exposure method (pattern forming method) thereof. Next, in step 217 (development step), the wafer that has been exposed is developed, and in step 218 (etching step), an exposed member of an area other than the area where resist remains is removed by etching. Then, in step 219 (resist removing step), when etching is completed, the resist that is no longer necessary is removed.

By repeatedly performing the pre-process and the post-process, multiple circuit patterns are formed on the wafer.

By using the device manufacturing method of the embodiment described above, because the exposure apparatus (pattern forming apparatus) in the embodiment above and the exposure method (pattern forming method) thereof are used in the exposure step (step 216), exposure with high throughput can be performed while maintaining the high overlay accuracy. Accordingly, the productivity of highly integrated microdevices on which fine patterns are formed can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A pattern forming apparatus that forms a pattern on an object with an energy beam via an optical system, the apparatus comprising:
   a first movable body that moves within a predetermined plane that includes a first axis and a second axis intersecting the first axis, holding the object;
   a second movable body that moves independently from the first movable body within the predetermined plane; and
   an aerial image measuring unit a first partial section of which is arranged at the first movable body and a second partial section of which is arranged at the second movable body, and which measures an aerial image of a mark formed via the optical system, wherein
   the first movable body has a holder that holds the object and the second movable body has a measurement member used for detection of the energy beam.

2. The pattern forming apparatus of claim 1, wherein the aerial image measuring unit performs the measurement in at least one of a first state where the first movable body and the second movable body are closer together and a second state where the first movable body and the second movable body are in contact with each other.

3. The pattern forming apparatus of claim 1, wherein the aerial image measuring unit has a measurement pattern and an optical member that are arranged at the first movable body and a photodetection system that is arranged at the second movable body, and measures the aerial image with the photodetection system via the measurement pattern and the optical system.

4. The pattern forming apparatus of claim 3, wherein at the first movable body, the measurement pattern and the optical system are each arranged in pairs,
   at the second movable body, a pair of photodetection systems that correspond to a pair of the measurement patterns and a pair of the optical systems are arranged, and
   the pair of the measurement patterns are placed at positions different in a direction parallel to the first axis.

5. The pattern forming apparatus of claim 4, wherein at the first movable body, a fiducial mark is arranged in a predetermined positional relation with a pair of the measurement patterns.

6. The pattern forming apparatus of claim 1, further comprising:
   a position measuring system that measures position information of the first movable body within the plane.

7. The pattern forming apparatus of claim 6, wherein the position measuring system includes an encoder system that has a plurality of heads whose positions are different in the direction parallel to the first axis and measures the position information of the first movable body by a head that faces a grating member arranged extending in a direction parallel to the second axis on the first movable body.

8. The pattern forming apparatus of claim 7, wherein the grating member is placed in pairs with the holder in between in the direction parallel to the first axis on the first movable body.

9. The pattern forming apparatus of claim 8, wherein the plurality of heads are placed in pairs with the optical system in between.

10. The pattern forming apparatus of claim 7, further comprising:
    a controller that performs transfer of measurement information between the plurality of heads by movement of the first movable body in the direction parallel to the first axis.

11. The pattern forming apparatus of claim 7, wherein the encoder system has a head that is different in position from the plurality of heads in the direction parallel to the second axis.

12. The pattern forming apparatus of claim 7, wherein the aerial image measurement unit measures the aerial image in a state where the first movable body and the second movable body are close together or in contact with each other in the direction parallel to the second axis.

13. The pattern forming apparatus of claim 7, wherein the second movable body comprises a reference member on which a pair of reference gratings that are irradiated with a detection light from different heads out of the plurality heads are formed, and
    the reference member is kinematically supported on the second movable body.

14. The pattern forming apparatus of claim 1, wherein the measurement member includes plural types of sensors placed apart in a direction in which the first movable body and the second movable body come close together or separate from each other on measurement of the aerial image.

15. An exposure apparatus that exposes an object with an energy beam via an optical system, the apparatus comprising:
    a first movable body and a second movable body that are independently movable within a predetermined plane; and
    a detecting unit that has a first member and a second member respectively arranged at the first movable body and the second movable body, and detects the energy beam via the first member and the second member, wherein
    the first movable body has a holder that holds the object and the second movable body has a measurement member on which the energy beam is irradiated.

16. The exposure apparatus of claim 15, wherein at a time of the detection, the first movable body is placed facing the optical system, and the energy beam from the optical system is led to the second member of the second movable body via the first member of the first movable body.

17. The exposure apparatus of claim 15, wherein
the measurement member is separate from the second member and is used for an operation different from the exposure.
18. The exposure apparatus of claim 15, wherein
at least part of the measurement member is arranged at a surface of the second movable body that is substantially parallel to the plane.
19. The exposure apparatus of claim 15, wherein
part of the first member is arranged at a surface of the first movable body that is substantially parallel to the plane.
20. The exposure apparatus of claim 15, wherein
the detecting unit measures a pattern image that is formed via the optical system.
21. The exposure apparatus of claim 20, wherein
the first member includes an aperture pattern that is placed facing the optical system, and the detecting unit measures the pattern image via the aperture pattern.
22. The exposure apparatus of claim 15, further comprising:
a measuring system that includes a first measuring unit that measures position information of the first movable body and a second measuring unit that measures position information of the second movable body, wherein
a measurement value of the first measuring unit has short-term stability superior to that of the second measuring unit.
23. The exposure apparatus of claim 15, wherein
the first movable body moves in a first direction and a second direction holding the object within the plane, and has a grating section arranged extending in the second direction, the exposure apparatus further comprising:
a measuring system that measures position information of the first movable body and position information of the second movable body, wherein
the measuring system measures the position information of the first movable body by a head that faces the grating section, out of a plurality of heads whose positions are different in the first direction.
24. The exposure apparatus of claim 23, wherein
the grating section is arranged in pairs with the holder in between in the first direction, and
the plurality of heads are respectively placed on both sides of an irradiation position of the energy beam in the first direction.
25. The exposure apparatus of claim 23, wherein
prior to detection of the energy beam by the detecting unit, the first and the second movable bodies are moved so as to come close together in the second direction.
26. The exposure apparatus of claim 23, wherein
the plurality of heads are placed at a distance that is narrower than a width of the grating section in the first direction.
27. The exposure apparatus of claim 23, wherein
the position information measured by the encoder system is used in at least an exposure operation of the object.
28. The exposure apparatus of claim 23, wherein
the position information measured by the encoder system is used in at least a detection operation of marks on the object.
29. The exposure apparatus of claim 15, further comprising:
an optical member to which the object is placed facing, and which emits the energy beam; and
a liquid immersion system that forms a liquid immersion area by supplying liquid to just below the optical member, wherein the liquid immersion area is maintained in a space between the optical member and the second movable body that is placed facing the optical member by replacing the first movable body.
30. A device manufacturing method, comprising:
exposing an object using the exposure apparatus of claim 15; and
developing the exposed object.
31. A movable body drive method of driving a movable body that moves within a predetermined plane that includes a first axis and a second axis orthogonal to each other, the method comprising:
moving the movable body in a direction parallel to the first axis, based on measurement information of an interferometer system that measures position information of the movable body;
deciding correction information on grating warp of a grating member, based on measurement information obtained from both of an encoder system and the interferometer system during movement of the movable body, the encoder system measuring the position information of the movable body by a head that faces a grating member arranged extending in a direction parallel to the second axis on the movable body, out of a plurality of heads whose positions are different in a direction parallel to the first axis; and
driving the movable body based on the measurement information of the encoder system and the decided correction information.
32. A pattern forming method, comprising:
mounting an object on a movable body that can move within a moving plane; and
driving the movable body using the movable body drive method of claim 31 for formation of a pattern to the object.
33. The pattern forming method of claim 32, wherein
the formation of a pattern is performed by exposing the object by irradiating an energy beam.
34. A device manufacturing method, comprising:
forming a pattern on an object using the pattern forming method of claim 32; and
performing processing to the object on which the pattern has been formed.
35. An exposure method of exposing an object with an energy beam via an optical system, the method comprising:
detecting the energy beam via a first member and a second member by using a detecting unit that has the first and the second members respectively arranged at a first movable body and a second movable body that are independently movable within a predetermined plane, wherein
the first movable body has a holder that holds the object and the second movable body has a measurement member on which the energy beam is irradiated.
36. The exposure method of claim 35, wherein
at a time of the detection, the first movable body is placed facing the optical system, and the energy beam from the optical system is led to the second member of the second movable body via the first member of the first movable body.
37. The exposure method of claim 35, wherein
the measurement member is separate from the second member and is used for an operation different from the exposure.
38. The exposure method of claim 37, wherein
at least part of the measurement member is arranged on a surface of the second movable body that is substantially parallel to the plane.

39. The exposure method of claim 35, wherein
part of the first member is arranged on a surface of the first movable body that is substantially parallel to the plane.

40. The exposure method of claim 35, wherein
a pattern image that is formed via the optical system is measured using the detecting unit.

41. The exposure method of claim 40, wherein
the first member includes an aperture pattern that is placed facing the optical system, and the pattern image is measured via the aperture pattern.

42. A device manufacturing method, comprising:
exposing an object using the exposure method of claim 35; and
developing the exposed object.

* * * * *

UNITED STATES PATENT AND TRADEMARK OFFICE
CERTIFICATE OF CORRECTION

| | | |
|---|---|---|
| PATENT NO. | : 8,908,145 B2 | Page 1 of 1 |
| APPLICATION NO. | : 11/708611 | |
| DATED | : December 9, 2014 | |
| INVENTOR(S) | : Yuichi Shibazaki | |

It is certified that error appears in the above-identified patent and that said Letters Patent is hereby corrected as shown below:

On the Title Page

References Cited Item (56) should read as indicated below.

Add additional references:

U.S. Patent Documents

2006/0227308 A1
2005/0052832 A1

Foreign Patent Documents

JP 2006-332656 A
JP 2005-327993 A
WO 2005/117075 A1
JP 10-289943 A

Correct incorrectly identified Foreign Patent Documents as follows:

DE 221 563 A1 4/1985 should be corrected to DD 221 563 A1 4/1985
DE 224 448 A1 7/1985 should be corrected to DD 224 448 A1 7/1985

Other Publications should read

March 29, 2011 Notice of Allowance issued in U.S. Application No. 11/708,601
October 28, 2013 Office Action issued in Japanese Patent Application No. 2012-182877 (with translation)

Signed and Sealed this
Twenty-fourth Day of March, 2015

Michelle K. Lee
*Director of the United States Patent and Trademark Office*

UNITED STATES PATENT AND TRADEMARK OFFICE
CERTIFICATE OF CORRECTION

PATENT NO. : 8,908,145 B2
APPLICATION NO. : 11/708611
DATED : December 9, 2014
INVENTOR(S) : Yuichi Shibazaki Page 1 of 2

It is certified that error appears in the above-identified patent and that said Letters Patent is hereby corrected as shown below:

On the Title Page

References Cited Item (56) should read as indicated below.

Add additional references:

U.S. Patent Documents

2006/0227308 A1
2005/0052632 A1

Foreign Patent Documents

JP 2006-332656 A
JP 2005-327993 A
WO 2005/117075 A1
JP 10-289943 A

Correct incorrectly identified Foreign Patent Documents as follows:

DE 221 563 A1 4/1985 should be corrected to DD 221 563 A1 4/1985
DE 224 448 A1 7/1985 should be corrected to DD 224 448 A1 7/1985

This certificate supersedes the Certificate of Correction issued March 24, 2015.

Signed and Sealed this
Twenty-third Day of June, 2015

Michelle K. Lee
*Director of the United States Patent and Trademark Office*

CERTIFICATE OF CORRECTION (continued)
U.S. Pat. No. 8,908,145 B2

Other Publications should read

March 29, 2011 Notice of Allowance issued in U.S. Application No. 11/708,601
October 28, 2013 Office Action issued in Japanese Patent Application No. 2012-182877 (with translation)